(12) United States Patent
Yamaguchi et al.

(10) Patent No.: US 7,238,576 B2
(45) Date of Patent: Jul. 3, 2007

(54) SEMICONDUCTOR DEVICE AND METHOD OF MANUFACTURING THE SAME

(75) Inventors: Masakazu Yamaguchi, Kawasaki (JP); Ichiro Omura, Yokohama (JP); Wataru Saito, Kawasaki (JP); Takashi Shinohe, Yokosuka (JP); Hiromichi Ohashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 312 days.

(21) Appl. No.: 10/403,122

(22) Filed: Apr. 1, 2003

(65) Prior Publication Data

US 2004/0043565 A1 Mar. 4, 2004

(30) Foreign Application Priority Data

Apr. 1, 2002 (JP) .............................. 2002-099217

(51) Int. Cl.
*H01L 21/336* (2006.01)
(52) U.S. Cl. .............................. 438/268; 257/E29.187; 257/E21.609; 257/342; 438/269
(58) Field of Classification Search ................ 438/268, 438/269, 272, 342; 257/342, E21.373, E21.609, 257/E29.187
See application file for complete search history.

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 6,201,279 B1 | 3/2001 | Pfirsch | |
| 6,600,194 B2 * | 7/2003 | Hueting et al. | 257/331 |
| 6,724,042 B2 * | 4/2004 | Onishi et al. | 257/341 |
| 2002/0167020 A1 * | 11/2002 | Iwamoto et al. | 257/110 |
| 2003/0006453 A1 * | 1/2003 | Liang et al. | 257/328 |
| 2004/0043565 A1 | 3/2004 | Yamaguchi et al. | |

FOREIGN PATENT DOCUMENTS

| | | |
|---|---|---|
| JP | 2001-135819 | 5/2001 |
| JP | 2001-298190 | 10/2001 |
| JP | 2001-298191 | 10/2001 |
| JP | 2002-134748 | 5/2002 |

OTHER PUBLICATIONS

U.S. Appl. No. 11/453,997, filed Jun. 16, 2006, Saito et al.

(Continued)

*Primary Examiner*—Caridad Everhart
(74) *Attorney, Agent, or Firm*—Oblon, Spivak, McClelland, Maier & Neustadt, P.C.

(57) ABSTRACT

A semiconductor device comprises a drain layer of first conductivity type, drift layers of first and second conductivity types on the drain layer, an insulating film between the drift layers and contacting the drift layers, a first base layer of second conductivity type on a surface of the drift layer of first conductivity type, a source layer of first conductivity type selectively provided on a surface of the first base layer of second conductivity type, a gate insulating film on the first base layer of second conductivity type between the source layer and the drift layer, a gate electrode on the gate insulating film, a second base layer of second conductivity type on a surface of the drift layer, a first main electrode on the drain layer, and a second main electrode on the source layer, the first base layer and the second base layer.

23 Claims, 39 Drawing Sheets

OTHER PUBLICATIONS

U.S. Appl. No. 10/163,651, filed Jun. 7, 2002, Saitoh et al.
U.S. Appl. No. 10/327,937, filed Dec. 26, 2002, Okumura et al.
U.S. Appl. No. 10/388,498, filed Mar. 17, 2003, Yamaguchi et al.
U.S. Appl. No. 10/403,122, filed Apr. 1, 2003, Yamaguchi et al.

* cited by examiner

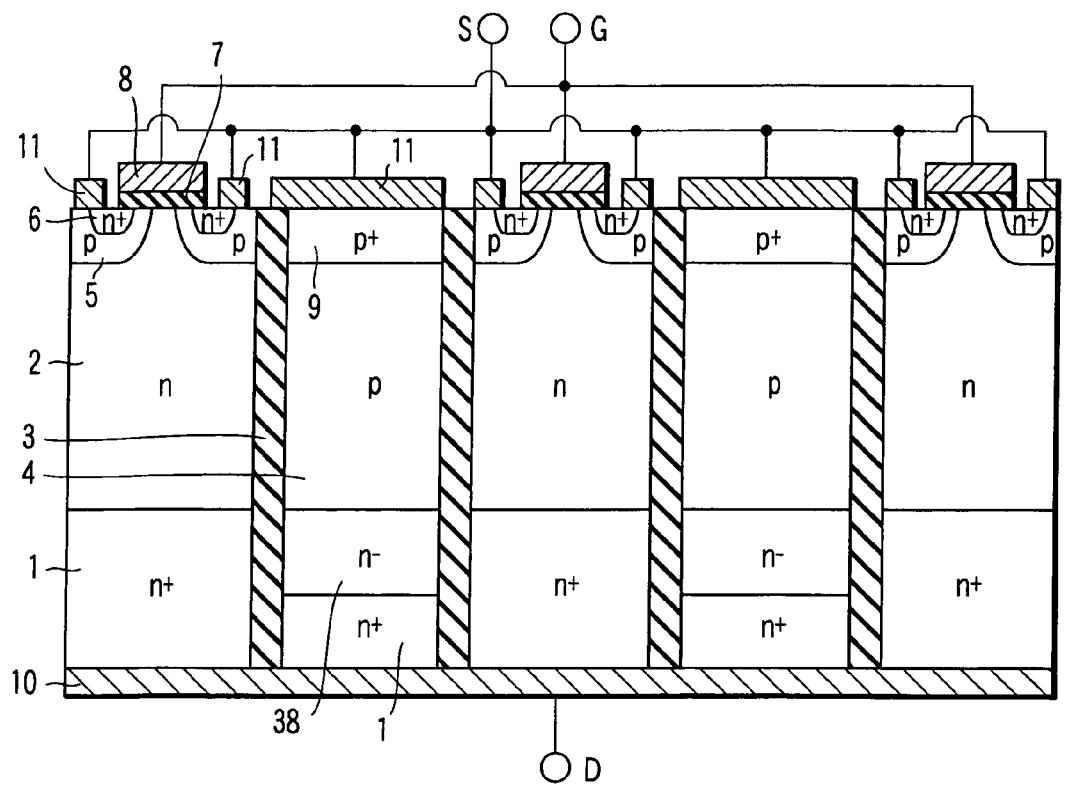
F I G. 38
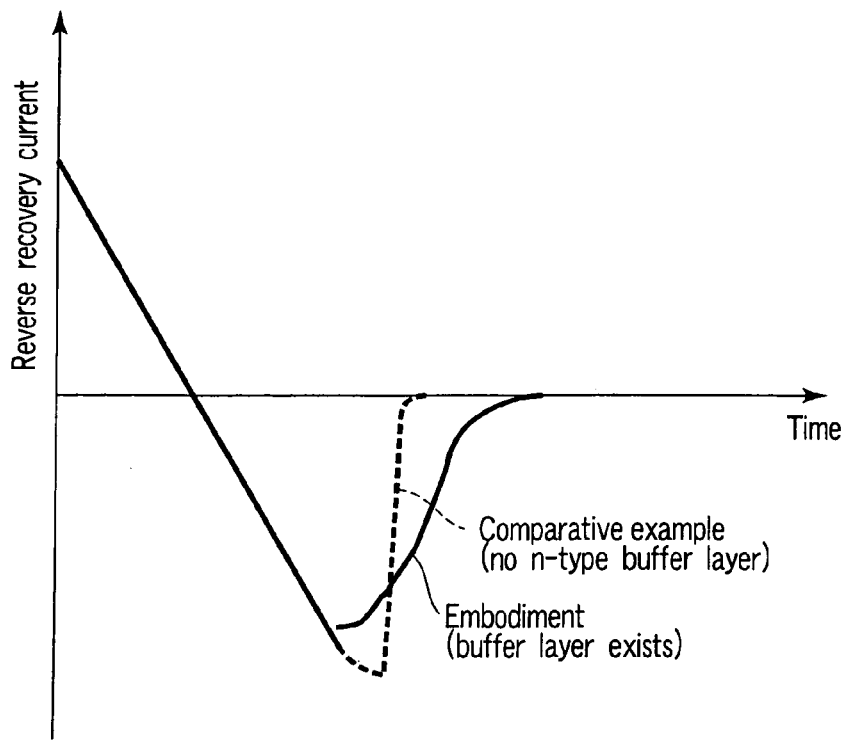
F I G. 39

DL  CR  JTR

DL  CR  JTR

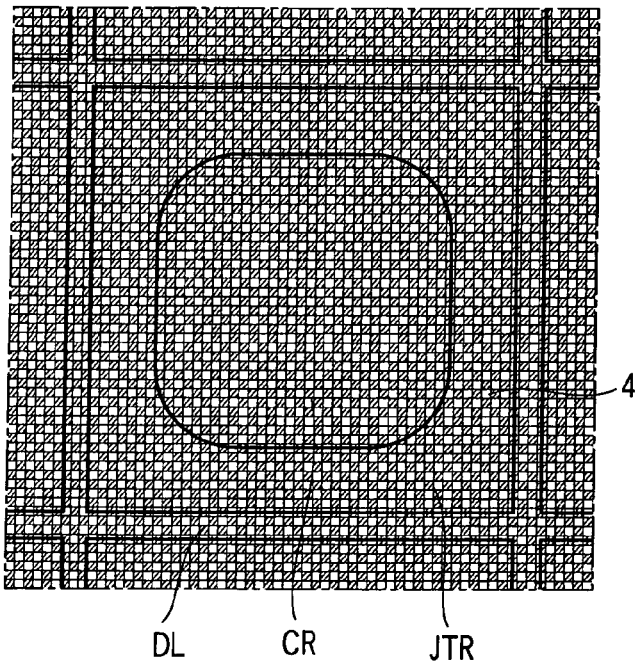
DL  CR  JTR
F I G. 51
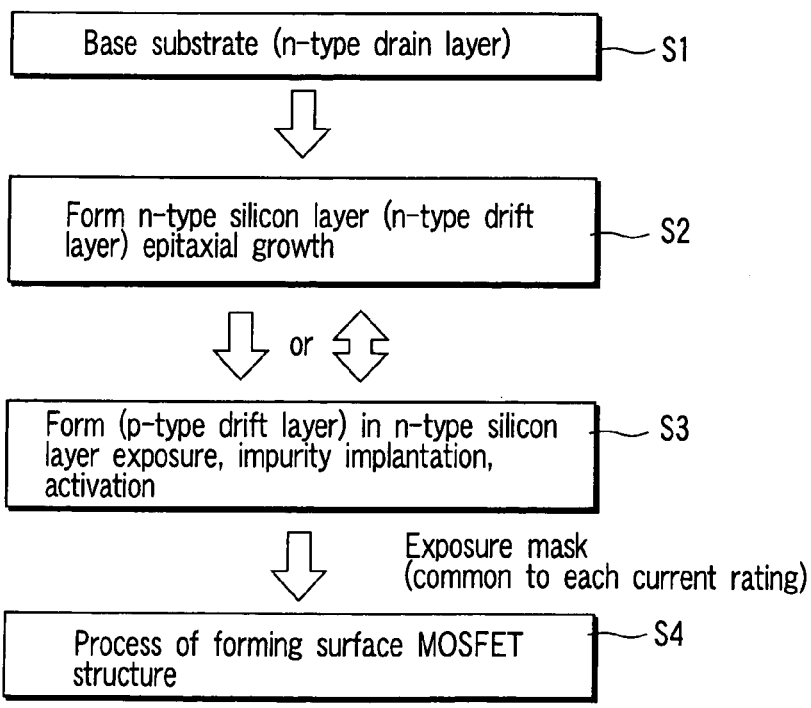
F I G. 52

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-99217, filed Apr. 1, 2002, the entire contents of which are incorporated herein by reference.

BACKGROUND OF THE INVENTION

1. Field of the Invention

The present invention relates to a semiconductor device and a method of manufacturing the same. In particular, the present invention relates to a semiconductor device including power semiconductor elements as power switching elements, and to a method of manufacturing the same.

2. Description of the Related Art

Recently, there is a great demand for small-sized and high-performance power apparatuses in the power electronics field. In order to meet the demand, power semiconductor elements require improvement of performance with respect to high breakdown voltage, large current, low power loss, high speed and high ruggedness. In the power semiconductor elements, a power MOSFET has high-speed switching performance; therefore, the power MOSFET is frequently used as the key device in the switch mode power supply field.

FIG. 62 is a cross-sectional view showing a conventional power MOSFET. In FIG. 62, a reference numeral 101 denotes a low-resistance n-type drain layer, and a high-resistance n-type base layer 102 is provided on the n-type drain layer 101. The surface of the n-type base layer 102 is selectively formed with a p-type base layer 103, and the surface of the p-type base layer 103 is selectively formed with an n-type source layer 104. A gate electrode 106 is provided on the p-type base layer 103 between n-type source and base layers 104 and 102 via a gate insulating film 105.

A drain electrode 107 is provided on the n-type drain layer 101, and a source electrode 108 is provided on the n-type source layer 104 and the p-type base layer 103.

When this kind of power MOSFET is in on state, the surface of the n-type base layer 103 under the gate electrode 106 is formed with an n-channel; therefore, electronic current flows between the source and drain. The conventional power MOSFET is a majority carrier device; therefore, it has advantages that there is no storage time of minority carriers, and switching speed is high.

However, because of no conductivity modulation, the power MOSFET is disadvantageous to on-resistance as compared with power semiconductor elements such as insulated gate bipolar transistor (IGBT). For this reason, on-resistance is easy to become high. The point relating to on-resistance will be explained in the following.

FIG. 63 shows an electric field distribution in off-state in cross section taken along an arrow line 63A–63A' of FIG. 62. In the conventional power MOSFET shown in FIG. 62, the following relationship is established between the electric field E of the n-type base layer 102, distance (width) y and impurity concentration N. That is, the relationship is $dE/dy = N/\epsilon$ ($\epsilon$ is permittivity of semiconductor material of power MOSFET). The breakdown voltage (Vb) of the element is determined by the equation $Vb = \int E \cdot dy$. Namely, the larger the area of the electric field distribution of the n-type base layer 102 is, the higher the breakdown voltage of element becomes.

In fact, the breakdown voltage of element receives the influence on the area of the electric field distributions of the n-type drain layer 101 and p-type base layer 103. However, the area of these electric field distributions is disregarded because it is very small as compared with the area of the electric field distribution of the n-type base layer 102.

In order to make large the area of electric field distribution of the element, the following means are taken. One is to make thick the n-type base layer 102, and another is to reduce the impurity concentration of the n-type base layer 102. But, these means increase the resistance of the n-type base layer 102; as a result, on-resistance is stepped up. Therefore, the more high breakdown voltage is improved, the higher on-resistance becomes.

There has been known a power MOSFET having the structure shown in FIG. 64 as the power MOSFET solving the problem described above. The power MOSFET has a drift layer in which pillar-shaped n-type and p-type drift layers 109 and 110 are alternately and repeatedly arrayed in place of the high resistance n-type base layer 103.

In this kind of power MOSFET, the impurity concentration of the n-type drift layer 109 is set higher in order to reduce on-resistance. In this case, the element is designed in the following manner, and thereby, the same breakdown voltage as the power MOSFET of FIG. 62 is obtained. That is, in the off-state, before breakdown occurs, n-type and p-type drift layers 109 and 110 are fully depleted by the depletion layer laterally extending from the junction between n-type and p-type drift layers 109 and 110.

In the power MOSFET of FIG. 64, if the total amount of n-type impurities of the n-type drift layer 109 is the same as that of p-type impurities of the p-type drift layer 110, the breakdown voltage is constant. In this case, the breakdown voltage is constant regardless of the n-type impurity concentration of the n-type drift layer 109. Therefore, the n-type impurity concentration is increased without varying the total amount of n-type impurities of the n-type drift layer 109, thereby reducing on-resistance.

In order to increase the n-type impurity concentration of the n-type drift layer 109, the width of the n-type drift layer 109 must be made narrow.

For example, the p-type drift layer 110 is formed by ion implantation of p-type impurities to an n-type substrate and heat treatment. On the other hand, the n-type drift layer 109 is formed as the remains of the n-type region where p-type impurities are not diffused. For this reason, if the width of the n-type drift layer 109 becomes narrow, the following influences are greatly given. One is the influence of diffusion. accuracy of the p-type impurities in heat treatment. Another is the influence of counter dope (i.e., n-type and p-type impurity concentrations compete, and the n-type drift layer is made low concentration or becomes a neutral region). As a result, it is difficult to obtain the n-type drift layer having the desired narrow width and high n-type impurity concentration.

Namely, the element structure of FIG. 64 is effective to reduction of on-resistance; however, it is difficult to increase the net n-type impurity concentration of the n-type drift layer 109. For this reason, in the current stage, it is difficult to sufficiently reduce on-resistance.

FIG. 65 shows the structure of a junction termination region JTR of the power MOSFET of FIG. 64. In FIG. 65, a dicing line DL is also shown. In the junction termination region JTR, the n-type drift layer 109 and the p-type drift layer 110 are alternately repeatedly formed. However, no p-type drift layer 110 is formed in the region from the end of a cell region CR with a predetermined distance to the chip end. Only n-type drift layer 109 (n-type base layer) is formed in the region described above.

The surface of the n-type drift layer 109 of the chip end is formed with a high concentration n-channel stopper layer 111, and an electrode 112 is formed on the n-channel stopper layer 111.

The method of manufacturing the power MOSFET having the junction termination region will be described with reference to FIG. 66.

A substrate including the n-type drain layer 101 is prepared (step S11). The n-type and the p-type drift layers 109 and 110 are formed on the substrate by repeating epitaxial growth of an n-type silicon layer (step S12) and ion implantation of p-type impurities (step S13).

More specifically, the n-type silicon layer constituting part of the n-type drift layer 109 epitaxially grows on the substrate by a predetermined thickness (step S12).

Resist having an opening on a forming region of the p-type drift layer 110 is formed on the n-type silicon layer using the publicly known photolithography process. Thereafter, p-type impurity (e.g., boron) is implanted into the n-type silicon layer, using the resist as a mask. Anneal (activation anneal) for activating the p-type impurity is carried out. As a result, a p-type silicon layer constituting part of the p-type drift layer 110 is formed by a predetermined thickness (step S13).

The steps S12 and S13 are repeated until the n-type and p-type silicon layers becomes a predetermined thickness, that is, the n-type and p-type drift layers 109 and 110 having a predetermined thickness are obtained. In the manner described above, a wafer in which the n-type and p-type drift layers 109 and 110 are formed on the n-type drain layer 101 is obtained (step S14).

Thereafter, the MOSFET structure is formed on the wafer surface by the publicly know process (step S15). Finally, a chip including a power MOSFET is cut from the wafer.

In the power semiconductor element, if current rating is different even when the breakdown voltage is the same, it is general that the number (area) of the n-type and p-type drift layers 109 and 110 is different. Therefore, if current rating is different even when the breakdown voltage of the power semiconductor element built in the wafer is the same, the chip size is different in general.

As described above, ion implantation of the p-type impurity is employed to form the p-type drift layer 110; As a result, different mask for ion implantation is required for each current rating (chip size).

For this reason, in step S13, different mask for ion implantation must be formed for each current rating, and in addition, different exposure mask must be formed for each different mask for ion implantation. As described above, even if the breakdown voltage is the same, different mask must be formed for each current rating. This is a factor of increasing the manufacture cost.

Likewise, different wafer (wafer formed in step S14) is required for each current rating (chip size). Thus, even when forming the element having the same breakdown voltage, different wafer is used for each current rating in step S15. This is another factor of increasing the manufacture cost.

BRIEF SUMMARY OF THE INVENTION

According to one aspect of the present invention, there is provided a semiconductor device including a power semiconductor element, the power semiconductor element comprising: a drain layer of a first conductivity type; drift layers of first and second conductivity types provided on the drain layer of the first conductivity type; an insulating film provided between the drift layers of the first and second conductivity types and contacting the drift layers; a first base layer of the second conductivity type provided on a surface of the drift layer of the first conductivity type; a source layer of the first conductivity type selectively provided on a surface of the first base layer of the second conductivity type; a gate insulating film provided on the first base layer of the second conductivity type between the source layer of the first conductivity type and the drift layer of the first conductivity type; a gate electrode provided on the gate insulating film; a second base layer of the second conductivity type provided on a surface of the drift layer of the second conductivity type; a first main electrode provided on the drain layer of the first conductivity type; and a second main electrode provided on the source layer of the first conductivity type, the first base layer of the second conductivity type and the second base layer of the second conductivity type.

According to another aspect of the present invention, there is provided a semiconductor device comprising: a drain layer of a first conductivity type; a drift layer comprising a drift layer of the first conductivity type provided on the drain layer of the first conductivity type, and a drift layer of a second conductivity type provided on the drain layer of the first conductivity type and the drift layer of the first conductivity type, the drift layers of the first and second conductivity types being alternately repeatedly arrayed; a cell region provided in the drift layer, and including a power semiconductor element; and a junction termination region provided in the drift layer to surround the cell region, and including a junction termination structure.

According to one aspect of the present invention, there is provided a method of manufacturing a semiconductor device comprising: preparing a substrate including a drain layer of a first conductivity type and a base layer provided on the drain layer of the first conductivity type; making a plurality of trenches in the base layer to form a plurality of semiconductor layers apart from each other via the plurality of trenches, the plurality of semiconductor layers comprising the base layer; forming an insulating film in the plurality of trenches; implanting impurity of the first conductivity type in a surface of alternate semiconductor layers by ion implantation and implanting impurity of a second conductivity type in a surface of the other semiconductor layers by ion implantation; diffusing the impurities of the first and second conductivity types in the semiconductor layers by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on the surface of the drift layer of the first conductivity type, a source layer of the first conductivity type on a surface of the first base layer of the second conductivity type, a gate insulating film on the first base layer of the second conductivity type between the source layer of the first conductivity type and the drift layer of the first conductivity type,. a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types respectively.

According to another aspect of the present invention, there is provided a method of manufacturing a semiconductor device comprising: preparing a substrate including a drain layer of a first conductivity type and a base layer provided on the drain layer of the first conductivity type; implanting impurity of the first conductivity type in a plurality of first regions spaced apart from each other on a surface of the base layer by ion implantation, and implanting impurity of a second conductivity type in a plurality of second regions sandwiched between the plurality of first regions on the surface of the base layer; making a plurality of trenches in a plurality of third regions including regions between the plurality of first and second regions to form a plurality of semiconductor layers spaced apart from each other via the plurality of trenches, the plurality of semiconductor layers comprising the base layer in which the impurities of the first and second conductivity types are implanted; forming an insulating film in the plurality of trenches; diffusing the impurities of the first and second conductivity types in the semiconductor layer by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on a surface of the drift layer of the first conductivity type, a source layer of the first conductivity type on a surface of first base layer of the second conductivity type, a gate insulating film on the first base layer of the second conductivity type between the source layer of the first conductivity type and the drift layer of the first conductivity type, a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types.

According to another aspect of the present invention, there is provided a method of manufacturing a semiconductor device comprising: preparing a substrate including a drain layer of a first conductivity type and a first base layer provided on the drain layer of the first conductivity type; implanting impurity of the first conductivity type in a plurality of first regions spaced apart from each other on a surface of the first base layer by ion implantation, and implanting impurity of a second conductivity type in a plurality of second regions sandwiched between the plurality of first regions on the surface of the first base layer; forming a second base layer on the first base layer; implanting impurity of the first conductivity type in a first region of a surface of the second base layer on the plurality of first regions by ion implantation, and implanting impurity of the second conductivity type in a second region of the surface of the second base layer on the plurality second regions; making a plurality of trenches in a plurality of regions including regions between the plurality of first and second regions of the first base layer and between the plurality of first and second regions of the second base layer to form a plurality of semiconductor layers spaced apart from each other via the plurality of trenches, the plurality of semiconductor layers comprising the base layer in which the impurities of the first and second conductivity type are implanted by ion implantation; forming an insulating film in the plurality of trenches; diffusing the impurities of the first and second conductivity types in the semiconductor layer by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on a surface of the drift layer of the first conductivity type, a source layer of the first conductivity type on a surface of the base layer of the first conductivity type, a gate insulating film on the first base layer of the second conductivity type between the source layer of the first conductivity type and the drift layer of the first conductivity type, a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types.

According to another aspect of the present invention, there is provided a method of manufacturing a semiconductor device comprising: forming a drift layer on a drain layer of a first conductivity type,. the drift layer comprising drift layers of first and second conductivity types, the drift layers being alternately repeatedly arrayed; forming a plurality of cell regions spaced apart from each other and including a power semiconductor element in the drift layer and a plurality of junction termination regions surrounding the plurality of cell regions and including a junction termination structure to form a plurality of cell and junction termination regions comprising a couple of the cell region and the junction termination region surrounding the cell region in the drift layer and isolating the plurality of cells and the plurality of junction termination regions from each other.

BRIEF DESCRIPTION OF THE SEVERAL VIEWS OF THE DRAWING

FIG. 38 is a sectional perspective views showing a semiconductor device including a vertical power MOSFET according to a 24th embodiment of the present invention;

FIG. 39 is a chart showing the relationship between reverse recovery current and time in the 24th embodiment and the comparative example;

FIG. 51 is a plan view showing still another plane structure of the power MOSFET of the 31st embodiment;

FIG. 52 is a chart showing the process flow of a chip including a semiconductor device including a vertical power MOSFET according to a 33rd embodiment of the present invention;

DETAILED DESCRIPTION OF THE INVENTION

Embodiments of the present invention will be described below with reference to the accompanying drawings. In the following embodiments, an n-type is used as a first conductivity type, and a p-type is used as a second conductivity type.

(First Embodiment)

Figure 1:
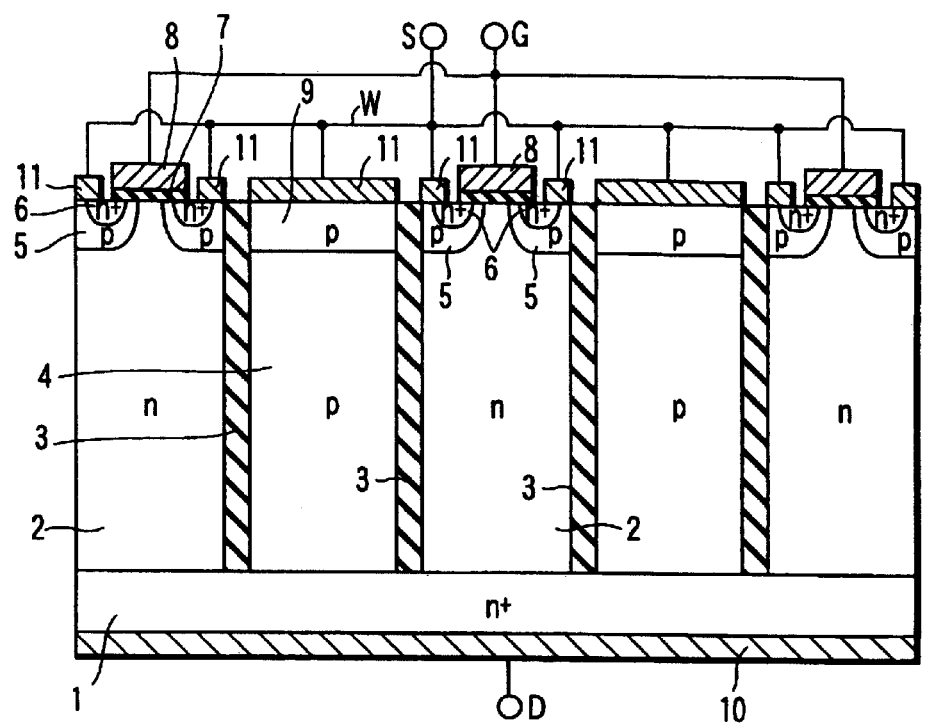
FIG. 1 is a cross-sectional view showing a semiconductor device including a vertical power MOSFET according to a first embodiment of the present invention.

FIG. 1 is a cross-sectional view showing a semiconductor device including a vertical power MOSFET according to a first embodiment of the present invention. In the following embodiments, the following power semiconductor element and IC are included as the semiconductor device. That is, several power semiconductor elements are assembled, and function as one power semiconductor element. In addition, several power semiconductor elements, driver circuit and protection circuit are integrated on one chip.

In FIG. 1, a reference numeral 1 denotes an n-type drain layer having high impurity concentration (low resistance). Pillar-shaped n-type drift layer 2, barrier insulator 3 and p-type drift layer 4 are alternately and repeatedly arrayed on the n-type drain layer 1. The n-type drift layer 2, the barrier insulating film 3 and the p-type drift layer 4 contact with the n-type drain layer 1.

Typical values of the width and impurity concentration of the n-type drift layer 2 are as follows. For example, if the width is 5 μm, the impurity concentration is $4 \times 10^{15}$ cm$^{-3}$. If the width is 1 μm, the impurity concentration is $2 \times 10^{16}$ cm$^{-3}$. Typical values of the width and impurity concentration of the p-type drift layer 4 are the same as those of the n-type drain layer 2.

The surface of the n-type drift layer 2 is selectively provided with a first p-type base layer 5, and the surface of the first p-type base layer 5 is electively provided with an n-type source layer 6 having high impurity concentration. The first p-type base layer 5 contacts with the barrier insulating film 3.

A gate insulating film (first gate insulating film) 7 is provided on the first p-type base layer 5 between the n-type source layer 6 and the n-type drift layer 2. A gate electrode 8 is provided on the gate insulating film 7. An n-channel MOSFET for electron injection is composed of the n-type source layer 6, first p-type base layer 5, n-type drift layer 2, gate insulating film 7 and gate electrode 8. The n-channel MOSFET uses the surface of the first p-type base layer 5 under the gate electrode 8 as a channel region.

On the other hand, the entire surface of the p-type drift layer 4 is provided with a second p-type base layer 9 having impurity concentration higher than the p-type drift layer 4. The second p-type base layer 9 contacts with the barrier insulating films 3 arrayed on its both sides. A drain electrode 10 (first main electrode) is provided on the n-type drain layer 1. A source electrode 11 (second main electrode) is provided on the first p-type base layer 5, n-type source layer 6 and second p-type base layer 9.

In FIG. 1, the source electrodes 11 provided on the first p-type base layer 5 and n-type source layer 6 and provided on the second p-type base layer 9 are formed as an electrode independent from each other. However, the source electrodes 11 are electrically connected via wiring W. In addition, these source electrodes may be integrally formed as the identical source electrode.

Figure 2:
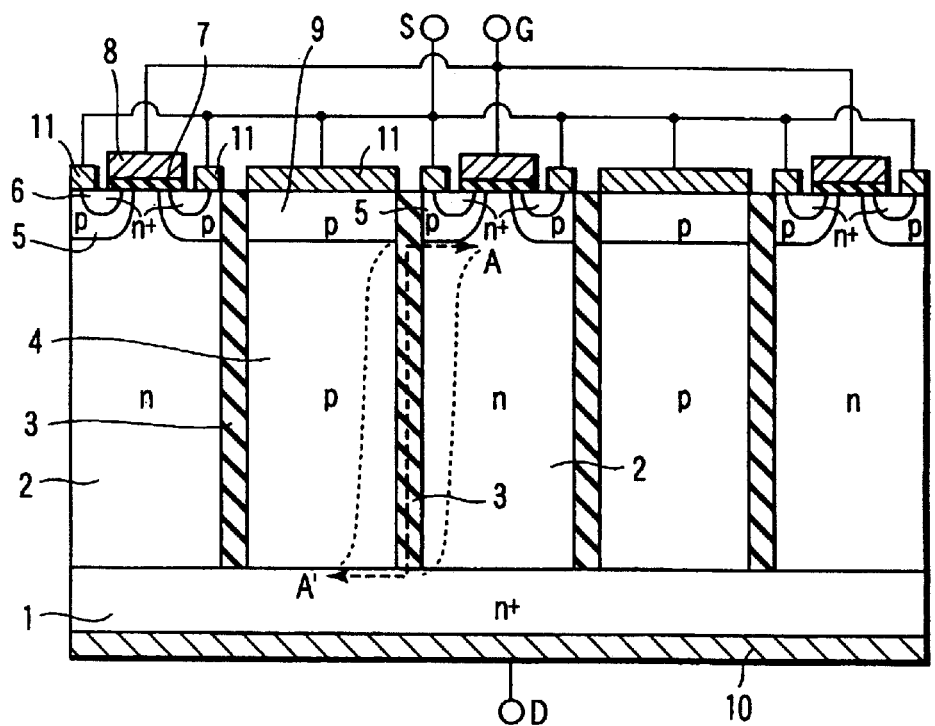
FIG. 2 is a cross-sectional view to explain the reason why high breakdown voltage is obtained in the power MOSFET of the first embodiment.

The reason why high breakdown voltage-is obtained in the embodiment is as follows. FIG. 2 shows the spread of depletion layer in the element at the initial period of the off-state. The following is a detailed description. The power MOSFET of the embodiment is used as a switching element of the device using a 300V power supply. The drain electrode 10 and the source electrode 11 are connected to plus and minus terminals of the power supply, respectively.

When the power supply turns on, a voltage more than the threshold voltage Vth is applied to the gate electrode 8, and thereby, the device becomes on-state (voltage Vds between source and drain is about 1 to 5V) is obtained. Then, a voltage lower than the threshold voltage Vth is applied to the gate electrode 8 as the power supply is on-state, and thereby, the device is switched to off-state. In FIG. 2, there is shown the spread of depletion layer in the element at the initial period (the step-up value of the voltage Vds is less than about 50V) of the off-state. In FIG. 2, the depletion layer is shown by a dotted lone.

If the power supply is 300V, the voltage Vds temporarily steps up to about 600V by the influence of parasitic inductance of peripheral circuits of the device. Thus, if the power supply is 300V, about 600V breakdown voltages are usually required in the off-state.

Figure 3:
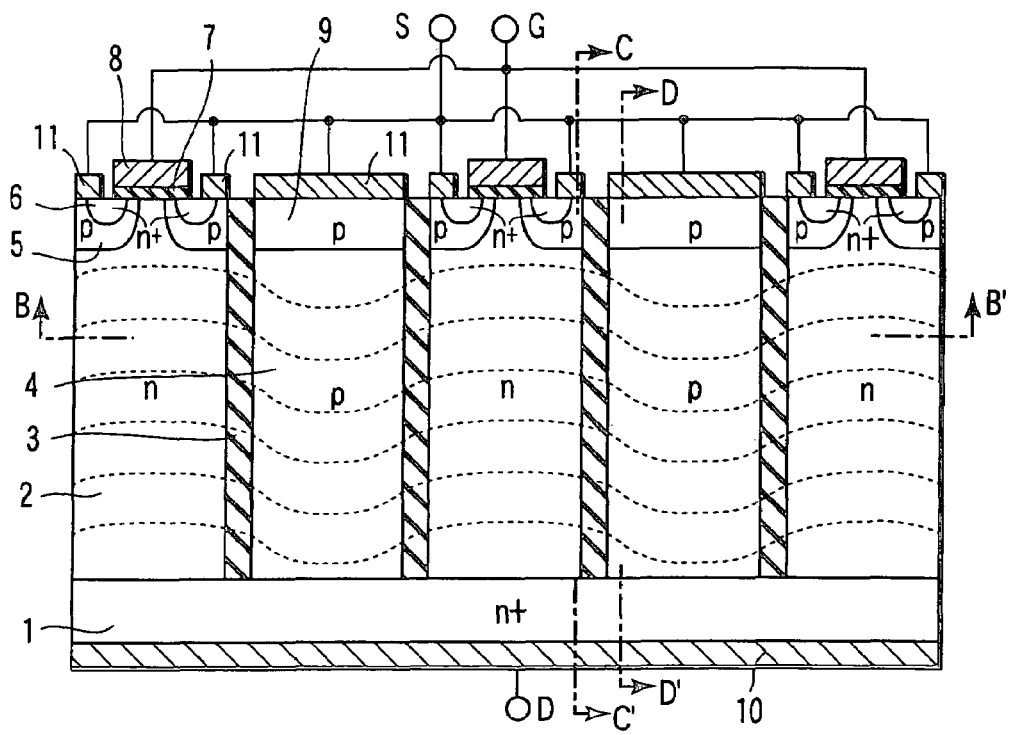
FIG. 3 is a view showing a potential distribution (equipotential line) when voltage equivalent to static breakdown voltage is applied to the power MOSFET of the first embodiment.
Figure 4:
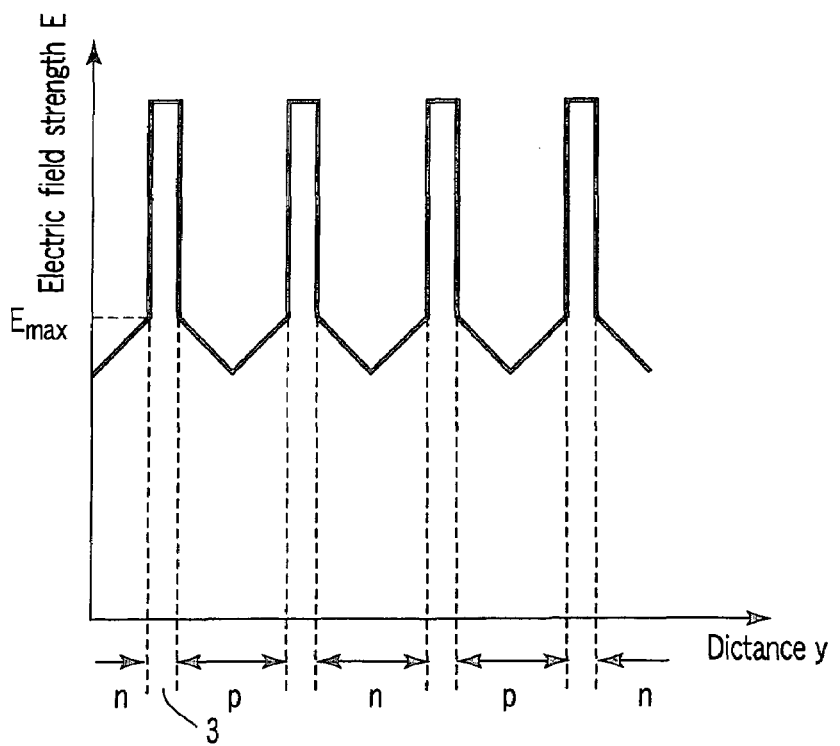
FIG. 4 is a view showing electric field distribution in an off-state in section taken along a line B–B' of FIG. 3.
Figure 5:
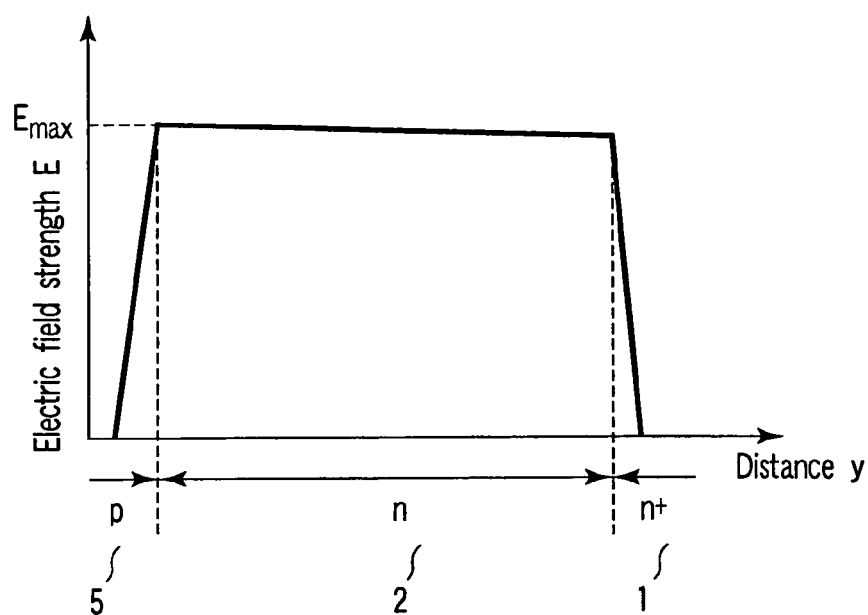
FIG. 5 is a view showing electric field distribution in an off-state in section taken along a line C–C' of FIG. 3.

As seen from a line A–A' of FIG. 2, in the off-state initial period, the depletion layer starts to spread using the following portions as a junction interface. One of the portions is the interface between the n-type drift layer 2 and the first p-type base layer 5. Another is the barrier insulating film 3 interposed between the n-type drift layer 2 and the p-type drift layer 4. Another is the interface between the p-type drift layer 4 and the n-type drain layer 1. Namely, even if the barrier insulating film 3 is interposed between the n-type drift layer 2 and the p-type drift layer 4, the spread of depletion layer in the off-state initial period is the same as the case where there is no barrier insulating film 3. FIG. 3 shows potential distribution (equipotential line) when a voltage equivalent to static breakdown voltage is applied to the element. FIG. 4 shows electric field distribution in a blocking state in the section taken along a line B–B' section of FIG. 3. FIG. 5 shows field distribution in a blocking state in the section taken along a line C–C' of FIG. 3. In FIG. 3, the equipotential line is shown by a dotted line.

As seen from FIG. 4, in the embodiment, the voltage is shared into three, that is, n-type drift layer 2, barrier insulating film 3 and p-type drift layer 4.

Figure 64:
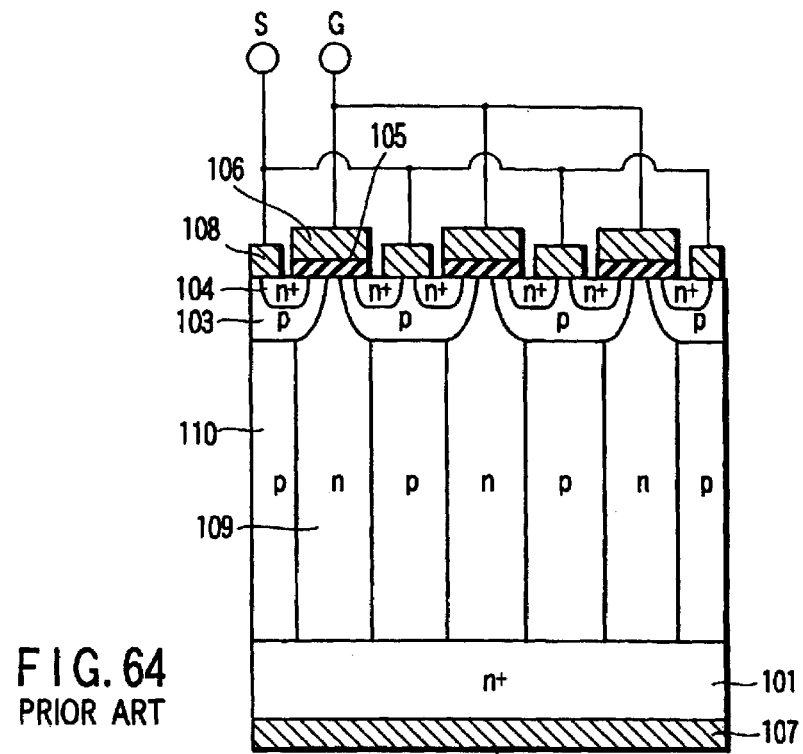
FIG. 64 is a cross-sectional view showing a conventional power MOSFET.

On the contrary, in the conventional power MOSFET shown in FIG. 64, the voltage is merely shared into two, that is, n-type drift layer 109 and p-type drift layer 110.

According to the embodiment, part of the voltage is shared into the barrier insulating film 3, which is not provided in the conventional power MOSFET shown in FIG. 64; therefore, the breakdown voltage can be improved.

In the embodiment, in the off-state or in a state that the voltage equivalent to static breakdown voltage is applied, the depletion layer spreads. That is, the depletion layer spreads to the lateral direction from the interface between n-type drift layer 2 and barrier insulating film 3 and between p-type drift layer 4 and the same. In this case, parameters (e.g., impurity concentration, width) of n-type and p-type drift layers 2 and 4 are selected so that these drift layers 2 and 4 can be fully depleted before the element breaks down.

Figure 63:
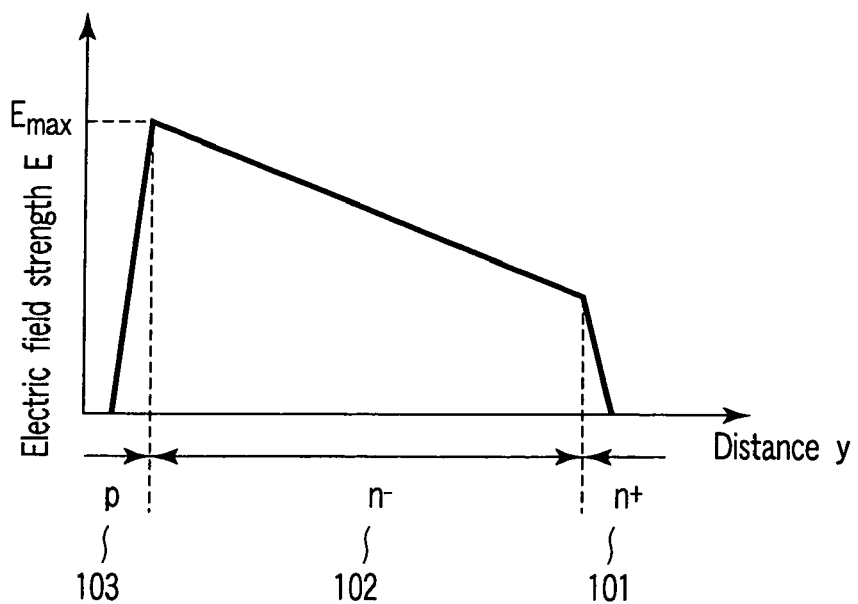
FIG. 63 is a view showing field distribution in section taken along a line 63A–63A of FIG. 62.

As a result, in the vertical direction of the n-type and p-type drift layers 2 and 4, constant electric field shown in FIG. 5 is formed in the n-type drift layer 2 as if n-type impurity concentration is low. By doing so, the area of the electric field distribution of the n-type drift layer 2 (equivalent to n-type base layer 102 of FIG. 63) is increased as compared with the conventional field distribution of FIG. 63. Consequently, the breakdown voltage can be improved.

As described above, according to the embodiment, part of the voltage is shared into the barrier insulating film 3, and the field distribution of the n-type drift layer 2 is made flat. In addition, the area of the electric field distribution is increased. The synergistic effect described above can sufficiently improve the breakdown voltage; therefore, high breakdown voltage can be obtained.

Figure 6:
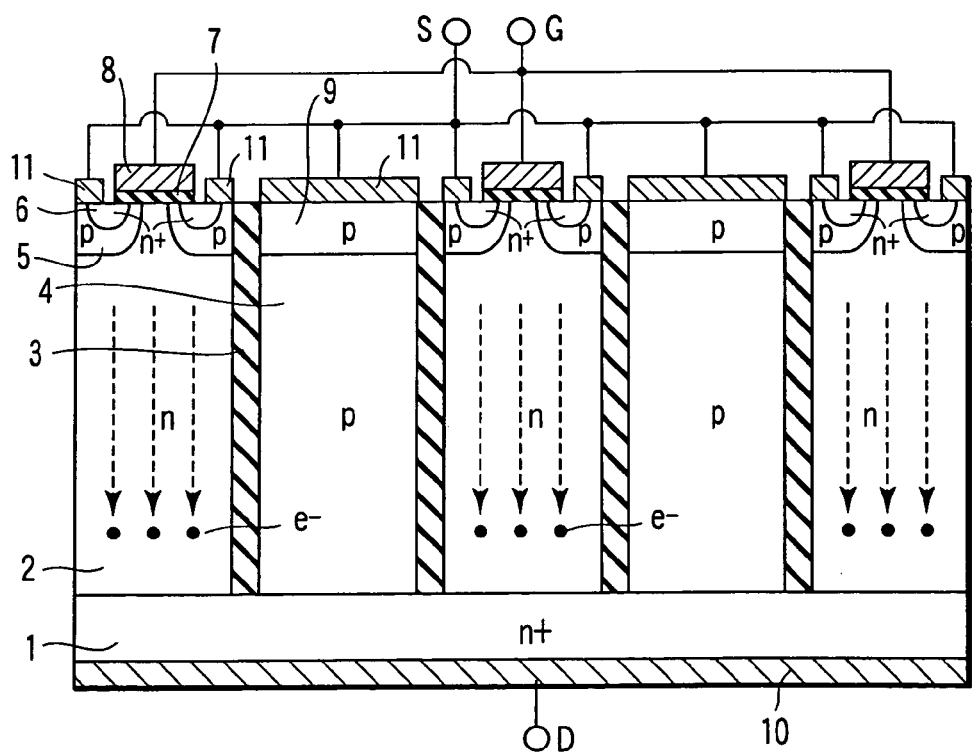
FIG. 6 is a view showing the flow of carriers (electrons) in an on-state (conducting state) of the power MOSFET of the first embodiment.

The reason why low on-resistance is obtained in the embodiment will be described below. FIG. 6 schematically shows the flow of carriers (electrons e⁻) in the on state (conducting state).

As described above, parameters of n-type and p-type drift layers 2 and 4 are selected so that these drift layers 2 and 4 can be fully depleted by the depletion layer spreading from the lateral direction before the element breaks down.

More specifically, as described before, the n-type impurity concentration of the n-type drift layer 2 is set to high value such as $4 \times 10^{15}$ cm$^{-3}$ and $2 \times 10^{16}$ cm$^{-3}$. In other words, the n-type impurity concentration of the n-type drift layer 2 is set infinitely higher within a range that full depletion layer is realized. The n-type impurity concentration can be set to higher values such as numerical values described above, which are not obtained from the breakdown voltage relationship in the conventional power MOSFET (FIG. 64). The numerical value of the n-type impurity concentration will be described below.

In the conventional power MOSFET, the relationship between the n-type impurity concentration Nn⁻ of n-type drift layer and the breakdown voltage Vb is expressed by the following equation.

$$Vb = Emax \times Ldrift - q \times Nn^- \times (Ldrift^2)/(2 \times \epsilon)$$

Emax: breakdown electric field (maximum electric field) of semiconductor material of MOSFET (about $2 \times 10^5$ [V/cm] in Si)

q: elementary charge ($1.60219 \times 10^{19}$ [C])

Nn⁻: n-type impurity concentration Nn⁻ of n-type drift layer [cm$^{-3}$]

$\epsilon$: permittivity of semiconductor material of MOSFET ($1.04 \times 10^{12}$ [F/cm] in Si)

In the embodiment, the n-type impurity concentration (Ndrift) of the n-type drift layer 2 is set higher than Nn⁻ of the conventional MOSFET; therefore, the following inequality can be obtained.

$$Ndrift > 2 \times \epsilon \times (Emax \times Ldrift - Vb)/(q \times Ldrift^2)$$

The value obtained from the expression $2 \times \epsilon \times (Emax \times Ldrift - Vb)/(q \times Ldrift^2)$ is the maximum impurity concentration (critical value) of the n-type drift layer of the conventional MOSFET, which is realizable within a range that no breakdown occurs. According to the embodiment, it is possible to realize a power MOSFET having the n-type drift layer having high impurity concentration exceeding the critical value of the conventional power MOSFET.

As described above, the impurity concentration of the n-type drift layer 2 is set higher, and thereby, the reduction of on-resistance can be achieved. Therefore, according to the embodiment, high breakdown voltage and low on-resistance can be both realized.

Here, the breakdown voltage is determined by the total amount of impurities in n-type and p-type drift layers 2 and 3 and the thickness (drift length) of the same. In order to obtain high breakdown voltage, the drift length may be simply made long in proportional to the breakdown voltage. On-resistance is proportional to the first power of the breakdown voltage (see FIG. 7).

On the contrary, in order to obtain high breakdown voltage in the conventional MOSFET, the impurity concentration must be reduced while the drift length must be made long. For this reason, on-resistance is proportional to about 2.5 power of the breakdown voltage (see FIG. 7). Therefore, the higher the breakdown voltage becomes, the greater the reduction effect of on-resistance becomes in the embodiment.

Here, the width of the n-type drift layer 2 is made narrow under the fixed breakdown voltage (the fixed amount of n-type impurity). In this case, the narrower the width of the n-type drift layer 2 is made, the higher the n-type impurity concentration of the n-type drift layer 2 can be set. Therefore, the width of the n-type drift layer 2 is made narrow under the fixed breakdown voltage, and thereby, the narrower the width of the n-type drift layer 2 becomes, the greater the effect of lowering on-resistance becomes. In other words, it is possible to reduce on-resistance as compared with the conventional case if the breakdown voltage is the same.

In the element structure of the embodiment, the width of the n-type drift layer 2 can be readily made narrow by employing the manufacturing method described later. Therefore, the width of the n-type drift layer 2 is made narrower, and the n-type impurity concentration thereof is made higher, and thereby, the reduction of on-resistance can be readily achieved.

In the element structure of the embodiment, in the on state, a reverse bias voltage of about several V is applied between n-type and p-type drift layers 2 and 3 in accordance with the drain voltage of element. For example, if the source voltage is 0V and the drain voltage is 5V, a reverse bias voltage of about 2 to 3V is applied between n-type and p-type drift layers 2 and 3.

Here, consider the case where no barrier insulating film 3 is provided. By the reverse bias voltage, a depletion layer having the width of about 1 μm spreads from the interface between n-type and p-type drift layers 2 and 3 to the right and left horizontal direction. A depletion layer having the width of about 2 μm in total is generated. As a result, the effective width of the n-type drift layer 2 is reduced.

On the contrary, in the embodiment, most of the reverse bias voltage in on state is applied to the barrier insulating film 3; for this reason, the depletion layer does not so spread in the n-type drift layer 2. Therefore, electrons flow over the entire area of the width of the n-type drift layer 2. The mechanism described above is one of the reasons for achieving the reduction of on-resistance.

Figure 7:
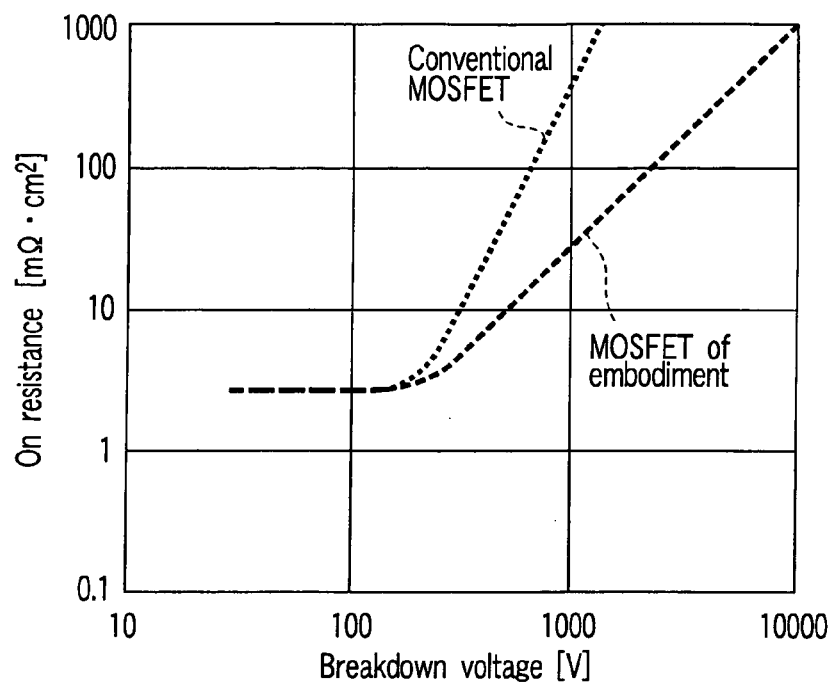
FIG. 7 is a characteristic diagram showing the relationship between breakdown voltage and on-resistance in the power MOSFET of the first embodiment and a conventional MOSFET.
Figure 62:
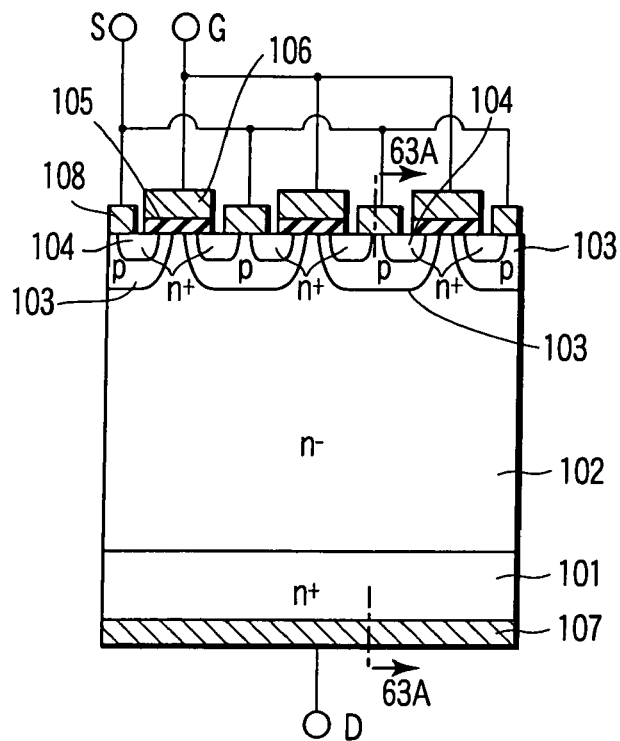
FIG. 62 is a cross-sectional view showing a conventional power MOSFET.

FIG. 7 is a characteristic diagram showing the relationship between breakdown voltage and on-resistance in the power MOSFET of the embodiment (first embodiment) and the conventional MOSFET (FIG. 62). The element material is Si. As seen from FIG. 7, the power MOSFET of the embodiment can obtain low on-resistance effect in the high breakdown voltage range of 200V or more.

The first embodiment has described the power MOSFET using Si as the element material. The same effect can be obtained even if SiC having the maximum breakdown electric field larger than Si is used as the element material.

(Second Embodiment)

Figure 8:
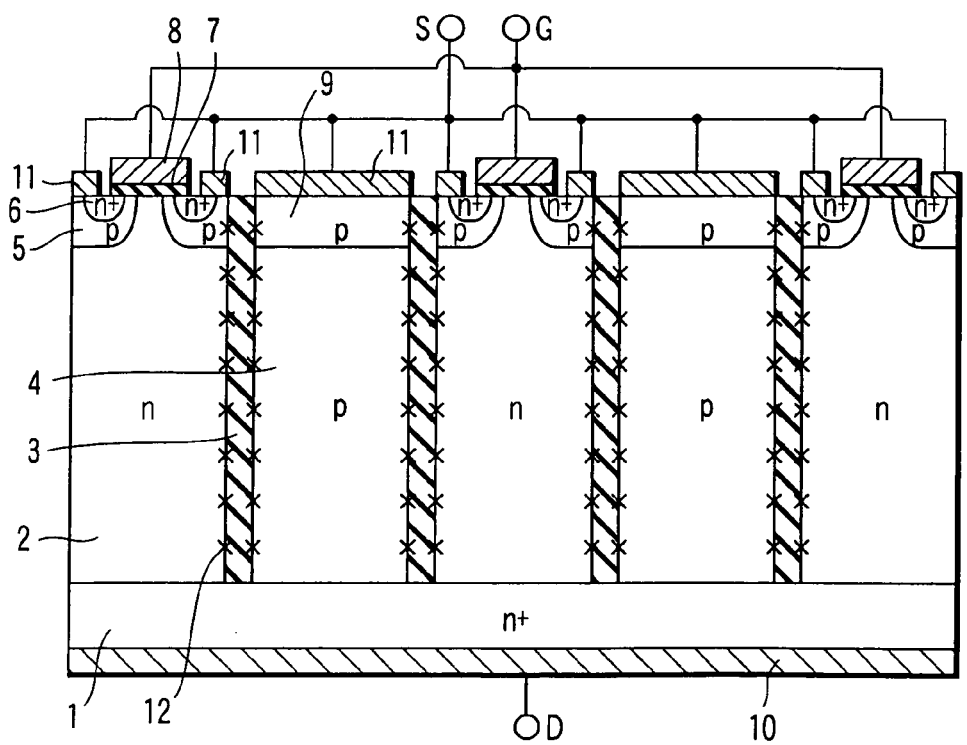
FIG. 8 is a cross-sectional view showing a semiconductor device including a vertical power MOSFET according to a second embodiment of the present invention.

FIG. 8 is a cross-sectional view showing a semiconductor device including a vertical power MOSFET according to a second embodiment of the present invention. In the following drawings, the same reference numerals are used to designate portions corresponding to previous drawings, and the details are omitted.

The second embodiment differs from the first embodiment in the following point. That is, each interface state density between the n-type drift layer 2 and the barrier insulating film 3 and between the p-type drift layer 4 and the same is set to a predetermined value or more. More specifically, the interface state density is set to $1 \times 10^{11}$ cm$^{-2}$ or more. Preferably, the interface state density is set to $1 \times 10^{12}$ cm$^{-2}$ or more. In FIG. 8, a reference numeral 12 denotes a recombination center generated by the cause of interface state. The recombination center 12 is formed by RIE (Reactive Ion Etching) carried out in the process of forming n-type drift layer 2/barrier insulating film 3/p-type drift layer 4. The details will be described in the fourth embodiment.

The second embodiment differs from the first embodiment in the following point. The explanation is made in the light of the recombination center 12, and not the interface state density.

That is, each surface recombination rate in the interfaces contacting with the barrier insulating film 3 of the n-type drift layer 2 and contacting with the same of the p-type drift layer 4 is set to a predetermined value or more. More specifically, the surface recombination rate is set to $1 \times 10^3$ cm·s$^{-1}$ or more.

According to the study by the present inventors, the following matter can be seen. That is, the interface state density and the surface recombination rate are set to a predetermined value or more, and thereby, reverse recovery time is shortened. The reason is as follows.

The interface state density and the surface recombination rate are set to a predetermined value or more, and thereby, the power MOSFET is used in a reverse conducting diode mode. In this case, carriers in the p-type drift layer 4 are speedily extinguished in the reverse recovery time when the diode changes from on state to off-state. By doing so, the reverse recovery current of the reverse conducting diode stored in the element is effectively reduced; therefore, the reverse recovery time can be shortened. In this case, the element is composed of second p-type base layer 9, p-type drift layer 4 and n-type drain layer 1.

The second p-type base layer 9, p-type drift layer 4 and n-type drain layer 1 function as a reverse conducting diode when constituting an H bridge and converter by the power MOSFET.

(Third Embodiment)

Figure 9:
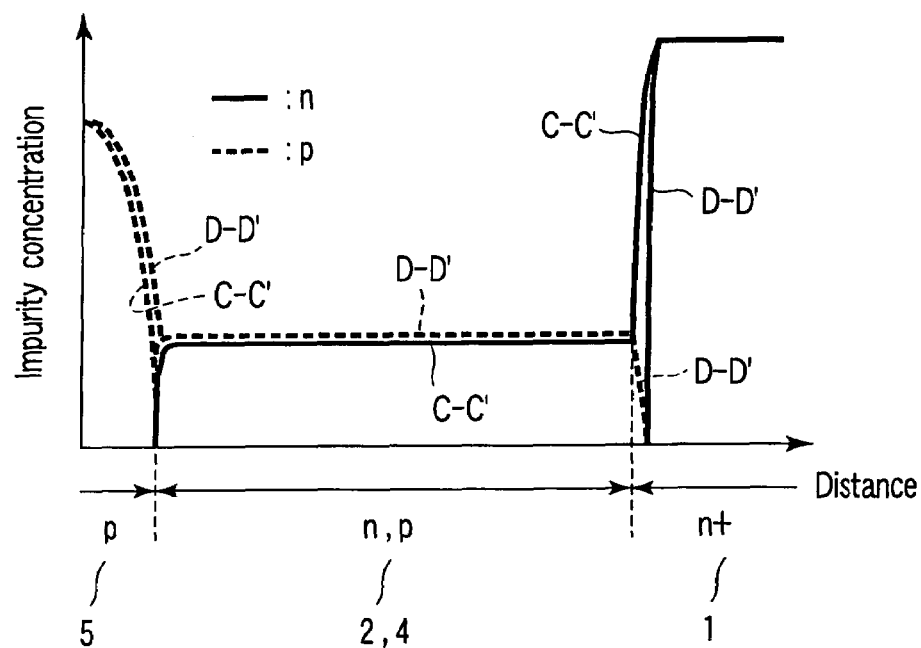
FIG. 9 is a view showing n-type and p-type impurity concentration distribution of a vertical power MOSFET according to a third embodiment of the present invention.

FIG. 9 is a view showing n-type and p-type impurity concentration distributions in the layers below of a vertical power MOSFET according to a third embodiment of the present invention (hereinafter, referred simply to as n-type and p-type impurity concentration distribution). The layers are the n-type drain layer 1, n-type drift layer 2, p-type drift layer 4 and p-type base layer 5.

In FIG. 9, a solid line shows n-type impurity concentration distribution in sections taken along lines C–C' and D–D' of FIG. 3. On the other hand, a broken line shows p-type impurity concentration distribution in sections taken along lines C–C' and D–D' of FIG. 3 (Likewise, impurity concentration distribution is shown in other drawings).

In the embodiment, each impurity concentration distribution of n-type and p-type drift layers 2 and 4 (n-type and p-type impurity concentration distribution excluding n-type and p-type impurities mutually setoff by counter dope) is constantly formed with respect to the thickness (depth) direction of element. Therefore, the field is kept constant in the thickness direction of element, so that high breakdown voltage can be stably obtained.

(Fourth Embodiment)

Figure 10:
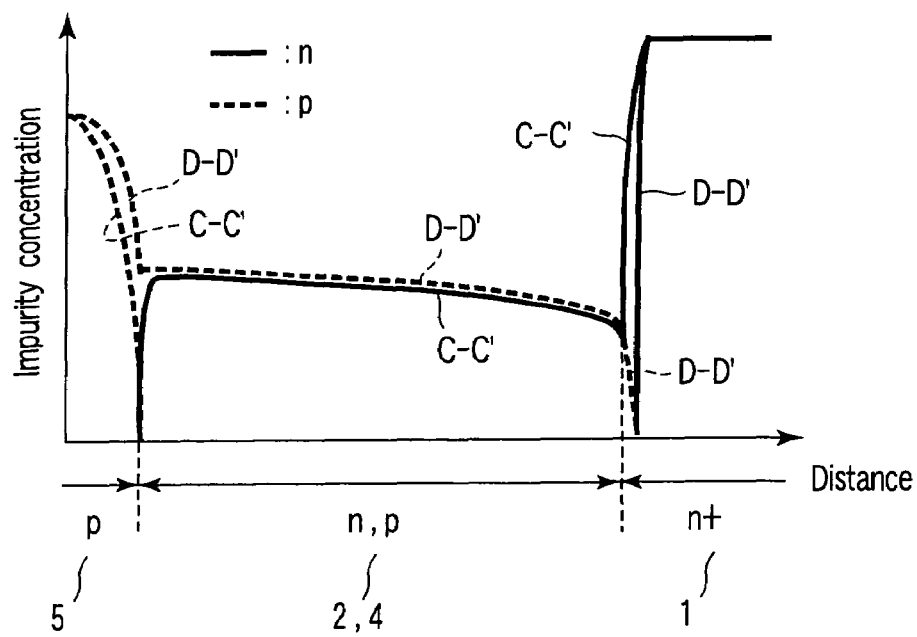
FIG. 10 is a view showing n-type and p-type impurity concentration distribution of a vertical power MOSFET according to a fourth embodiment of the present invention.

FIG. 10 is a view showing n-type and p-type impurity concentration distributions of a vertical power MOSFET according to a fourth embodiment of the present invention.

In the embodiment, each impurity concentration distribution of n-type and p-type drift layers 2 and 4 is formed by thermal diffusion of n-type impurity (e.g., phosphorous) and p-type impurity (e.g., boron) introduced into the surfaces of these layers 2 and 4.

Therefore, it is possible to form n-type and p-type drift layers 2 and 4 by simple manufacturing method. Ion implantation of n-type and p-type impurities is made from the element surface side formed with the gate electrode 8. By doing so, n-type impurity implanted to the depth position, that is, n-type impurity concentration of n-type and p-type drift layers 2 and 4 near the n-type drain layer 1 can be reduced. Therefore, in the off-state time, the field of n-type and p-type drift layers 2 and 4 near the n-type drain layer 1 is locally weakened, so that high breakdown voltage can be stably obtained.

FIG. 11A to FIG. 11E are cross-sectional views showing the process of manufacturing a power MOSFET having the impurity concentration distribution shown in FIG. 10.

Figure 11A:
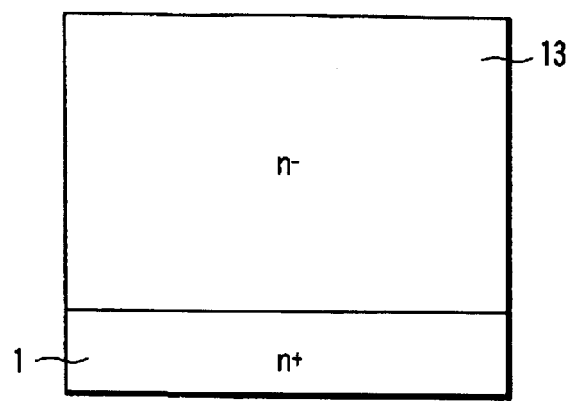
FIG. 11A to FIG. 11E are cross-sectional views showing the process of manufacturing a power MOSFET having the impurity concentration distribution shown in FIG. 10.

As shown in FIG. 11A, a substrate including a high concentration n-type drain layer 1 and a low concentration (high resistance) n-type base layer 13 provided on the layer 1 is prepared. The impurity concentration of the n-type base layer 13 is $1 \times 10^{14}$ cm$^{-3}$.

Figure 11B:
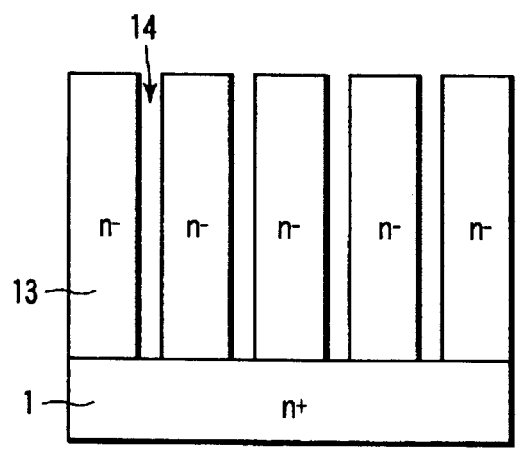

As depicted in FIG. 11B, the n-type base layer 13 is formed with several trenches 14, which reach the surface of the n-type drain layer 1.

Here, if the trench 14 is formed by RIE process, the kind of used etching gas is properly selected, and thereby, the surface state of the sidewall of the trench 14 is controlled. By doing so, the sidewall of the trench 14 can be formed with the recombination center 12 having density required for realizing the interface state density and surface recombination rate of the predetermined value or more. Other interface processes such as dry etching process and wet etching process except RIE process can form high-density recombination center 12.

Incidentally, the bottom of the trench 14 does not necessarily reach the surface of the n-type drain layer 1. The embodiment of a power MOSFET having the trench 14 whose bottom does not reach the surface of the n-type drain layer 1 will be described later.

Figure 11C:
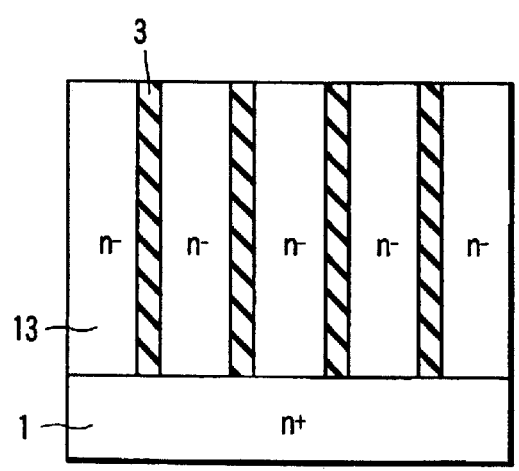

As illustrated in FIG. 11C, the barrier insulating film 3 is formed in the trench 14. More specifically, the barrier insulating film 3 is deposited on the entire surface so that it can be buried in the trench 14. Thereafter, the barrier insulating film 3 outside the trench 14 is removed by CMP (Chemical Mechanical Polishing) process. The barrier insulating film 3 is oxide films (SiO$_2$ film) such as thermal oxide film and CVD oxide film. In place of these oxide films, insulating films consisting of other insulating materials such as nitride film (Si$_3$N$_4$ film) may be used.

Figure 11D:
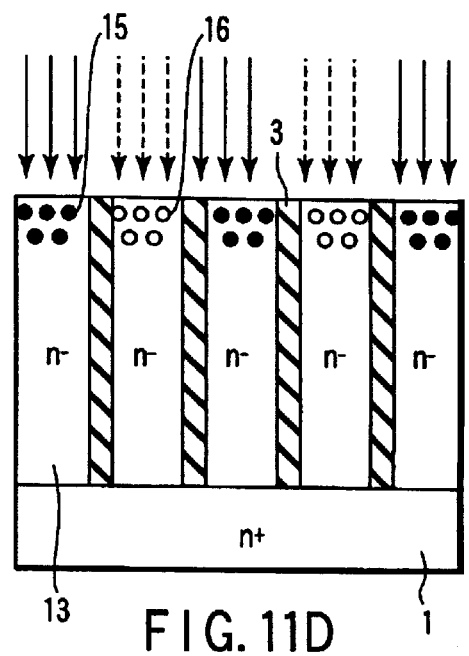
Figure 11E:
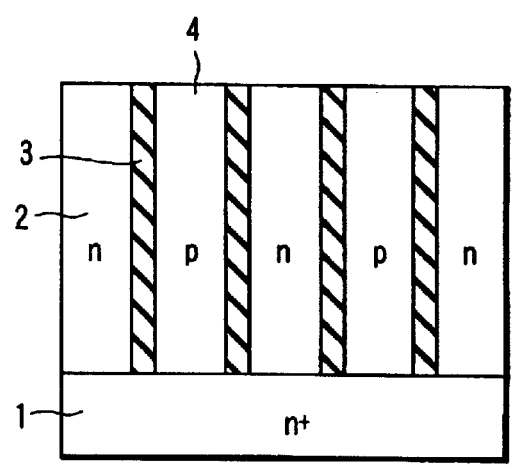

As seen from FIG. 11D, an n-type impurity 15 such as phosphorus is implanted into the surface of the n-type base layer 13 used as the region of the p-type drift layer 4 in a state that the surface is coated with a mask (not shown). Thereafter, the mask is removed, and a p-type impurity 16 such as boron is implanted into the surface of the n-type base layer 13 used as the region of the n-type drift layer 2 in a state that the surface is coated with a mask (not shown). Thereafter, the mask used for ion implantation of the p-type impurity 16 is removed.

In this case, the ion implantation of the p-type impurity 16 may be previously carried out before the ion implantation of the n-type impurity 15. The mask material is photo resist, for example. The mask may be formed to cover part or all of the barrier insulating film 3.

Activation anneal of the n-type and p-type impurities 15 and 16 is carried out, and thereafter, these n-type and p-type impurities 15 and 16 are driven and diffused in the n-type base layer 13 by heat treatment. By doing so, n-type and p-type drift layers 2 and 4 having impurity concentration distribution shown in FIG. 10 can be obtained (see FIG. 11E).

The process described above is carried out, and thereafter, the power MOSFET of the embodiment is obtained via the following publicly known processes. One is the process of forming the first p-type base layer 5, n-type source layer 6, gate insulating film 7 and gate electrode 8 on the surface of the n-type drift layer 2. Another is the process of forming the second p-type base layer 9 on the surface of the p-type drift layer 4. Another is the process of forming drain and the source electrodes 10 and 11.

According to the method described above, when n-type and p-type impurities 15 and 16 are driven and diffused in the n-type base layer 13, the barrier insulating film 3 functions as a barrier to lateral diffusion of these n-type and p-type impurities 15 and 16.

Therefore, n-type and p-type impurities 15 and 16 are effectively diffused in the thickness (depth) direction of n-type and p-type drift layers 2 and 4.

The n-type impurity 15 of the n-type drift layer 2 does not permeate through the p-type drift layer 4; likewise, the p-type impurity 16 of the p-type drift layer 4 does not permeate through the n-type drift layer 2. Thus, the width of the n-type drift layer 2 is readily made narrow, and the n-type impurity concentration there is made high, so that a power MOSFET having low on-resistance can be realized. Likewise, the width of the p-type drift layer 4 is made narrow; therefore, the element as a whole can be correspondingly small.

The n-type and p-type drift layers 2 and 4 are formed according to the following process sequence, that is, process of forming the trench 14, process of forming the barrier insulating film 3, ion implantation process of n-type p-type impurities 15 and 16, and drive-in diffusion process. However, the present invention is not limited to the process sequence described above. For example, the n-type and p-type drift layers 2 and 4 may be formed according the process sequence shown in FIG. 12A to FIG. 12E.

Figure 12A:
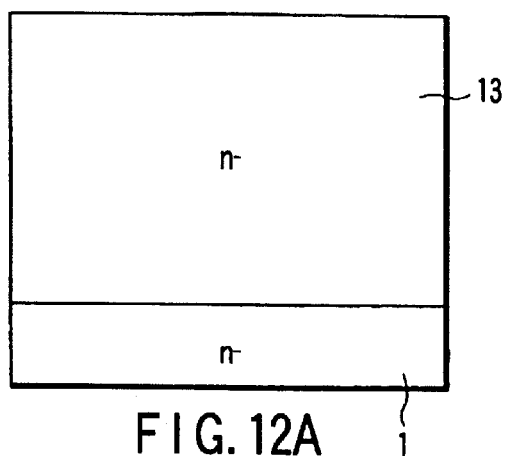
FIG. 12A to FIG. 12E are cross-sectional views showing a modification example of the process of manufacturing a power MOSFET having the impurity concentration distribution shown in FIG. 10.
Figure 12B:
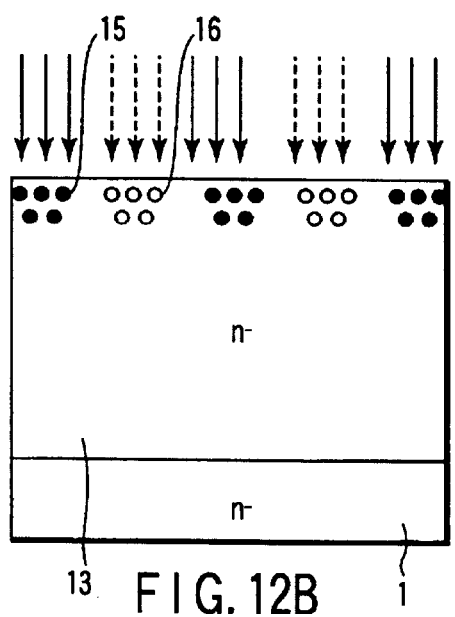
Figure 12C:
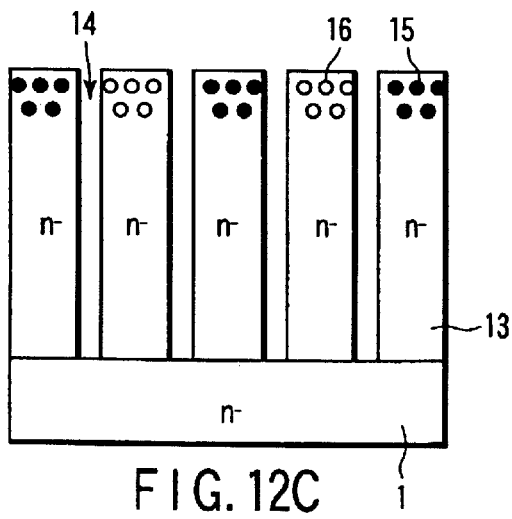
Figure 12D:
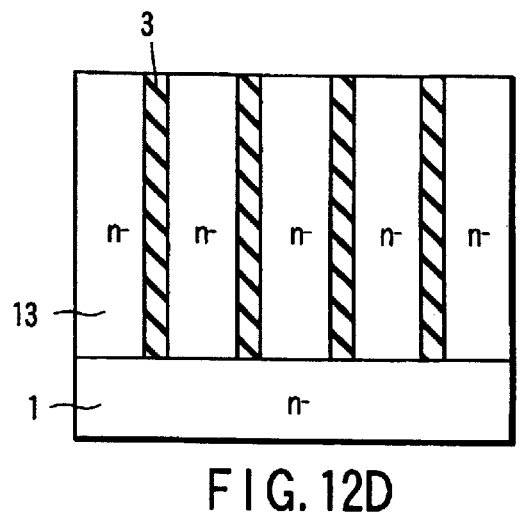
Figure 12E:
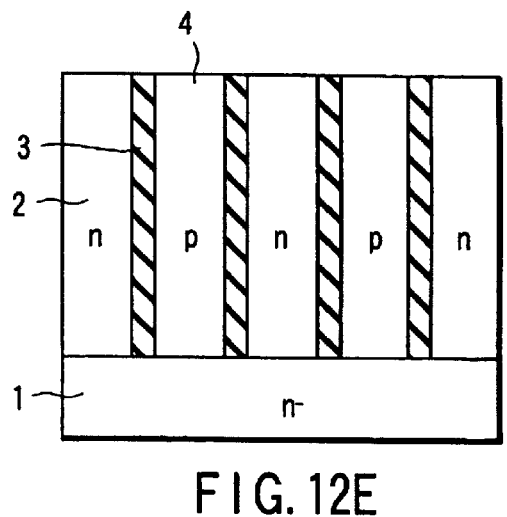

That is, a substrate including the n-type drain layer 1 and the n-type base layer provided thereon is prepared (see FIG. 12A). N-type and p-type impurities 15 and 16 are selectively implanted into several first and second regions on the surface of the n-type base layer 13, respectively (see FIG. 12B). Thereafter, activation anneal of n-type and p-type impurities 15 and 16 is carried out. Several trenches can be formed in the n-type base layer 13 of several third regions including a region between several first and second regions (see FIG. 12C). The barrier insulating film 3 is formed in several trenches 14 (see FIG. 12D), and thereafter, n-type and p-type impurities 15 and 16 are driven and diffused in the n-type base layer 13 by heat treatment (FIG. 12E).

(Fifth Embodiment)

Figure 13:
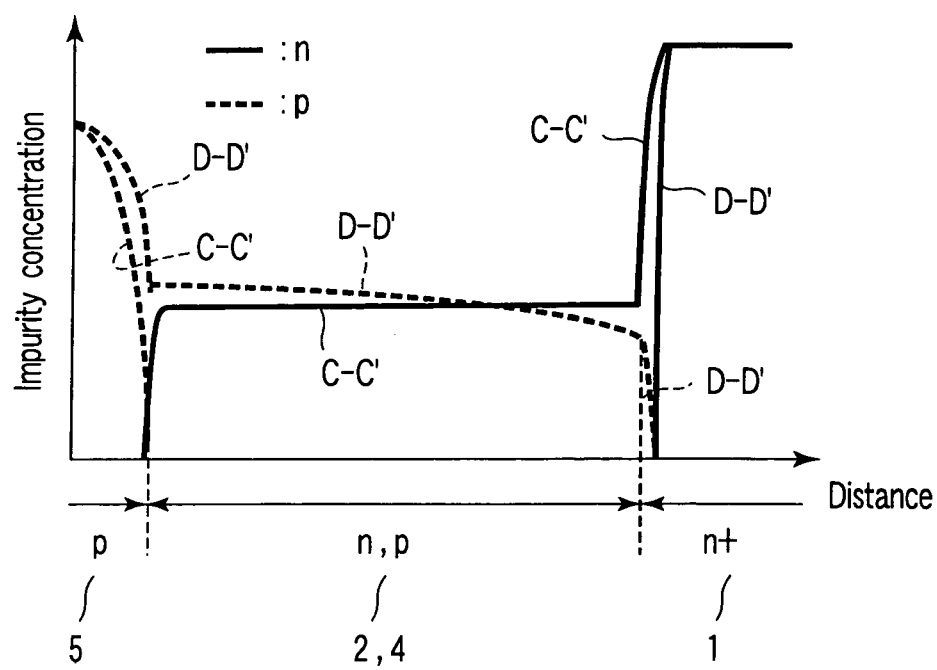
FIG. 13 is a view showing n-type and p-type impurity concentration distribution of a vertical power MOSFET according to a fifth embodiment of the present invention.

FIG. 13 is a view showing n-type and p-type impurity concentration distributions of a vertical power MOSFET according to a fifth embodiment of the present invention.

In the embodiment, the n-type impurity concentration distribution of the n-type drift layer 2 is formed constant with respect to the thickness (depth) direction of element. On the other hand, the p-type impurity concentration distribution of the p-type drift layer 4 is formed by thermal diffusion of the p-type impurity introduced into the surface of the p-type drift layer 4.

In this case, a substrate (wafer) having the n-type drift layer 2 formed on the n-type drain layer 1 is prepared, and thereby, drift layer, that is, the n-type drift layer 2 does not need to be formed. Thus, only p-type drift layer 4 may be formed.

More specifically, in the manufacturing process shown in FIG. 11A to FIG. 11E, the substrate formed with the n-type drift layer 2 having n-type impurity concentration of $1 \times 10^{15}$ cm$^{-3}$ or more is prepared in place of the n-type base layer prepared first. Ion implantation of only p-type impurity 16 is carried out as ion implantation process with respect to the drift layer.

Consequently, according to the embodiment, drift layer process can be further simplified as compared with the case of forming n-type and p-type drift layers 2 and 4 from the first.

Conversely to the embodiment, the p-type impurity concentration distribution of the p-type drift layer 4 is formed constant with respect to the thickness (depth) direction of element. On the other hand, the n-type impurity concentration distribution of the n-type drift layer 2 is formed by thermal diffusion of the n-type impurity introduced into the surface of the n-type drift layer 2.

In this case, a substrate (wafer) having the p-type drift layer 4 formed on the n-type drain layer 1 is prepared, and thereby, drift layer, that is, the p-type drift layer 2 does not need to be formed. Thus, only n-type drift layer 2 may be formed.

More specifically, in the manufacturing process shown in FIG. 11A to FIG. 11E, the substrate formed with the p-type drift layer 4 having p-type impurity concentration of $1\times10^{15}$ cm$^{-3}$ or more is prepared in place of the n-type base layer prepared first. Ion implantation of only n-type impurity 15 is carried out as ion implantation process with respect to the drift layer.

(Sixth Embodiment)

Figure 14:
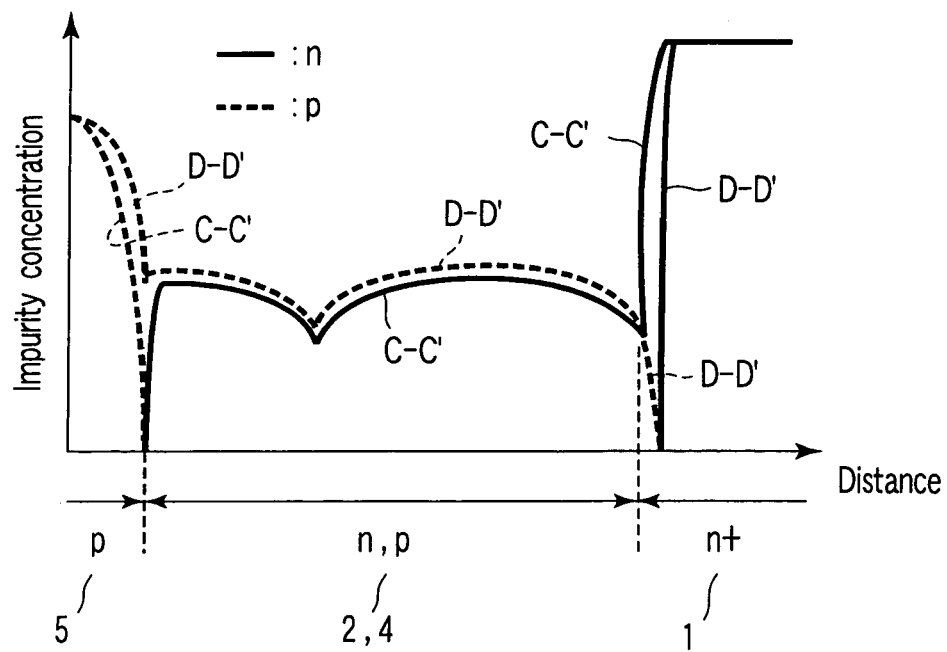
FIG. 14 is a view showing n-type and p-type impurity concentration distribution of a vertical power MOSFET according to a sixth embodiment of the present invention.

FIG. 14 is a view showing n-type and p-type impurity concentration distributions of a vertical power MOSFET according to a sixth embodiment of the present invention.

In the embodiment, the n-type impurity concentration distribution of the n-type drift layer 2 is formed by thermal diffusion of n-type impurities introduced into the upper surface of the n-type drift layer 2 and the surface having a predetermined depth parallel thereto. On the other hand, the p-type impurity concentration distribution of the p-type drift layer 4 is formed by thermal diffusion of p-type impurities introduced into the upper surface of the p-type drift layer 4 and the surface having a predetermined depth parallel thereto.

In this case, one of n-type and p-type drift layers 2 and 4 may have impurity concentration distribution shown in FIG. 14.

FIG. 15 is a cross-sectional view showing the process of manufacturing a power MOSFET having the impurity concentration distribution shown in FIG. 14.

Figure 15A:
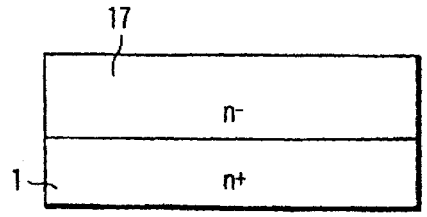
FIGS. 15A to 15G are cross-sectional views showing the process of manufacturing a power MOSFET having the impurity concentration distribution shown in FIG. 14.

As shown in FIG. 15A, a substrate including a high concentration n-type drain layer 1 and a low concentration (high resistance) n-type base layer 17 provided on the layer 1 is prepared. The impurity concentration of the n-type base layer 17 is $1\times10^{14}$ cm$^{-3}$.

Figure 15B:
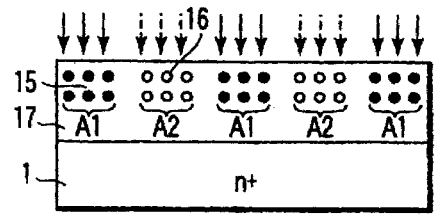

As seen from FIG. 15B, an n-type impurity 15 is implanted into several regions A1 on the surface of the n-type base layer 13 in a state that the surface of the n-type base layer 17 used as the region of the p-type drift layer 4 is coated with a mask (not shown). Thereafter, the mask is removed. Then, a p-type impurity 16 is implanted into several regions A2 on the surface of the n-type base layer 13 in a state that the surface of n-type base layer 17 used as the region of the n-type drift layer 2 is coated with a mask (not shown). Thereafter, the mask used for ion implantation of the p-type impurity 16 is removed.

Figure 15C:
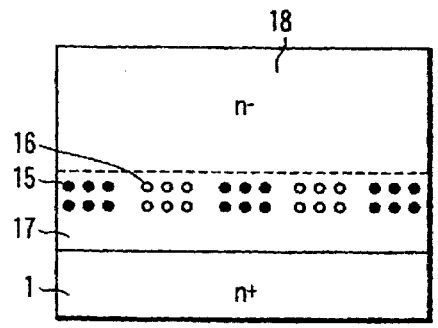

As shown in FIG. 15C, newly another n-type base layer 18 epitaxially grows on the n-type base layer 17.

Figure 15D:
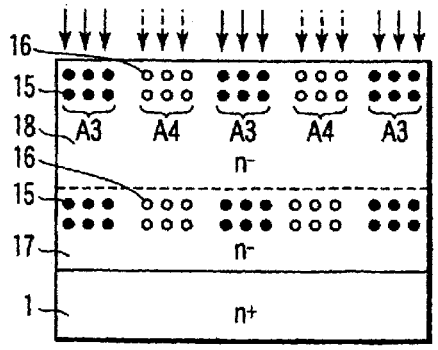

As illustrated in FIG. 15D, the n-type impurity 15 is implanted into several regions A3 on the surface of the n-type base layer 18 in a state that the surface of the n-type base layer 18 used as the region of the p-type drift layer 4 is coated with a mask (not shown). Thereafter, the mask is removed. Then, the p-type impurity 16 is implanted into several regions A4 on the surface of the n-type base layer 18 in a state that the surface of n-type base layer 18 used as the region of the n-type drift layer 2 is coated with a mask (not shown). Thereafter, the mask used for ion implantation of the p-type impurity 16 is removed.

Figure 15E:
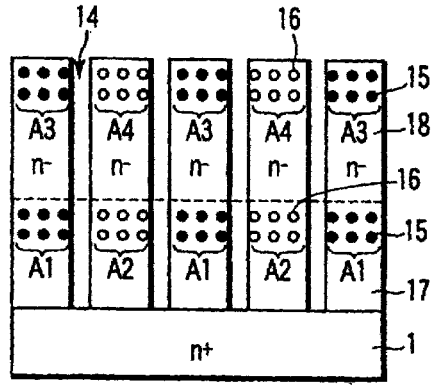

Activation anneal of n-type and p-type impurities 15 and 16 is carried out. Thereafter, as depicted in FIG. 15E, several trenches 14 are formed to reach the surface of the n-type drain layer 1. In this case, several trenches 14 are formed in several regions of n-type and p-type base layers 17 and 18 between the regions A1 and A2 and between the regions A3 and A4.

In this case, the sidewall of the trench 14 may be formed with high-density recombination center 12 described in the fourth embodiment. The bottom of the trench 14 does not necessarily reach the surface of the n-type drain layer 1, like the case of the trench 14 described before.

Figure 15F:
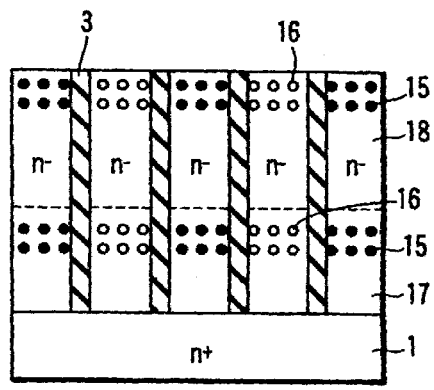
Figure 15G:
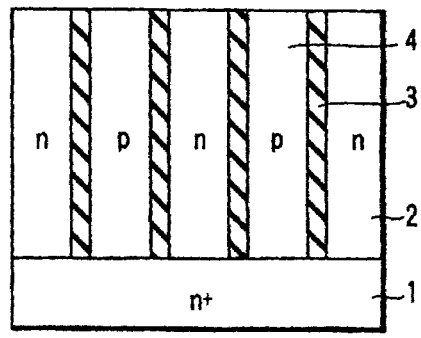

As seen from FIG. 15F, the barrier insulating film 3 is formed in several trenches 14.

Thereafter, n-type and p-type impurities 15 and 16 are driven and diffused in the n-type base layers 17 and 18 by heat treatment. By doing so, n-type and p-type drift layers 2 and 4 having impurity concentration distribution shown in FIG. 14 can be obtained (see FIG. 15G).

The process described above is carried out, and thereafter, the power MOSFET of the embodiment is obtained via the following publicly known processes. One is the process of forming the first p-type base layer 5, n-type source layer 6, gate insulating film 7 and gate electrode 8 on the surface of the n-type drift layer 2. Another is the process of forming the second p-type base layer 9 on the surface of the p-type drift layer 4. Another is the process of forming drain and the source electrodes 10 and 11. According to the method described above, the following effect is obtained in addition to the same effect as the fourth embodiment. Even if n-type and p-type drift layers 2 and 4 are thick, it is possible to form fine (narrow width) n-type and p-type drift layers 2 and 4 having flat (uniform) impurity distribution without making the process complicate or difficult.

In the embodiment, a serial process comprising the following processes is carried out two times; however, it may be carried out three times. The serial process includes process of forming the n-type base layer used as n-type and p-type drift layers 2 and 4, ion implantation process of n-type and p-type impurities 15 and 16, and anneal process of activating n-type and p-type impurities 15 and 16. Namely, the number of times of the serial process may be properly determined in accordance with the thickness of drift layers 2 and 4 to be formed.

(Seventh Embodiment)

Figure 16:
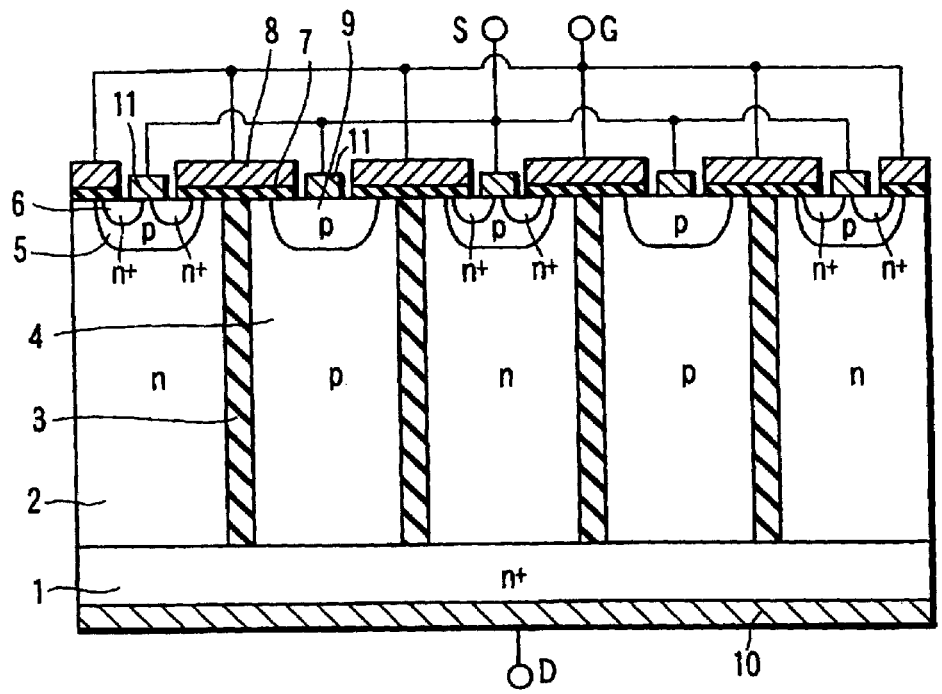
FIG. 16 is a cross-sectional view showing a semiconductor device including a vertical power MOSFET according to a seventh embodiment of the present invention.

FIG. 16 is a cross-sectional view showing a semiconductor device including a vertical power MOSFET according to a seventh embodiment of the present invention.

The seventh embodiment differs from the first embodiment in the following point. That is, the gate insulating film 7 and the gate electrode 8 are formed on n-type and p-type drift layers 2 and 4 to ride on the barrier insulating film 3. In addition, first and second p-type base layers 5 and 9 are selectively formed on the surface of n-type and p-type drift layers 2 and 4 so as not to contact with the barrier insulating film 3.

By doing so, these first and second p-type base layers 5 and 9 are formed by self-align process employing ion implantation using the gate electrode 8 as an ion implantation mask. Therefore, the MOSFET structure on the element surface can be simply formed without carrying out complicate process.

(Eighth Embodiment)

Figure 17:
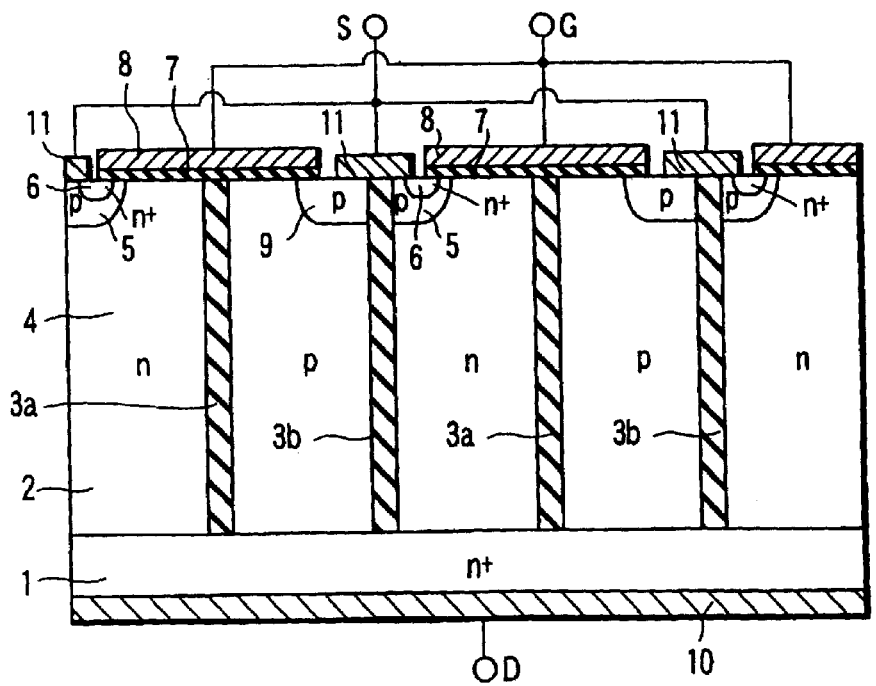
FIG. 17 is a cross-sectional view showing a semiconductor device including a vertical power MOSFET according to an eighth embodiment of the present invention.

FIG. 17 is a cross-sectional view showing a semiconductor device including a vertical power MOSFET according to an eighth embodiment of the present invention.

The eighth embodiment differs from the first embodiment in that one MOSFET structure is formed on one n-type drift layer.

Thus, the gate insulating film 7 and the gate electrode 8 are formed on n-type and p-type drift layers 2 and 4 to ride on the barrier insulating film 3. Further, the source electrode 11 is formed on n-type and p-type drift layers 2 and 4 to ride on a barrier insulating film 3b adjacent to a barrier insulating film 3a. Further, first and second p-type base layers 5 and 9 are selectively formed on the surface of n-type and p-type drift layers 2 and 4 so as not to contact with the barrier insulating film 3b. In addition, one n-type source layer 6 is formed on the surface of one first p-type base layer 5.

According to the embodiment, one MOSFET structure is formed on one n-type drift layer 2. Therefore, micro-fabrication of the MOSFET structure is not so limited as compared with the case of forming two MOSFET structures on one n-type drift layer 2.

(Ninth Embodiment)

Figure 18A:
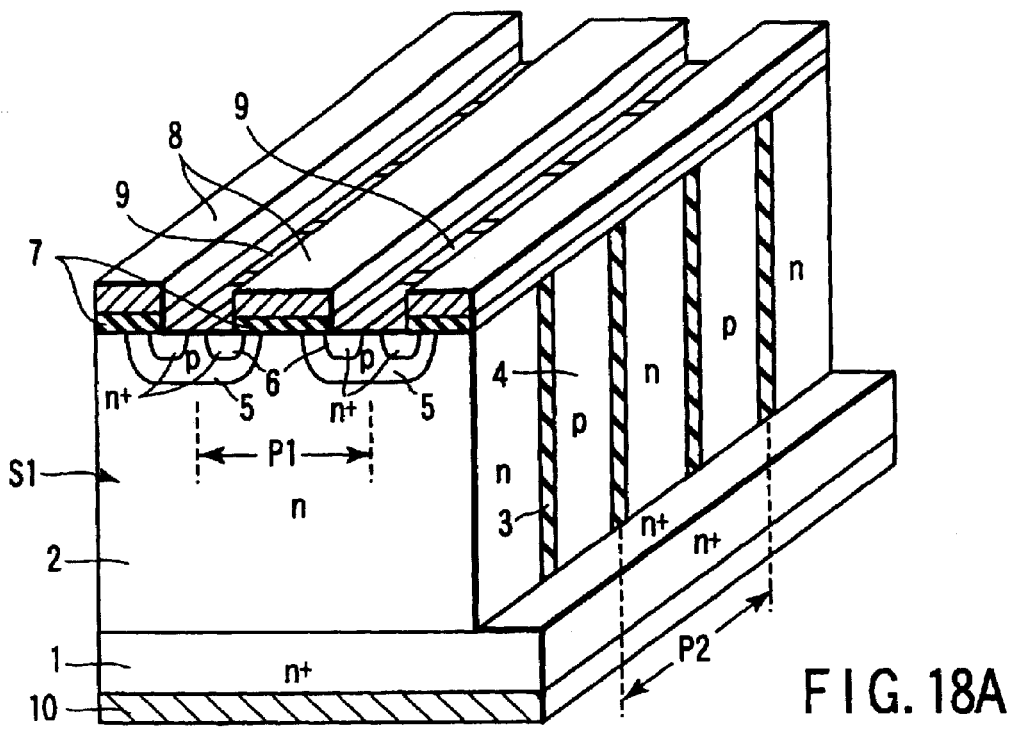
FIG. 18A and FIG. 18B are sectional perspective views showing a semiconductor device including a vertical power MOSFET according to a ninth embodiment of the present invention.
Figure 18B:
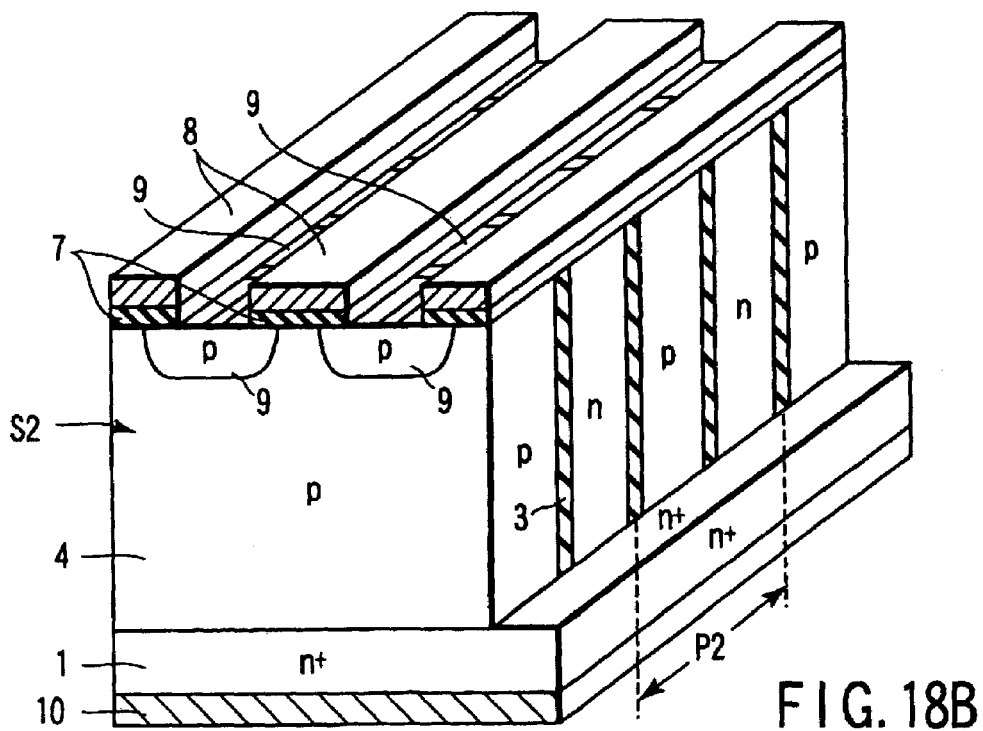

FIG. 18A and FIG. 18B are sectional perspective views showing a semiconductor device including a vertical power MOSFET according to a ninth embodiment of the present invention. FIG. 18A shows a section S1 of the n-type drift layer 2 vertical to the array direction of n-type drift layer 2, barrier insulating film 3 and p-type drift layer 4. FIG. 18B shows a section S2 of the p-type drift layer 4 vertical to the array direction described above.

The ninth embodiment differs from the first embodiment in the following point. The first p-type base layer 5 and the n-type source layer 6 are selectively formed in the section S1 of the n-type drift layer 2 vertical to the array direction of n-type drift layer 2, barrier insulating film 3 and p-type drift layer 4.

As a result, a repeated pitch P1 of the n-channel MOSFET structure (channel structure) on the element surface and a repeated pitch P2 of the drift layer (n-type drift layer 2/barrier insulating film 3/p-type drift layer 4) are independently set. A broken line showing the repeated pitch P1 represents the center of the first p-type base layer. On the other hand, a broken line showing the repeated pitch P2 represents the center of the barrier insulating film 3.

Namely, the repeated pitch P1 of the n-channel MOSFET structure can be set independently from the repeated pitch P2 of the drift layer.

Thus, the pillar structure repeated pitch P2 of the drift layer is set smaller than the repeated pitch P1 of the n-channel MOSFET structure. For example, even if the repeated pitch P1 is set to 20 µm, the repeated pitch P2 is set to 5 µm. According to the embodiment, the n-type drift layer 2 can be further readily micro-fabricated, and low on-resistance can be achieved.

(Tenth Embodiment)

Figure 19:
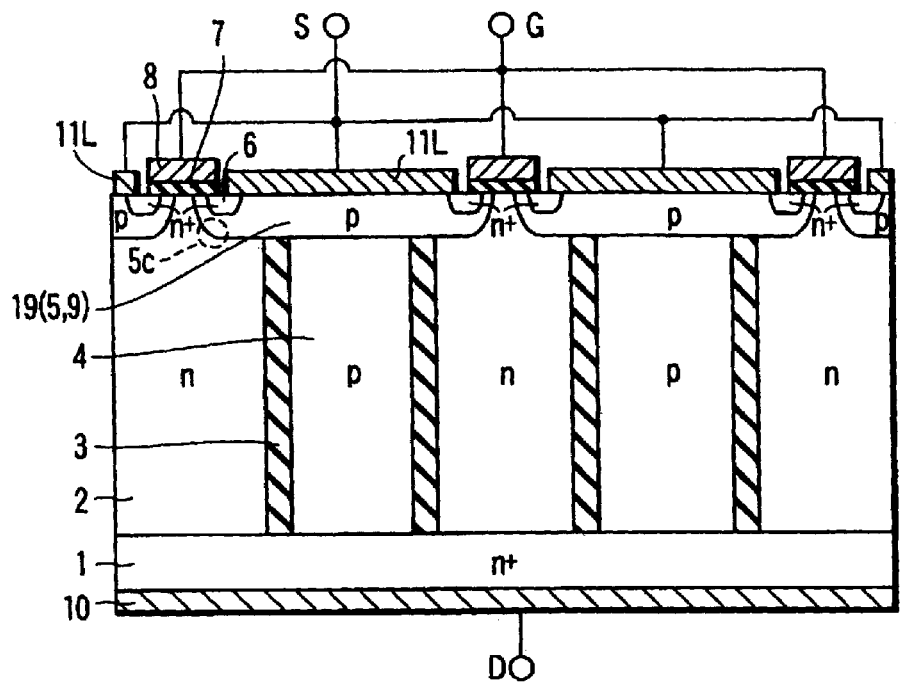
FIG. 19 is a cross-sectional view showing a semiconductor device including a vertical power MOSFET according to a tenth embodiment of the present invention.

FIG. 19 is a cross-sectional view showing a semiconductor device including a vertical power MOSFET according to a tenth embodiment of the present invention.

The tenth embodiment differs from the first embodiment in the following point. That is, the barrier insulating film 3 does not reach the surface of the element. First and second p-type base layers 5 and 9 are integrally formed on n-type drift layer 2, barrier insulating film 3 and p-type drift layer 4; therefore, these base layers are formed as one p-type base layer 19. One source electrode 11L is provided in common to these first and second p-type base layers 5 and 9.

By doing so, the effective area of the first p-type base layer 5 and the source electrode 11L is sufficiently taken; therefore, the element having large SOA (safe operating area) can be obtained. The reason will be described below.

The source and drain electrode 11L and 10 are connected to minus and plus terminals of the power supply, respectively. From a state that the power supply turns on, that is, a voltage more than the threshold voltage Vth is applied to the gate electrode 8, a voltage less than the threshold voltage Vth is applied thereto. Namely, in the transit time (turn-off time) from on state to off-state, a large electric field is locally applied to a corner portion 5c of the first p-type base layer 5. Impact ionization by the large electric field generates electron-hole pairs. The holes generated by the impact ionization are extracted outside the element through the first p-type base layer 5 and the source electrode 11.

In the embodiment, in fact, the holes are extracted outside the element through the p-type base layer 19 larger than the first p-type base layer 5 and the source electrode 11L larger than the source electrode 11. Thus, the resistance of hole extraction path, in particular, the contact resistance between p-type base layer and source electrode can be reduced. The resistance of hole discharge path is reduced, and thereby, voltage drop generated by hole current and the resistance of hole extraction path becomes small. Therefore, the turn-on of parasitic npn transistor can be prevented. As a result, the turn-off operation is prevented from failing, so that the element having large SOA (safe operating area) can be obtained.

(11th Embodiment)

Figure 20:
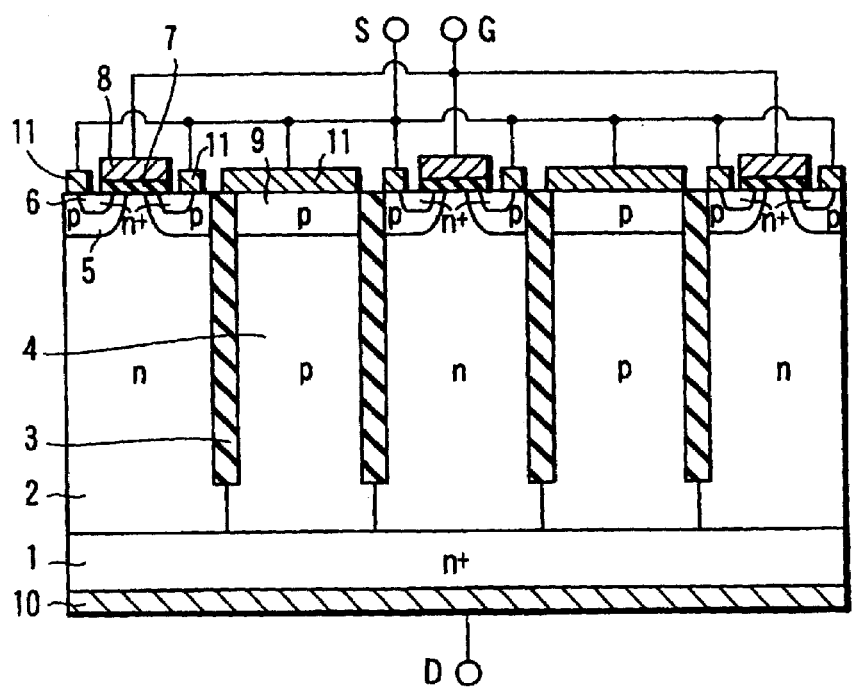
FIG. 20 is a cross-sectional view showing a semiconductor device including a vertical power MOSFET according to an 11th embodiment of the present invention.

FIG. 20 is a cross-sectional view showing a semiconductor device including a vertical power MOSFET according to an 11th embodiment of the present invention.

The 11th embodiment differs from the first embodiment in that no barrier insulating film 3 exists at the deep position of n-type and p-type drift layers 2 and 4. In other words, no barrier insulating film 3 exists near the surface of the n-type drain layer 1.

By doing so, in the manufacturing process, there is no need of forming the deep trench 14; therefore, manufacture is easy.

In the embodiment, n-type and p-type impurities are mutually diffused in n-type and p-type drift layers 2 and 4 near the surface of the n-type drain layer 1. Thus, each impurity concentration of n-type and p-type drift layers 2 and 4 near the n-type drain layer 1 reduces. Therefore, n-type and p-type drift layers 2 and 4 of the region having reduced impurity concentration function as if they are a buffer layer, so that ruggedness can be improved.

(12th Embodiment)

Figure 21:
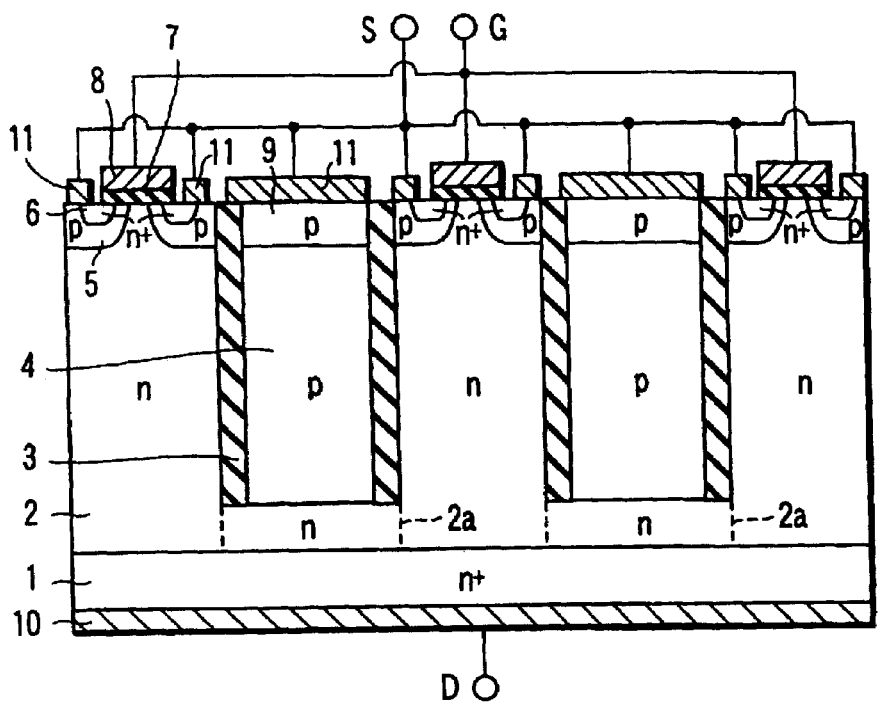
FIG. 21 is a cross-sectional view showing a semiconductor device including a vertical power MOSFET according to a 12th embodiment of the present invention.

FIG. 21 is a cross-sectional view showing a semiconductor device including a vertical power MOSFET according to a 12th embodiment of the present invention.

The 12th embodiment differs from the first embodiment in that an n-type drift layer 2a is interposed between the n-type drain layer 1 and the p-type drift layer 4.

Such a structure is obtained in the following manner. For example, as described in the fifth embodiment (see FIG. 13), the substrate previously formed with the n-type drift layer 2 is prepared. Thereafter, the barrier insulating film 3 and the p-type drift layer 4 are formed so as not to reach the surface of the n-type drain layer 1. When forming the barrier insulating film 3 and the p-type drift layer 4, which of the two may be previously formed in the process sequence.

When forming the p-type drift layer 4, for example, drive-in diffusion time of p-type impurity is controlled so that the p-type impurity can not be introduced into the surface of the n-type drain layer 1. In FIG. 21, the lower surfaces of the barrier insulating film 3 and the p-type drift layer 4 are flush with each other; however, they may be slightly shifted.

The p-type drift layer 4 and the n-type drift layer 2a directly contact with each other; therefore, counter dope occurs between them. Therefore, the impurity concentration of the n-type drift layer 2a becomes lower than that of the n-type drift layer 2. As a result, the n-type drift layer 2a functions as an n-type buffer layer of a built-in diode, so that reverse recovery characteristic of the built-in diode can be softened.

(13th Embodiment)

Figure 22:
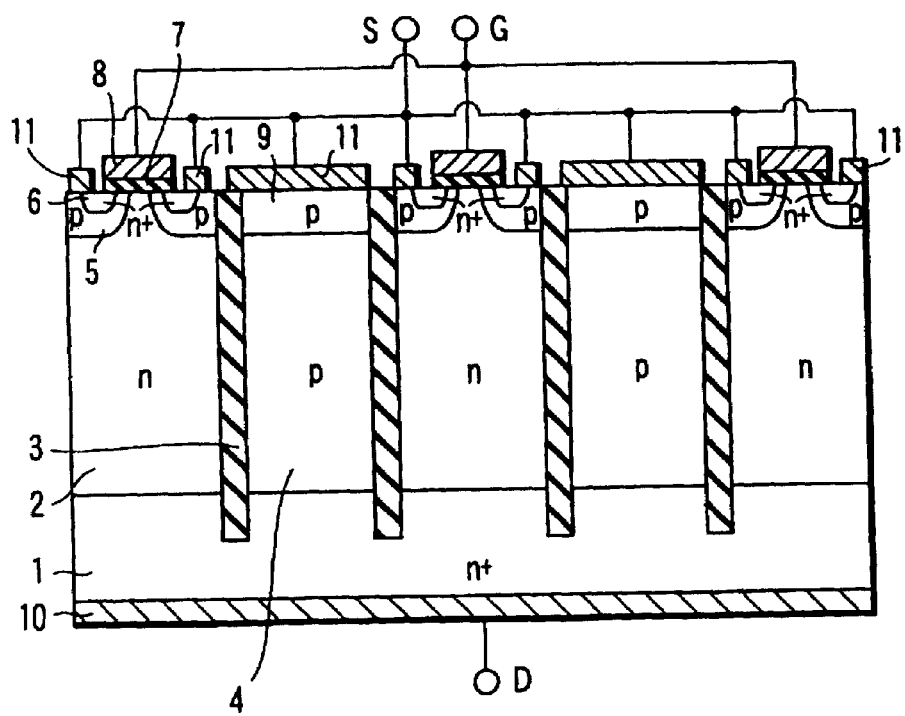
FIG. 22 is a cross-sectional view showing a semiconductor device including a vertical power MOSFET according to a 13th embodiment of the present invention.

FIG. 22 is a cross-sectional view showing a semiconductor device including a vertical power MOSFET according to a 13th embodiment of the present invention.

The 13th embodiment differs from the first embodiment in the following points. That is, the barrier insulating film 3 reach the midway depth of the n-type drain layer 1. In addition, the n-type impurity concentration of the n-type drain layer 1 on the n-type and p-type drift layers 2 and 4 side is lower than that of the same on the drain electrode 10 side.

Such a structure is obtained in the following manner. For example, in the structure shown in FIG. 9, FIG. 10, FIG. 13 or FIG. 14, the n-type impurity of the n-type drain layer 1 is driven and diffused in the element surface by heat treatment. The diffusion depth of the n-type drain layer 1 is deepened to include the lower portion of the barrier insulating film 3.

By doing so, it is possible to obtain the n-type drain layer 1, which is changed so that the n-type impurity concentration continuously becomes low toward the element surface. In other words, it is possible to obtain the n-type drain layer 1 having the same function (buffer layer effect) as the n-type drift layer 2a of FIG. 21.

As a result, ruggedness can be improved, and reverse recovery characteristic of the built-in diode can be softened, like the 12th embodiment.

(14th Embodiment)

Figure 23:
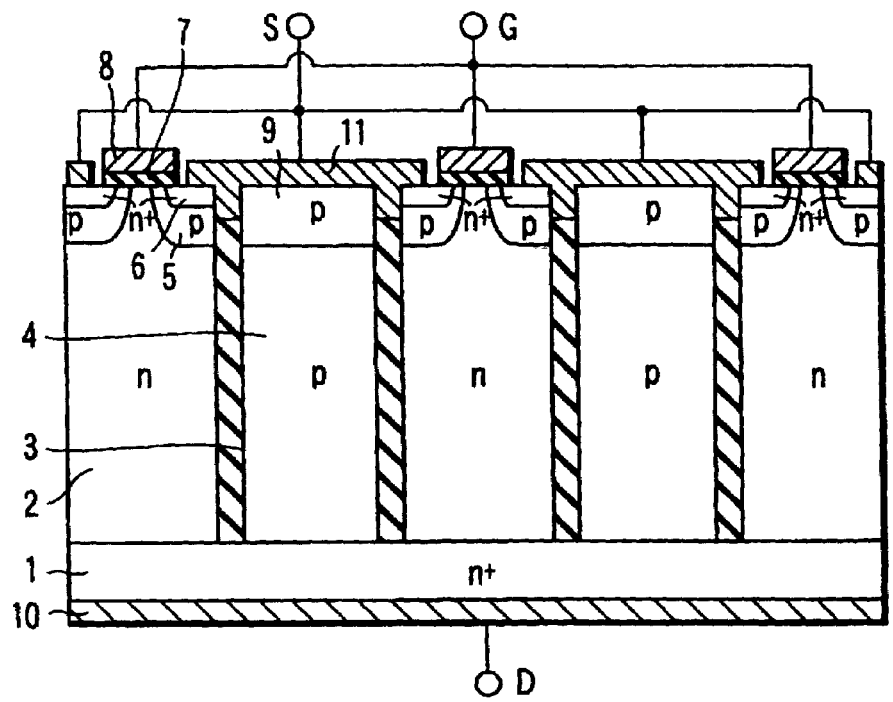
FIG. 23 is a cross-sectional view showing a semiconductor device including a vertical power MOSFET according to a 14th embodiment of the present invention.

FIG. 23 is a cross-sectional view showing a semiconductor device including a vertical power MOSFET according to a 14th embodiment of the present invention.

The 14th embodiment differs from the first embodiment in the following point. That is, the barrier insulating film 3 does not reach the element surface, and the source electrode 11 is buried near the element surface on the barrier insulating film 3.

By doing so, the source electrode 11 contacts with the surface and side of both the n-type source layer 6 and the first p-type base layer 5, so that contact resistance can be reduced between n-type source layer 6, first p-type base layer 5 and source electrode 11. Therefore, on-resistance is further reduced while ruggedness is improved.

(15th Embodiment)

Figure 24:
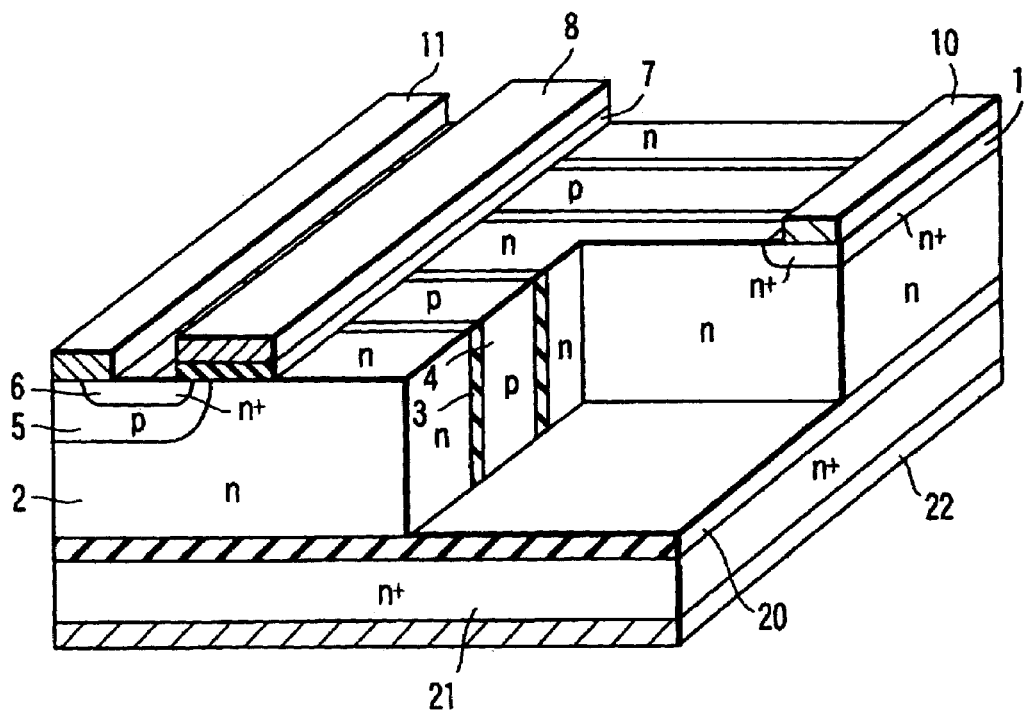
FIG. 24 is a cross-sectional view showing a semiconductor device including a lateral power MOSFET according to a 15th embodiment of the present invention.

FIG. 24 is a cross-sectional view showing a semiconductor device including a lateral power MOSFET according to a 15th embodiment of the present invention.

The 15th embodiment differs from the first embodiment in that a lateral power MOSFET is formed on a SOI (Silicon On Insulator) substrate.

In FIG. 24, a reference numeral 20 denotes an insulating film (e.g., $SiO_2$ film) of a SOI substrate, 21 denotes a base substrate of the SOI substrate, and 22 denotes a substrate electrode (usually connected to ground).

The n-type drift layer 2, barrier insulating film 3 and p-type drift layer 4 are formed on the insulating film 20, and n-channel MOSFET structure and various electrodes 10 and 11 are formed on the same main surface.

The SOI substrate is used, and thereby, on-resistance can be reduced in the lateral power MOSFET used for relatively small and medium breakdown voltage range (less than 600V).

(16th Embodiment)

Figure 25:
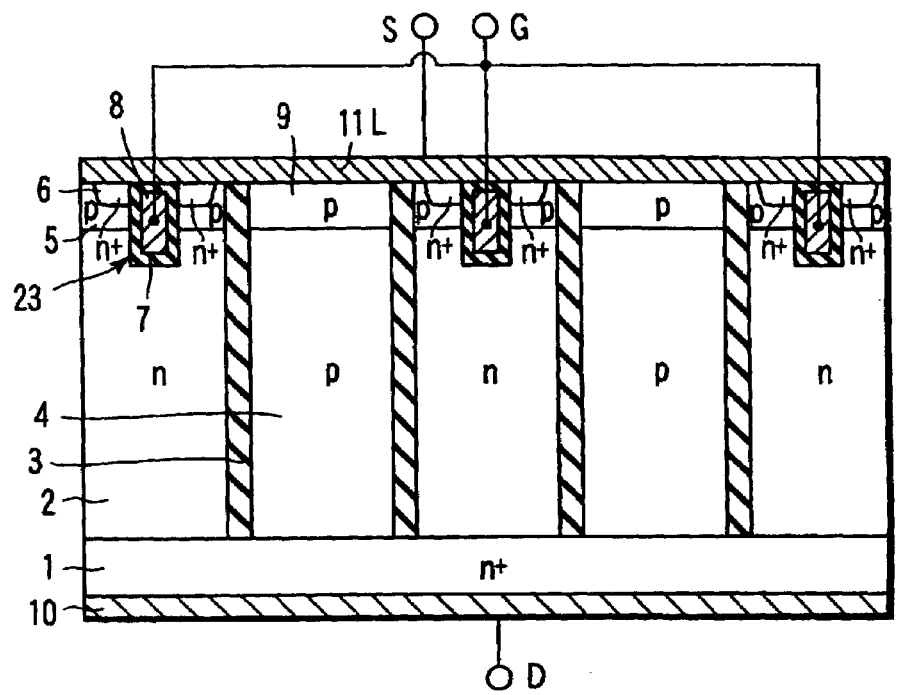
FIG. 25 is a cross-sectional view showing a semiconductor device including a vertical power MOSFET according to a 16th embodiment of the present invention.

FIG. 25 is a cross-sectional view showing a semiconductor device including a vertical power MOSFET according to a 16th embodiment of the present invention.

The 16th embodiment differs from the first embodiment in that a trench gate structure is used as the channel structure.

According to the trench gate structure, the gate electrode 8 is buried in a trench 23 via the gate insulating film 7. The trench 23 has the depth from the n-type source layer 6 to the n-type drift layer 2 through the first p-type base layer 5.

In the embodiment, when forming the trench 23, the first p-type base layer and the n-type source layer previously formed in the n-type drift layer 2 are divided so that the first p-type base layer 5 the n-type source layer 6 shown in FIG. 25 can be obtained.

The trench gate structure is employed, and thereby, the MOSFET (channel structure) is micro-fabricated; therefore, the width of the n-type drift layer 2 can be reduced. In addition, the channel length is readily reduced, so that on-resistance can be reduced.

(17th Embodiment)

Figure 26:
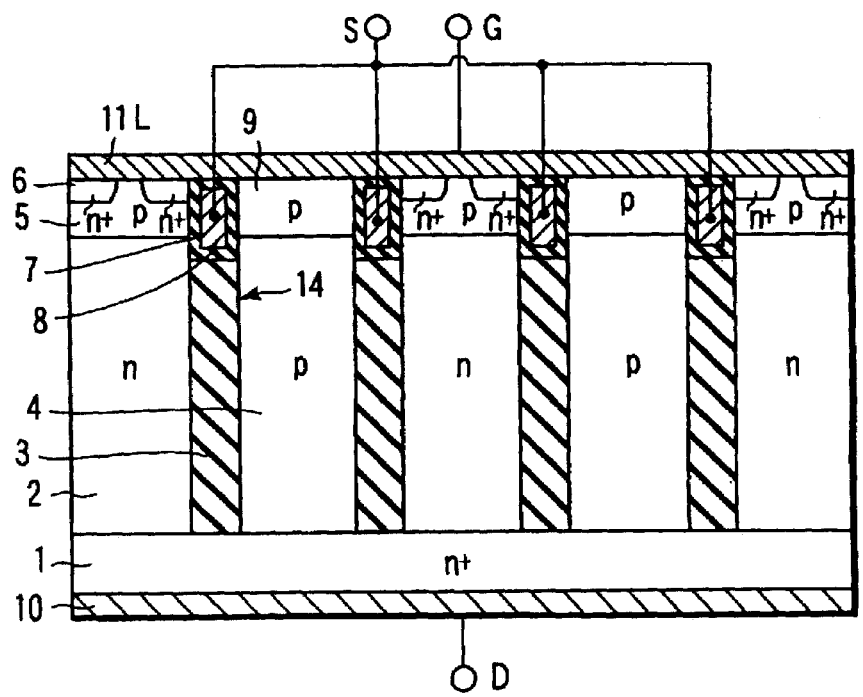
FIG. 26 is a cross-sectional view showing a semiconductor device including a vertical power MOSFET according to a 17th embodiment of the present invention.

FIG. 26 is a cross-sectional view showing a semiconductor device including a vertical power MOSFET according to a 17th embodiment of the present invention.

The 17th embodiment differs from the first embodiment in that the trench gate structure is provided in the trench in which the barrier insulating film is buried.

More specifically, the barrier insulating film 3 does not reach the element surface, and buried in the trench 14 under the first p-type base layer S. The gate electrode 8 is buried in the trench 14 above the barrier insulating film 3 via the gate insulating film 7.

The forming region of the barrier insulating film 3 is used to form the trench gate structure, and thereby, the width of the n-type drift layer 2 can be reduced, and in addition, on-resistance can be reduced.

(18th Embodiment)

Figure 27:
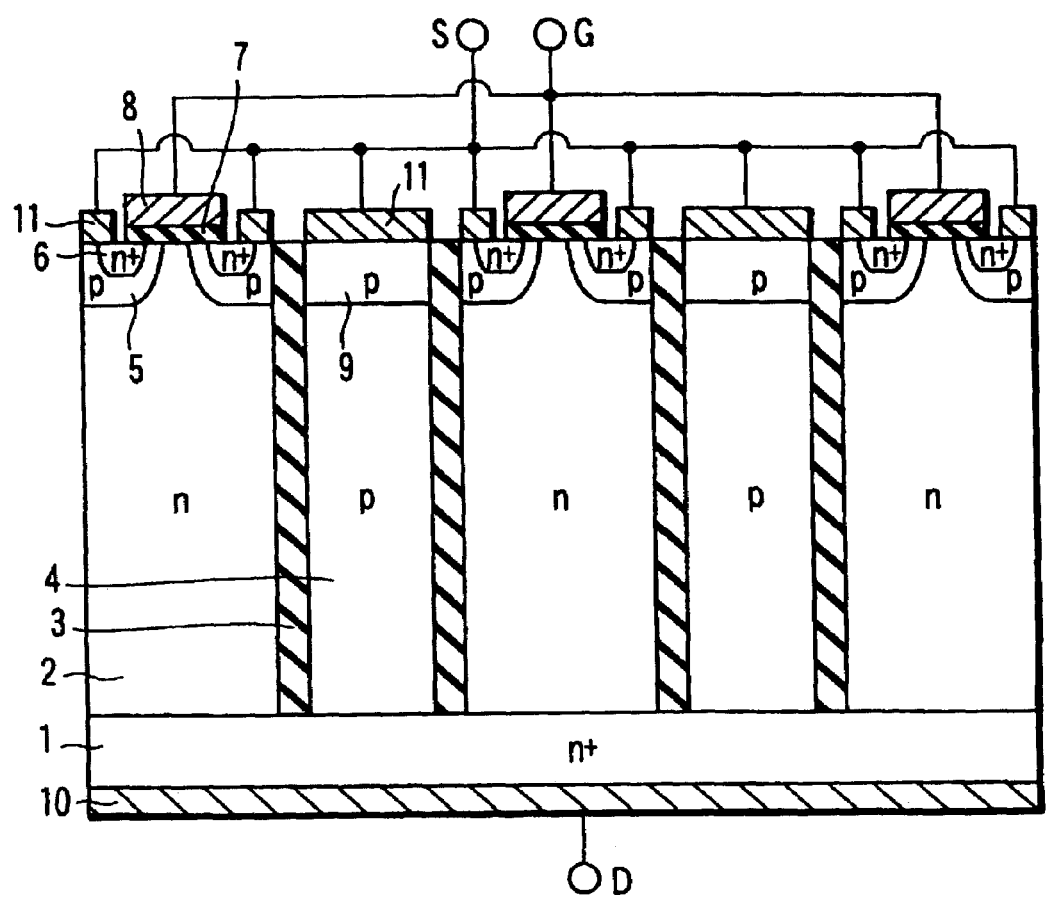
FIG. 27 is a cross-sectional view showing a semiconductor device including a vertical power MOSFET according to an 18th embodiment of the present invention.

FIG. 27 is a cross-sectional view showing a semiconductor device including a vertical power MOSFET according to an 18th embodiment of the present invention.

The 17th embodiment differs from the first embodiment in that the width of the p-type drift layer 4 is narrower than that of the n-type drift layer 2. For example, the width of the p-type drift layer 4 is half of the n-type drift layer 2, more specifically, 2.5 μm. By doing so, area efficiency is improved, and many elements are formed in the same size chip; therefore, low on-resistance can be achieved.

In embodiments other than the 17th embodiment, the width of n-type and p-type drift layers 2 and 4 is not uniformly determined, but may be arbitrarily set in accordance with each impurity concentration.

(19th Embodiment)

Figure 28:
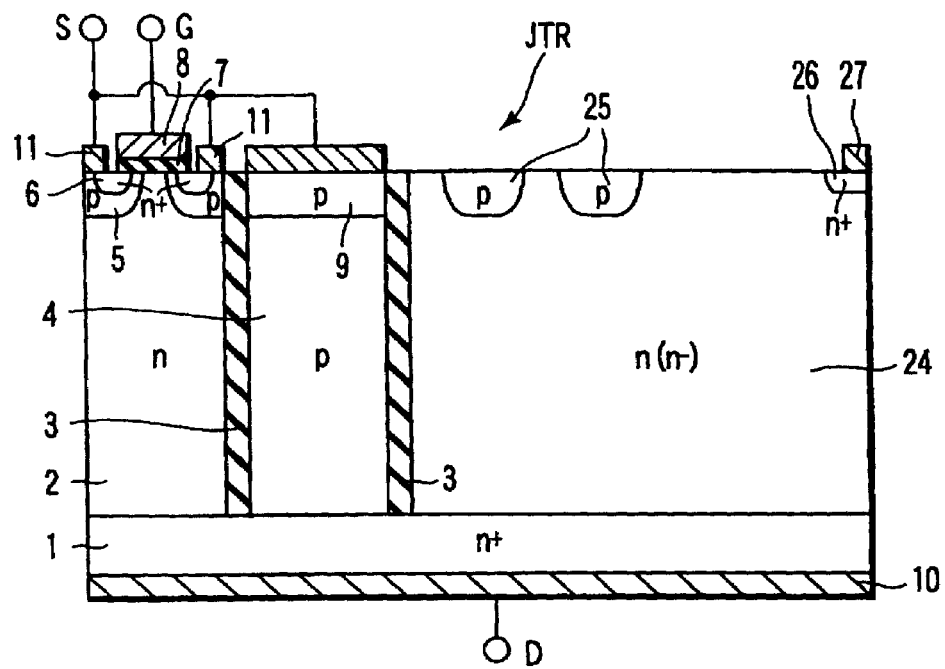
FIG. 28 is a cross-sectional view showing a semiconductor device including a vertical power MOSFET according to a 19th embodiment of the present invention.

FIG. 28 is a cross-sectional view showing a semiconductor device including a vertical power MOSFET according to a 19th embodiment of the present invention. In the 19th embodiment, the repeated structure (p-type drift layer/barrier insulating film 3/p-type drift layer 4) of a cell region is terminated at a couple of p-type drift layer 4 and barrier insulating film 3. The outer peripheral region is provided with a junction termination region JTR including junction termination structure and excluding the barrier insulating film 3.

The junction termination structure consists of the predetermined number (two in FIG. 28) of p-type guard ring layers 25, an n-channel stopper layer 26 having high impurity concentration, and an electrode 27 provided on the n-channel stopper layer 26. The p-type guard ring layers 25 are selectively formed on the surface of an n-type semiconductor layer 24 of the junction termination region JTR. The n-channel stopper layer 26 is selectively formed on the surface of the n-type semiconductor layer 24 outside the p-type guard ring layers 25.

The n-type semiconductor layer 24 functions as the n-type drift layer 2 if only p-type drift layer 4 is formed by impurity ion implantation, that is, if the layer 24 has the impurity concentration distribution shown in FIG. 13. Further, the n-type semiconductor layer 24 functions as the n-type base layer 17 having low impurity concentration if n-type and p-type drift layers 2 and 4 are formed by ion implantation, that is, if the layer 24 has the impurity concentration distribution shown in FIG. 14.

According to the embodiment, no barrier insulating film 3 is provided in the n-type semiconductor layer 24 of the junction termination region JTR; therefore, the depletion layer is easy to spread in the junction termination region JTR. The junction termination structure is formed in the n-type semiconductor layer 24 as usually, and thereby, it is possible to prevent the reduction of breakdown voltage around the element.

In this case, the n-type semiconductor layer 24 functions as the n-type base layer 17 (low concentration n-type semiconductor layer 24), and thereby, the depletion layer spreads wider. Therefore, high breakdown voltage can be stably obtained.

In the embodiment, the guard ring structure has shown as the surface structure of junction termination. However, the surface structure of junction termination is not limited to above; for example, the RESURF structure and field plate structure may be employed.

In FIG. 28, there is shown the power MOSFET as the power semiconductor element of the cell region. In this case, the following power semiconductor elements may be used. More specifically, power MOSFETs of second to 18th embodiments may be used. Further, a power semiconductor element having p-type drift layer/barrier insulating film 3/p-type drift layer 4 other than those, for example, a power semiconductor element described after the 21st embodiment may be used.

(20th Embodiment)

Figure 29:
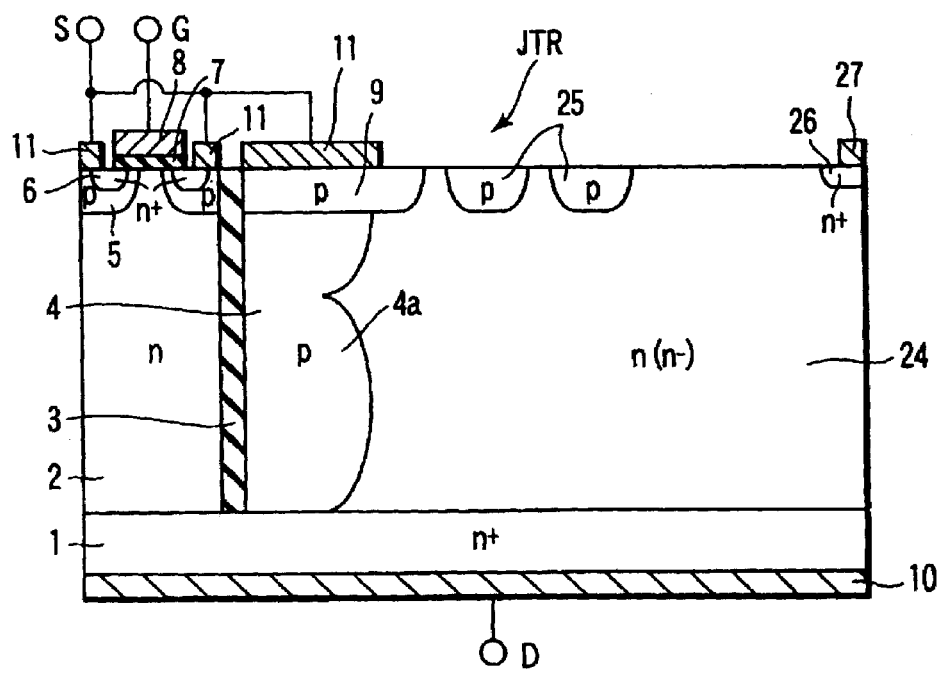
FIG. 29 is a cross-sectional view showing a semiconductor device including a vertical power MOSFET according to a 20th embodiment of the present invention.

FIG. 29 is a cross-sectional view showing a semiconductor device including a vertical power MOSFET according to a 20th embodiment of the present invention. In the 20th embodiment, the repeated structure (p-type drift layer/barrier insulating film 3/p-type drift layer 4) of a cell region is terminated at a couple of n-type drift layer 4 and barrier insulating film 3. The outer peripheral region of the n-type drift layer 4 and barrier insulating film 3 is provided with a junction termination region JTR including junction termination structure and excluding the barrier insulating film 3.

One p-type drift layer 4a adjacent to the barrier insulating film 3 is formed in the junction termination region JTR. The p-type drift layer 4a is formed by drive-in diffusion of the p-type impurity introduced on the surface of the n-type semiconductor layer 24 and the surface of the predetermined depth. That is, the p-type drift layer 4a has the impurity concentration distribution shown in FIG. 14. The n-type semiconductor layer 24 functions as the n-type base layer 17 if it has the impurity concentration distribution described above.

In FIG. 29, only one p-type drift layer 4a is shown; however, a plurality of p-type drift layers 4a may be formed in the n-type semiconductor layer 24. The surface of the n-type semiconductor layer 24 is selectively formed with the p-type guard ring layer 25 and the n-channel stopper layer 26, like FIG. 28. The electrode 27 is provided on the n-channel stopper layer 26.

According to the embodiment, it is possible to prevent the reduction of breakdown voltage around the element, like the 19th embodiment. Various modifications are possible in the junction termination structure and the power semiconductor element, like the 19th embodiment. Various modifications are possible in the impurity concentration distribution of the p-type drift layer 4a.

(21st Embodiment)

Figure 30:
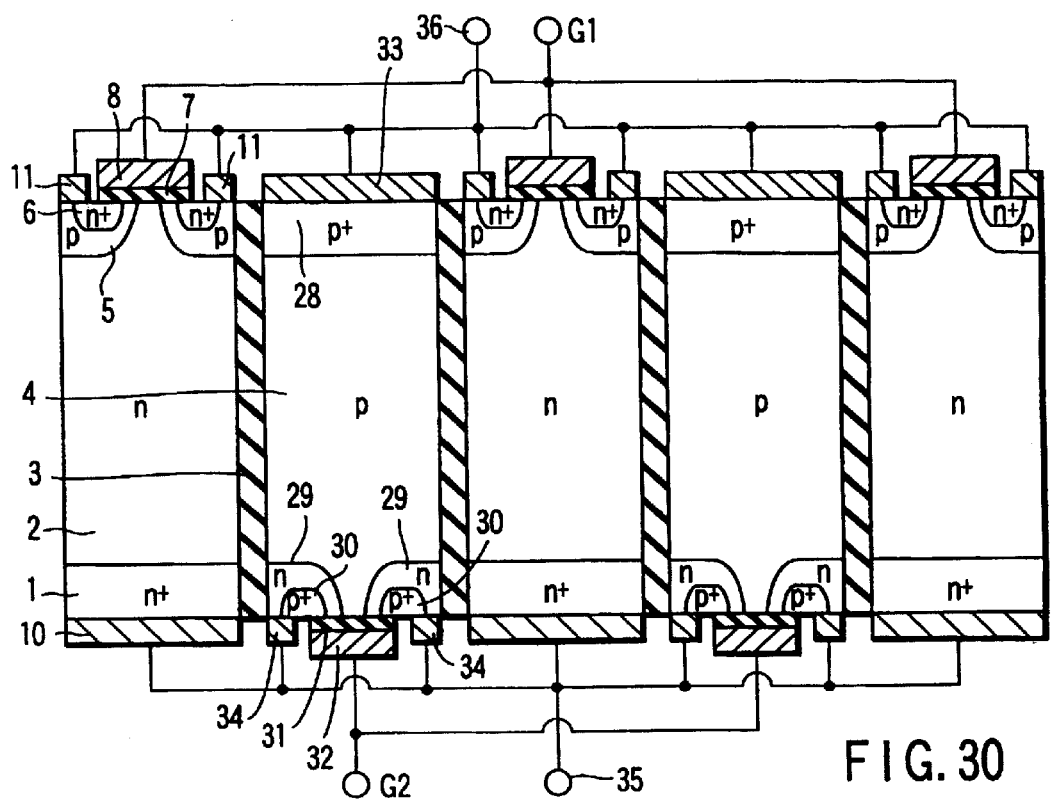
FIG. 30 is a cross-sectional view showing a semiconductor device including a vertical power MOSFET according to a 21st embodiment of the present invention.

FIG. 30 is a cross-sectional view showing a semiconductor device including a vertical power MOSFET according to a 21st embodiment of the present invention.

The 21st embodiment differs from the first embodiment in that a vertical power MOSFET (p-channel) is formed in the p-type drift layer 4.

The power MOSFET formed in the p-type drift layer 4 has the structure in which the conduction type of each layer of the power MOSFET formed in the n-type drift layer 2 is reverse, and each layer is formed upside down. The following is a description on the power MOSFET formed in the p-type drift layer 4.

The surface of the p-type drift layer 4 is provided with a p-type drain layer 28 having high impurity concentration. On the other hand, the surface of the p-type drain layer 28 is selectively provided with an n-type base layer 29. The surface of the n-type base layer 29 is selectively provided with a p-type source layer 30.

A second gate electrode 32 is provided on the n-type base layer 29 between the p-type source layer 30 and the p-type drift layer 4 via a second gate insulating film 31.

A p-channel MOSFET for hole injection is composed of these p-type source layer 30, n-type base layer 29, p-type drift layer 4, second gate insulating film 31 and second gate electrode 32. The p-channel MOSFET uses the surface of the n-type base layer 29 under the second gate electrode 32 as a channel region.

A second drain electrode 33 is provided on the p-type drain layer 28, and a second source electrode 34 is provided on the n-type base layer 29 and p-type source layer 30. The first drain electrode 10 and the second source electrode 34 are electrically connected to make connection with a first terminal 35. The first source electrode 11 and the second drain electrode 33 are electrically connected to make connection with a second terminal 36.

Figure 31:
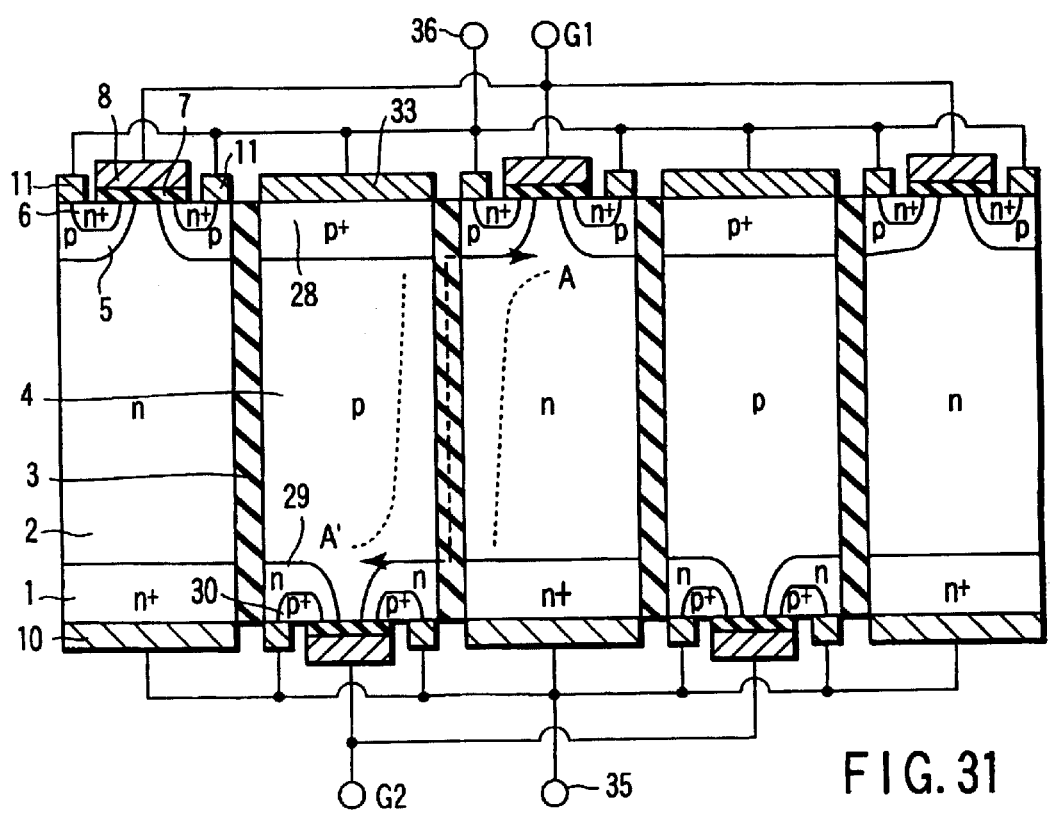
FIG. 31 is a cross-sectional view to explain the reason why high breakdown voltage is obtained in the power MOSFET of the 21st embodiment.
Figure 32:
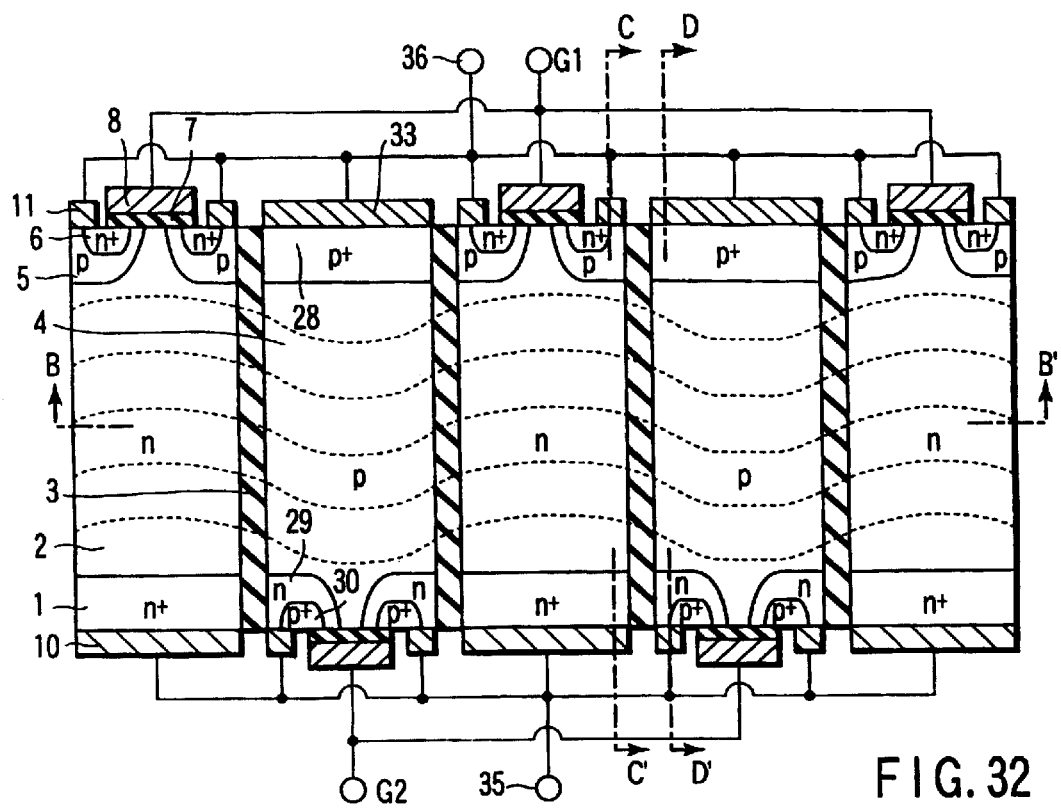
FIG. 32 is a view showing a potential distribution (equipotential line) in an off-state (blocking state) of the power MOSFET of the 21st embodiment.

FIG. 31 and FIG. 32 are views equivalent to FIG. 2 and FIG. 3 of the first embodiment, respectively. In the embodiment (21st embodiment), the breakdown voltage can be improved based on the same effect as the first embodiment. Further, in the embodiment, the reduction of on-resistance can be achieved based on the same effect as the first embodiment.

Figure 33:
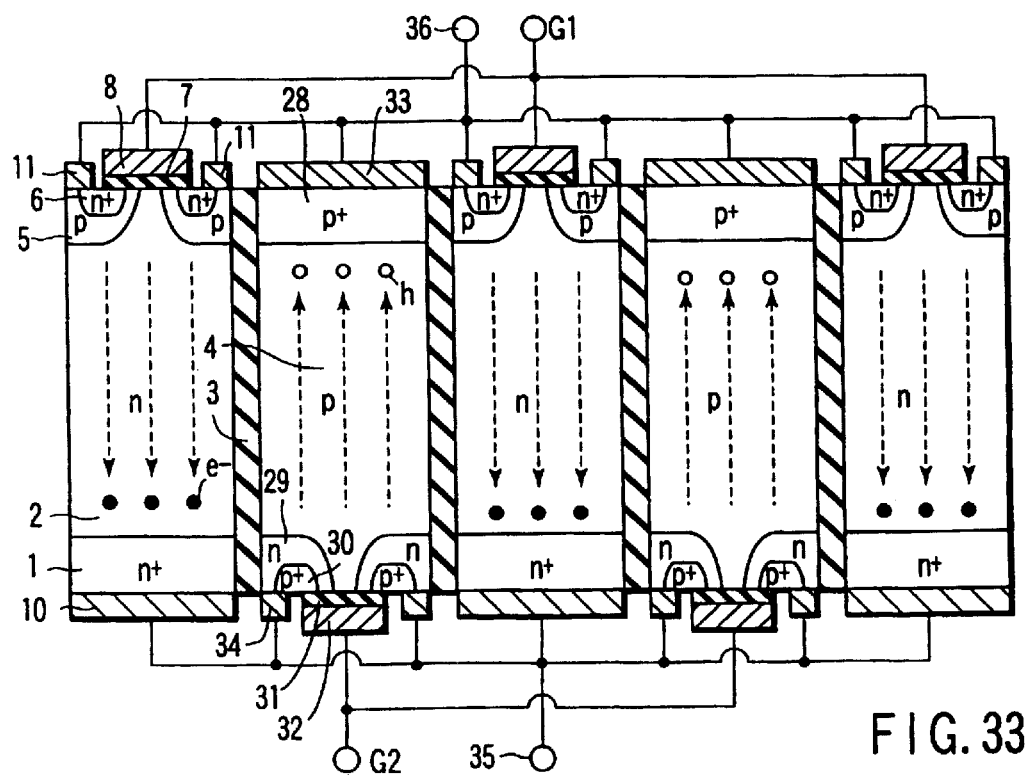
FIG. 33 is a view showing the flow of carriers (electrons, holes) in an on-state (conducting state) of the power MOSFET of the 21st embodiment.

In the embodiment, as shown in FIG. 33, in the on state (conducting state), carriers (holes h) flows through the p-channel power MOSFET formed in the p-type drift layer 4, so that the reduction of on-resistance can be achieved.

Figure 34:
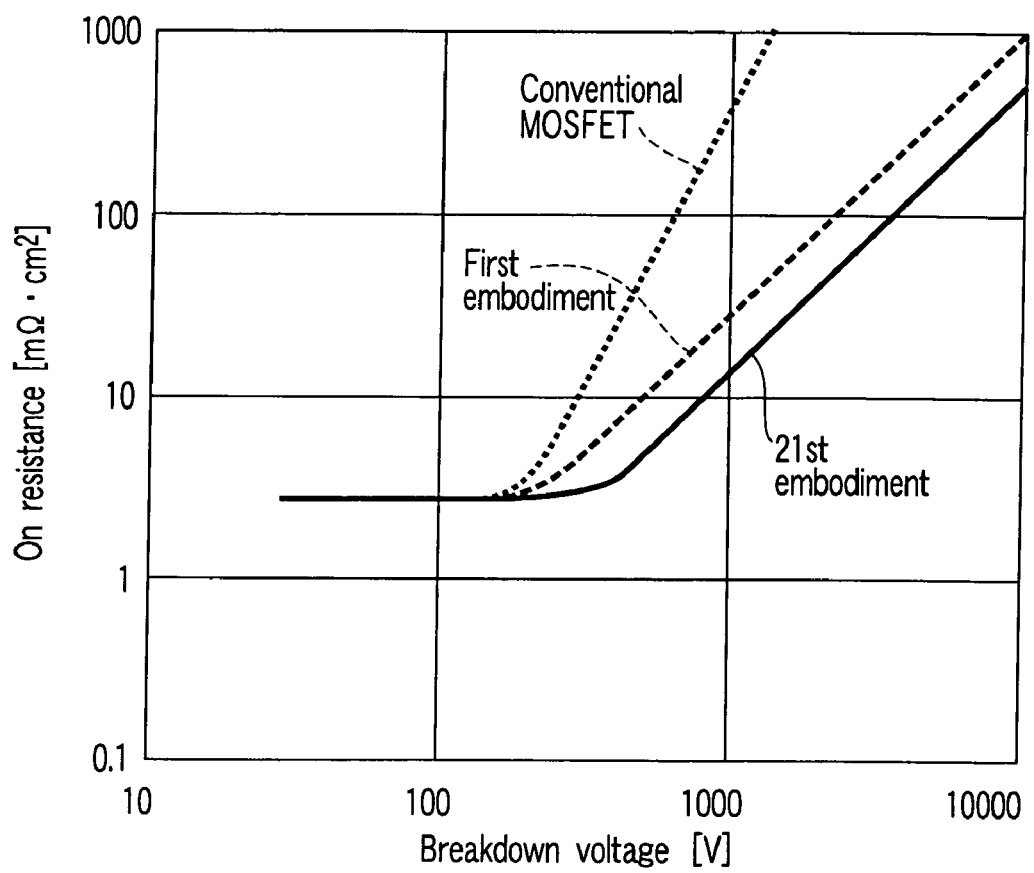
FIG. 34 is a characteristic diagram showing the relationship between breakdown voltage and on-resistance in the power MOSFET of the 21st embodiment and a conventional MOSFET.

FIG. 34 is a characteristic diagram showing the relationship between breakdown voltage and on-resistance in the power MOSFET of the 21st embodiment and the conventional MOSFET (FIG. 62). The element material is Si.

As seen from FIG. 34, in the power MOSFET of the embodiment, low on-resistance effect is obtained in the high breakdown voltage range where the breakdown voltage is 200V or more, as compared with the conventional MOSFET. In addition, it can be seen that the low on-resistance effect is higher than the power MOSFET of the first embodiment. This is because the embodiment includes the element structure combining n-channel and p-channel power MOSFETs; therefore, on-resistance is further reduced.

In the element structure of the embodiment, the barrier insulating film 3 is interposed between the n-type drift layer 2 formed with the n-channel MOSFET and the p-type drift layer 4 formed with the p-channel MOSFET.

Thus, electrons are prevented from being diffused from the n-type drift layer 2 to the p-type drift layer 4 while holes are prevented from being diffused from the p-type drift layer 4 to the n-type drift layer 2. Therefore, the shift from MOSFET operation to bipolar operation is prevented, so that high-speed operation of MOSFET can be kept.

One example of the method of manufacturing the power MOSFET of the 21st embodiment will be described with reference to FIG. 35A to FIG. 35G.

Figure 35A:
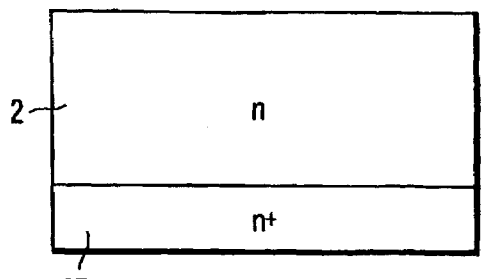
FIG. 35A to FIG. 35G are cross-sectional views showing the process of manufacturing the power MOSFET of the 21st embodiment.

As shown in FIG. 35A, a substrate having the n-type drift layer 2 formed on a base substrate 27 is prepared. The base substrate 37 is an n-type semiconductor layer having high impurity concentration, and the n-type drift layer 2 epitaxially grows on the n-type semiconductor layer.

Figure 35B:
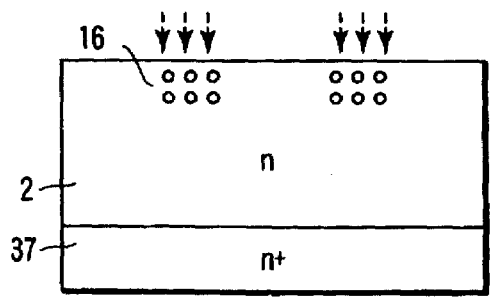

As depicted in FIG. 35B, a p-type impurity 16 such as boron is selectively implanted to the surface of the region used as the p-type drift layer of the n-type drift layer 2, using a mask (not shown). Thereafter, anneal for activating the p-type impurity 16 is carried out.

Figure 35C:
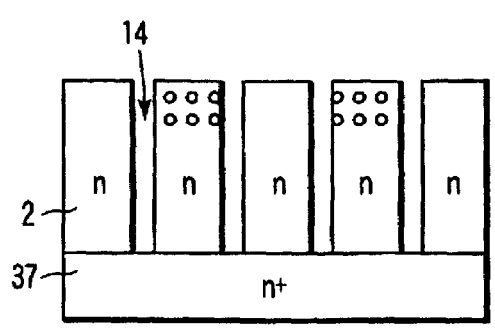

As illustrated in FIG. 35C, a plurality of trenches 14 reaching the base substrate 37 is selectively formed in the n-type drift layer 2. The trench 14 is formed in a region between the region where the p-type impurity 16 is implanted and the region where no p-type impurity 16 is implanted. Namely, the trench 14 is formed in a region where the barrier insulating film 3 is buried.

Figure 35D:
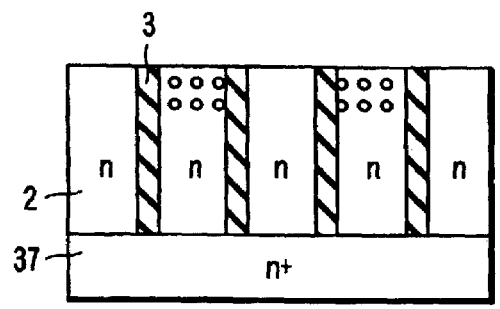
Figure 35E:
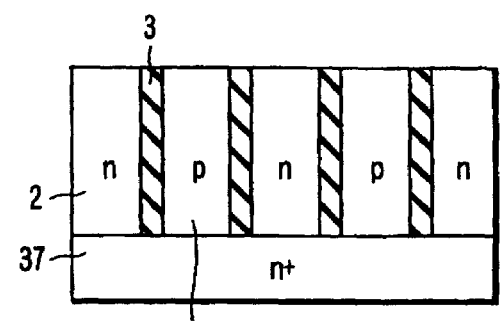

As seen from FIG. 35D, the barrier insulating film 3 is buried in the trench 14.

The p-type impurity 16 introduced to the surface of the n-type drift layer 2 is drive-in-diffused by heat treatment, and the p-type drift layer 4 can be formed as shown in FIG. 34E. As a result, it is possible to obtain a drift layer having the following pillar structure. That is, the pillar structure is formed in a manner that n-type drift layer 2, barrier insulating film 3 and p-type drift layer 4 are repeatedly arrayed.

Figure 35F:
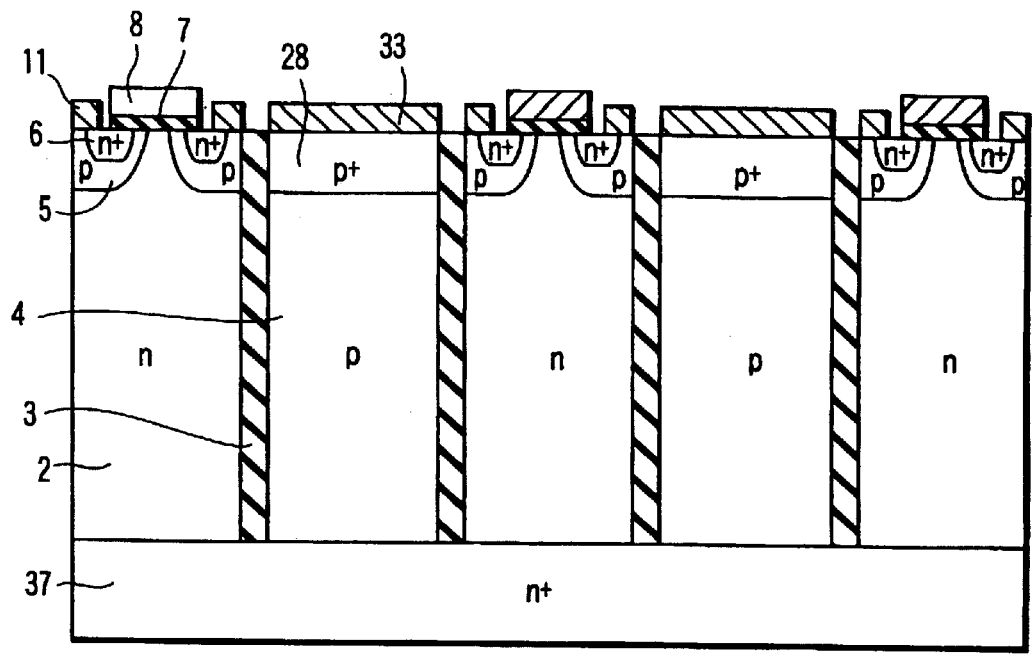

As shown in FIG. 35F, the surface of the drift layer is formed with first p-type base layer 5, n-type source layer 6, gate insulating film 7, gate electrode 8 and source electrode 11 of the n-channel power MOSFET. Further, the surface of the drift layer is formed with p-type drain layer 28 and drain electrode 33 of the p-channel power MOSFET.

The source and drain electrodes 11 and 33 are simultaneously formed in the manner that the same conductive film (e.g., Al film) is processed by photolithography and etching. The p-type drain layer 28 is formed by ion-implanting the p-type impurity to the surface of the p-type drift layer 4, and carrying out activation anneal. In the process, the element structure formed in the next process of FIG. 35G may be formed, and the element structure formed in this process may be formed in the next process of FIG. 35G.

Figure 35G:
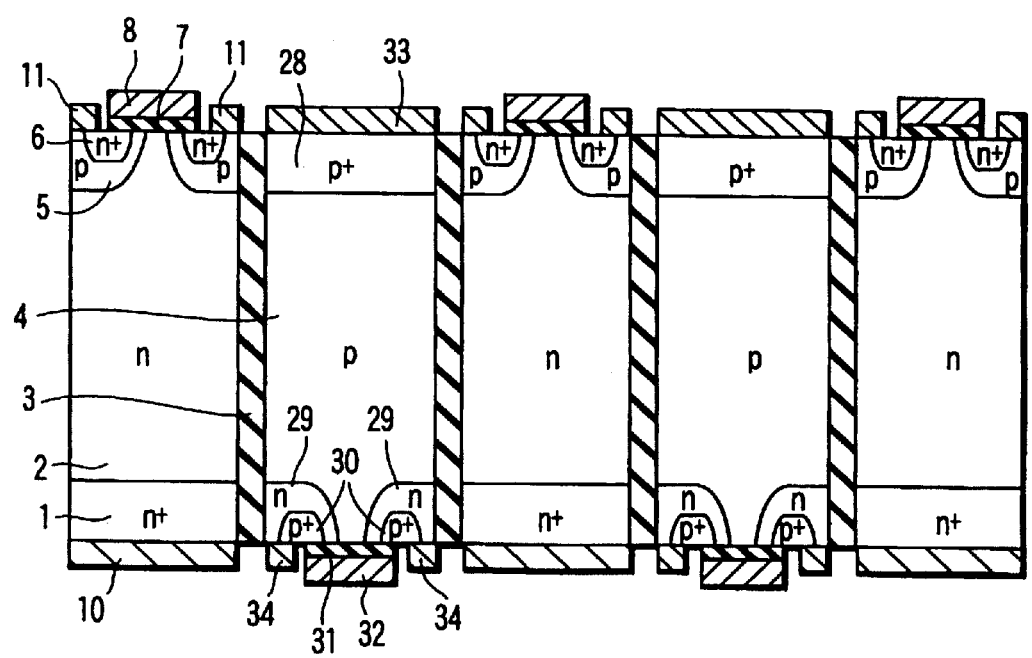

As illustrated in FIG. 35G, the base substrate 37 is removed by polishing or etching. Thereafter, the backside of the drift layer is formed with n-type drain layer 1 and drain electrode 10 composing of the n-channel power MOSFET. Further, the backside of the drift layer is formed with n-type base layer 29, p-type source layer 30, gate insulating film 31, gate electrode 32 and source electrode 34, which are composing of the p-channel power MOSFET.

The source and drain electrodes 34 and 10 are simultaneously formed in the manner that the same conductive film (e.g., Al film) is processed by photolithography and etching. The n-type drain layer 1 is formed by ion-implanting the p-type impurity to the surface of the n-type drift layer 2, and carrying out activation anneal.

The process described above is carried out, and thereby, each width of n-type and p-type drift layers 2 and 4 is readily fined by simple process. In addition, each impurity concentration of n-type and p-type drift layers 2 and 4 is improved; therefore, a power MOSFET having low on-resistance can be realized.

The embodiment has described the process of implanting only p-type impurity as the method of forming n-type and p-type drift layers 2 and 4. The present invention is not limited to above. For example, the process may be used using ion implantation of p-type and n-type impurities described in FIG. 12A to FIG. 12E. In this case, a substrate having n-type base layer formed on the base substrate 37 is prepared.

For example, as described in FIG. 11A to FIG. 11E, the trench 14 and the barrier insulating film 3 are formed, and thereafter, ion implantation of impurity may be carried out. In this case, the process using ion implantation of only p-type impurity or p-type and n-type impurities is possible.

For example, as described in FIG. 15A to FIG. 15E, ion implantation process and epitaxial growth process may be repeated predetermined times.

In the embodiment, the planer gate structure may be employed as the channel structure; however, the present invention is not limited to above. The trench gate structure described in FIG. 25 may be employed.

(22nd Embodiment)

Figure 36A:
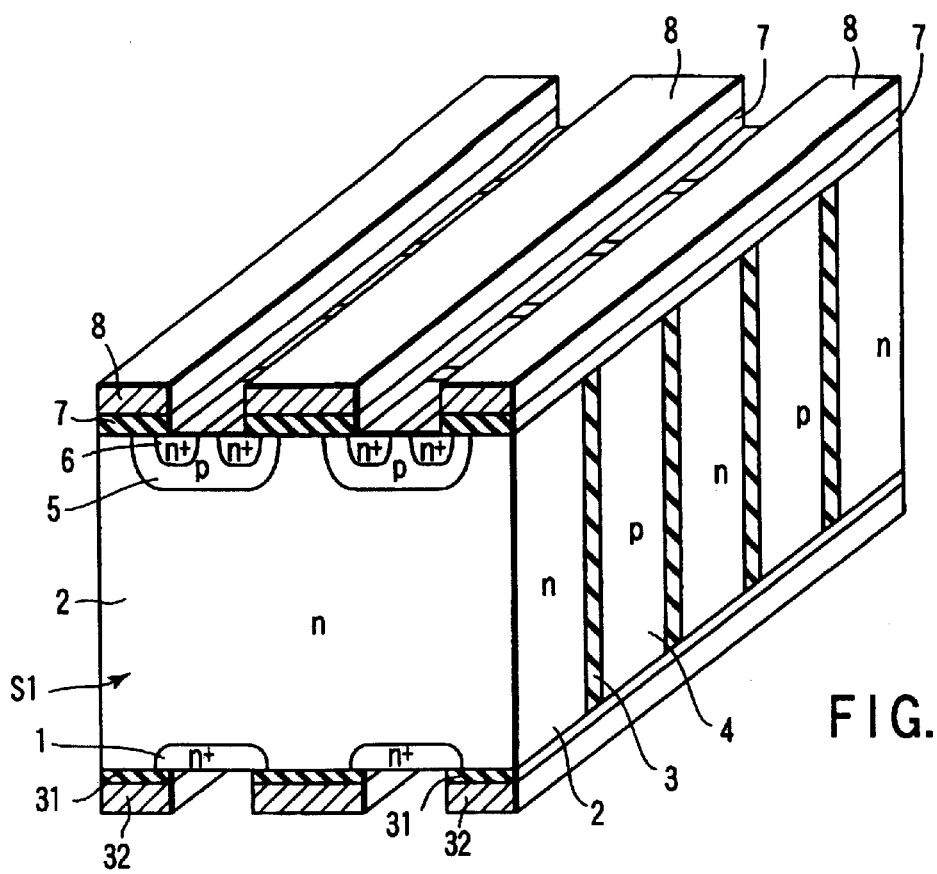
FIG. 36A and FIG. 36B are sectional perspective views showing a semiconductor device including a vertical power MOSFET according to a 22nd embodiment of the present invention.
Figure 36B:
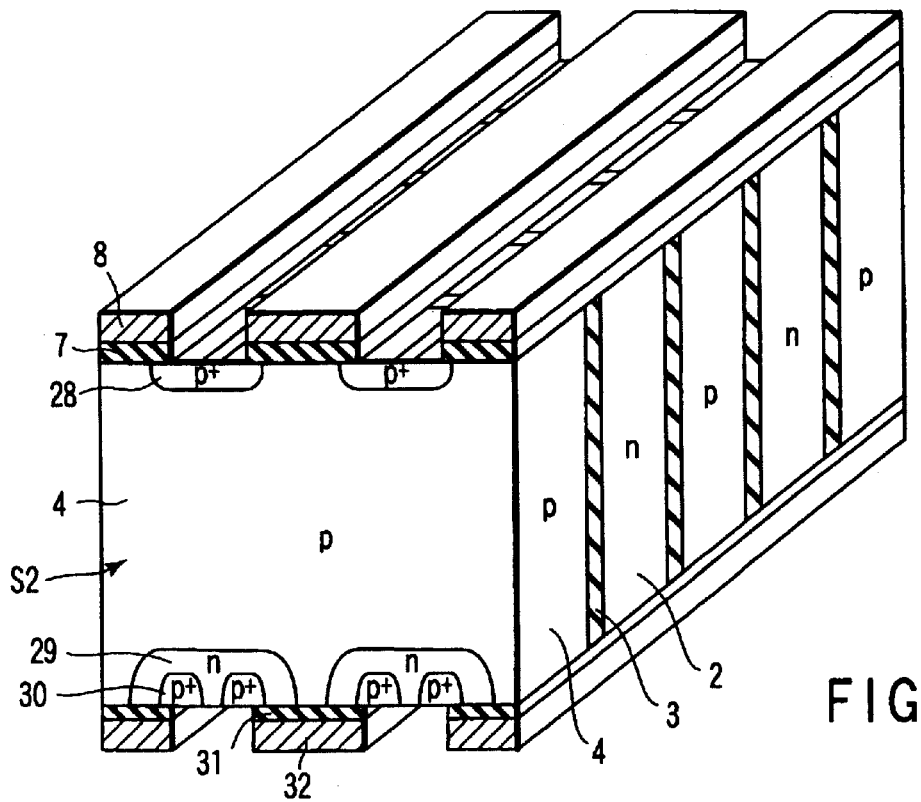

FIG. 36A and FIG. 36B are sectional perspective views showing a semiconductor device including a vertical power MOSFET according to a 22nd embodiment of the present invention. In FIG. 36A, there is shown a section S1 of the n-type drift layer 2 vertical to the array direction of n-type drift layer 2, barrier insulating film 3 and p-type drift layer 4. In FIG. 36B, there is shown a section S2 of the p-type drift layer 4 vertical to the array direction described above.

The 22nd embodiment differs from the 21st embodiment in the following points. That is, the first p-type base layer 5 and n-type source layer 6 of the n-channel power MOSFET are selectively formed in the section S1 of the n-type drift layer 2. In addition, the n-type base layer 29 and p-type source layer 30 of the p-channel power MOSFET are selectively formed in the section S2 of the p-type drift layer 4.

As a result, the following repeated pitches are set independently from each other. One is the repeated pitch of the n-channel power MOSFET (channel structure). Another is the repeated pitch of the pillar structure of the drift layer (n-type drift layer 2/barrier insulating film 3/p-type drift layer 4). Another is the repeated pitch of the p-channel power MOSFET (channel structure).

Namely, each repeated pitch of the n-channel and p-channel MOSFET structures is independently set with respect to the repeated pitch of the pillar structure of the drift layer.

By doing so, each repeated pitch of the n-channel and p-channel MOSFET structures is set smaller than that of the pillar structure. For example, even if each repeated pitch of the n-channel and p-channel MOSFET structures is set to 20 µm, the repeated pitch of the pillar structure can be set to 5 µm. According to the embodiment, n-type and p-type drift layers 2 and 4 can be readily made fine, and low on-resistance can be achieved.

(23rd Embodiment)

Figure 37A:
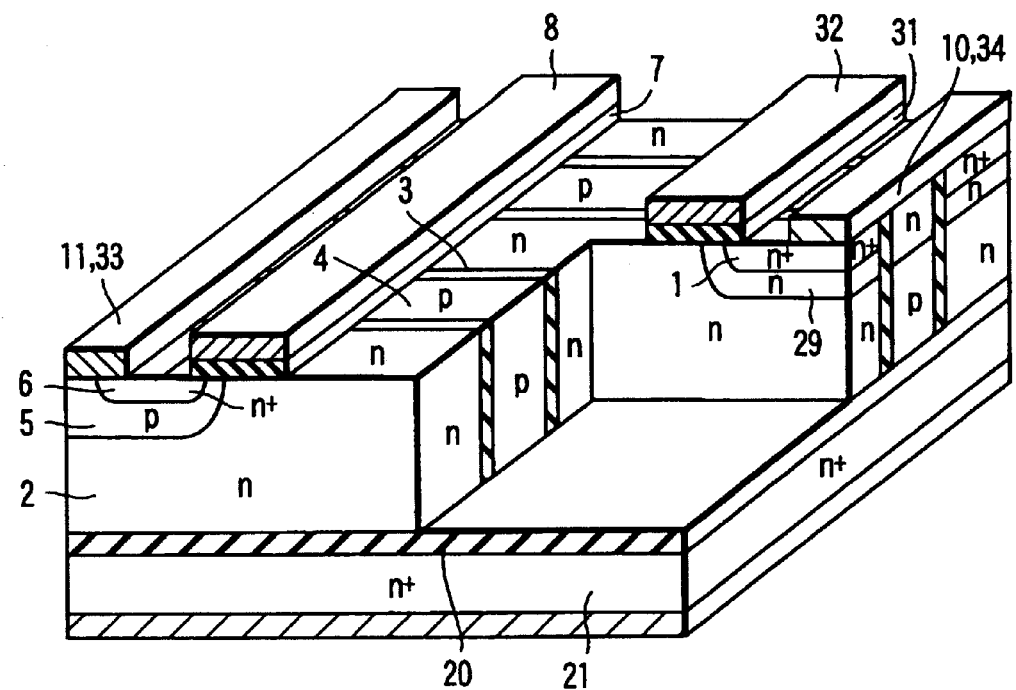
FIG. 37A and FIG. 37B are sectional perspective views showing a semiconductor device including a lateral power MOSFET according to a 23rd embodiment of the present invention.
Figure 37B:
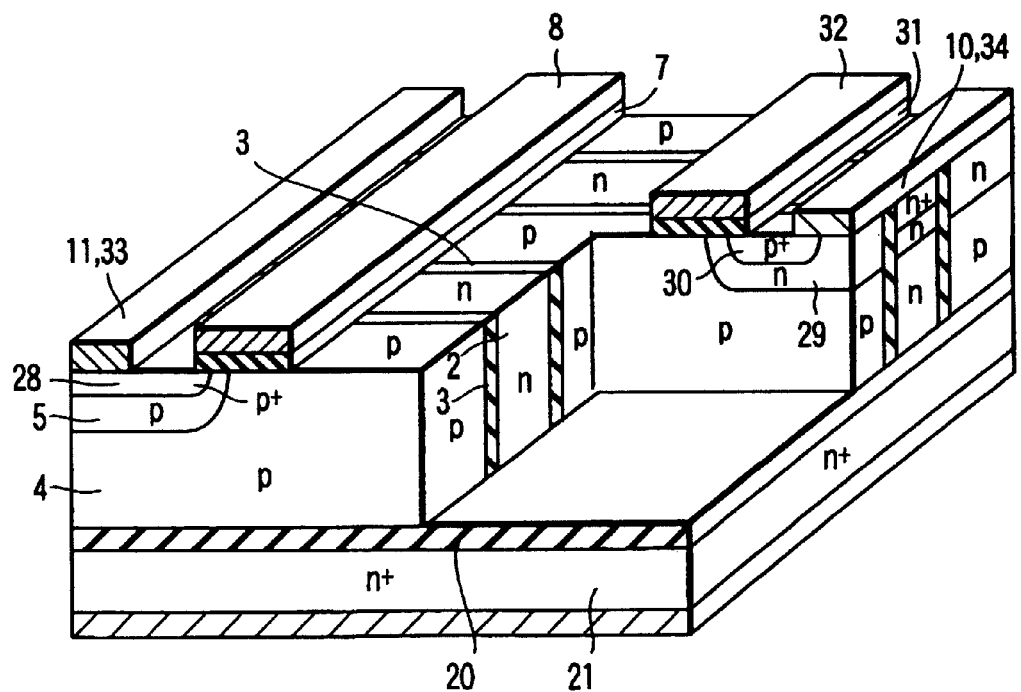

FIG. 37A and FIG. 37B are sectional perspective views showing a semiconductor device including a lateral power MOSFET according to a 23rd embodiment of the present invention. In FIG. 37A, there is shown a section of the n-type drift layer 2 vertical to the array direction of n-type drift layer 2, barrier insulating film 3 and p-type drift layer 4. In FIG. 37B, there is shown a section of the p-type drift layer 4 vertical to the array direction described above.

The 23rd embodiment differs from the 21st embodiment in that lateral n- and p-channel power MOSFETs are formed on the SOI substrate.

An insulating film 20 is formed with n-type drift layer 2, barrier insulating film 3 and p-type drift layer 4. The same main surface is formed with n- and p-channel power MOSFETs and various electrodes 10, 11, 33 and 34.

According to the embodiment, the SOI substrate is used, and thereby, low on-resistance can be achieved in the lateral MOSFET used in the relatively small and medium range (600V or less).

(24th Embodiment)

FIG. 38 is a sectional perspective views showing a semiconductor device including a vertical power MOSFET according to a 24th embodiment of the present invention.

The 24th embodiment differs from the first embodiment in that a built-in diode using the p-type drift layer is included.

An n-type buffer layer 38 having low impurity concentration (high resistance) is interposed between the p-type drift layer 4 and the n-type drain layer 1. The barrier insulating film 3 reaches the n-type drain layer 1. As a result, the n-type drain layer 1 under the n-type drift layer 2 does not directly contact with that under the p-type drift layer 4. The pin structure of the built-in diode is composed of second base layer 9, p-type drift layer 4 under there, n-type buffer layer 38 and n-type drain layer 1.

The conventional power MOSFET shown in FIG. 62 has the following problem. That is, in the reverse recovery process of the built-in diode, reverse recovery time becomes long if many stored carriers exist in the n-type base layer 102 having low impurity concentration. Conversely, if the stored carriers are a little, the depletion layer rapidly spreads. For this reason, hard recovery occurs; as a result, waveform oscillation (ringing) and noise becomes large.

In this case, the n-type buffer layer 38 is omitted from the element structure of the embodiment, and thereby, carriers are extracted until n-type and p-type drift layers 2 and 3 are fully depleted. Therefore, it is possible to solve the problem that the reverse recovery time is long.

However, the voltage rapidly steps up when the depletion of n-type and p-type drift layers 2 and 4 ends. For this reason, in the reverse recovery process of the built-in diode, hard recovery occurs with large current decrease rate (−dIr/dt). As a result, the voltage proportional to the current decrease rate jumps up. The jump up of the voltage is a factor of causing voltage oscillation.

On the contrary, in the embodiment, the n-type buffer layer 38 exists in the built-in diode. Therefore, residual carriers are stored in the built-in diode when the depletion of n-type and p-type drift layers 2 and 4 ends.

As a result, according to the embodiment, as shown in FIG. 39, the current decrease rate decreases in the tail region of reverse recovery time; therefore, soft recovery characteristic is realized. Thus, it is possible to reduce the jump up of the voltage, and to prevent the generation of voltage oscillation. In addition, the barrier insulating film 3 exists, and thereby, diffusion of the residual carrier in the built-in diode is prevented. Recombination is facilitated in the interface; therefore, the increase of the reverse recovery time with residual carriers can be prevented.

As described above, according to the embodiment, it is possible to realize a semiconductor device including the following power MOSFET. In the power MOSFET, on-resistance is low in the forward direction, and reverse recovery time is short, and further, the built-in diode having soft recovery characteristic is combined.

The power MOSFET of the embodiment is manufactured in the following manner. For example, in the manufacturing method (FIG. 35A to FIG. 35G) of the 21st embodiment, a substrate having the n-type buffer layer 38 interposed between the base substrate 37 and the n-type drift layer 2 is used in the process of FIG. 35A. In the process of FIG. 35G, the n-type drain layer 1 may be formed on the surface of the n-type buffer layer 38 in place of the p-channel MOSFET structure.

(25th Embodiment)

Figure 40:
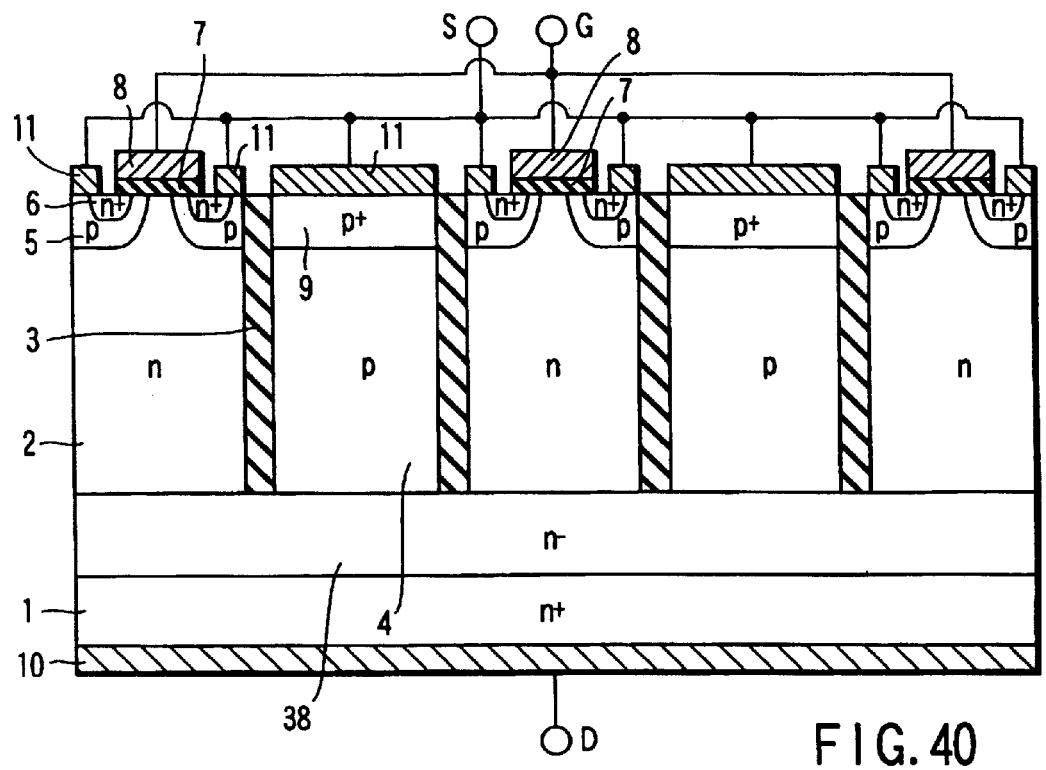
FIG. 40 is a cross-sectional view showing a semiconductor device including a vertical power MOSFET according to a 25th embodiment of the present invention.

FIG. 40 is a cross-sectional view showing a semiconductor device including a vertical power MOSFET according to a 25th embodiment of the present invention.

The 25th embodiment differs from the 24th embodiment in the following points. That is, the n-type buffer layer 38 is provided over the entire surface of the n-type drain layer 1. Further, a drift layer having the pillar structure comprising n-type drift layer 2, barrier insulating film 3 and p-type drift layer 4 is provided to contact with the n-type buffer layer 38.

Such a drift layer is provided, and thereby, it is possible to realize a semiconductor device including the following power MOSFET by the manufacturing method simpler than the 24th embodiment. That is, the power MOSFET has the combined built-in diode having soft reverse recovery characteristic same as the 24th embodiment.

The reason why the manufacturing method is simplified is as follows. In the manufacturing method (FIG. 35A to FIG. 35G) of the 24th embodiment, a substrate having the n-type buffer layer 38 interposed between the base substrate 37 and the n-type drift layer 2 is used in the process of FIG. 35A. By doing so, in the process of FIG. 35G, there is no need of forming the n-type drain layer 1 on the surface of the n-type buffer layer 38.

(26th Embodiment)

Figure 41:
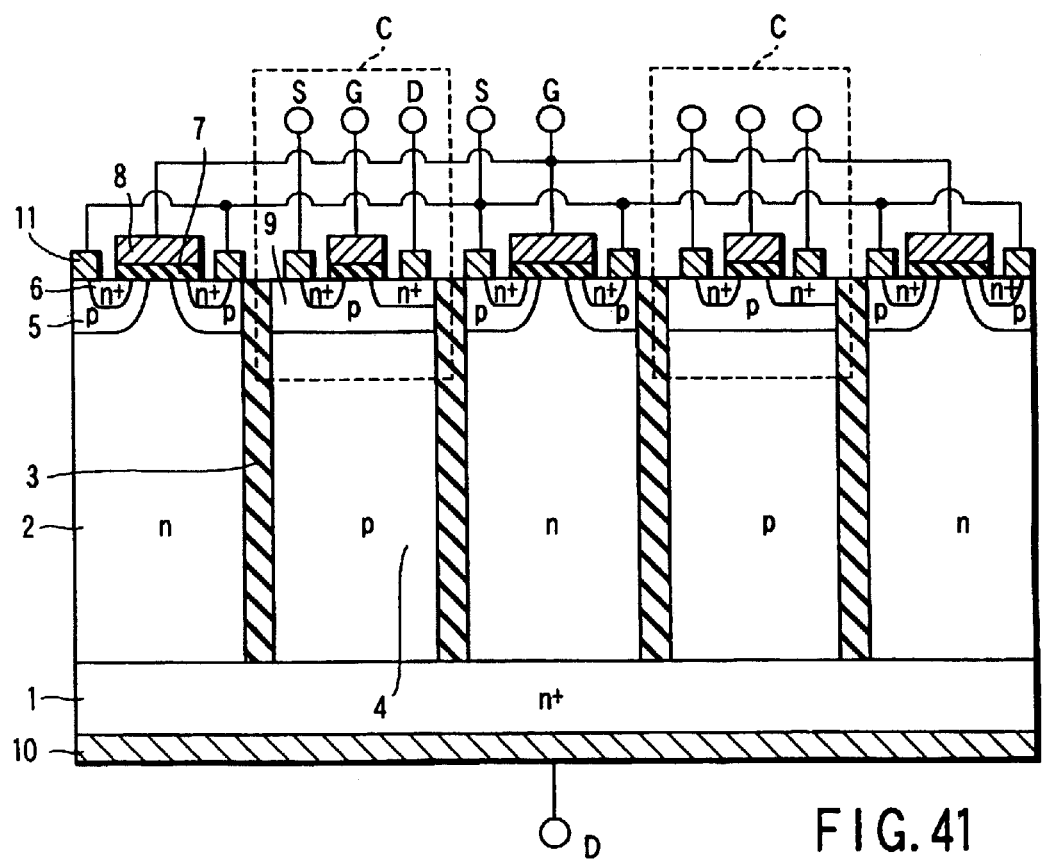
FIG. 41 is a cross-sectional view showing a semiconductor device including a vertical power MOSFET according to a 26th embodiment of the present invention.

FIG. 41 is a cross-sectional view showing a semiconductor device including a vertical power MOSFET according to a 26th embodiment of the present invention.

The 26th embodiment differs from the first embodiment in the following points. That is, the surface of the second p-type base layer 9 of the p-type drift layer 4 is formed with elements, which constitute circuits C such as driver circuit of main MOSFET (n-channel power MOSFET) and protection circuit. In FIG. 41, a MOSFET formed in the same process as the main MOSFET is shown as the element constituting circuits; however, the present invention is not limited to above.

By doing so, circuits C such as driver circuit and protection circuit can be integrally formed while keeping low on-resistance characteristic of the n-channel power MOSFET formed in the n-type drift layer 2. Therefore, high function of element can be achieved.

(27th Embodiment)

Figure 42:
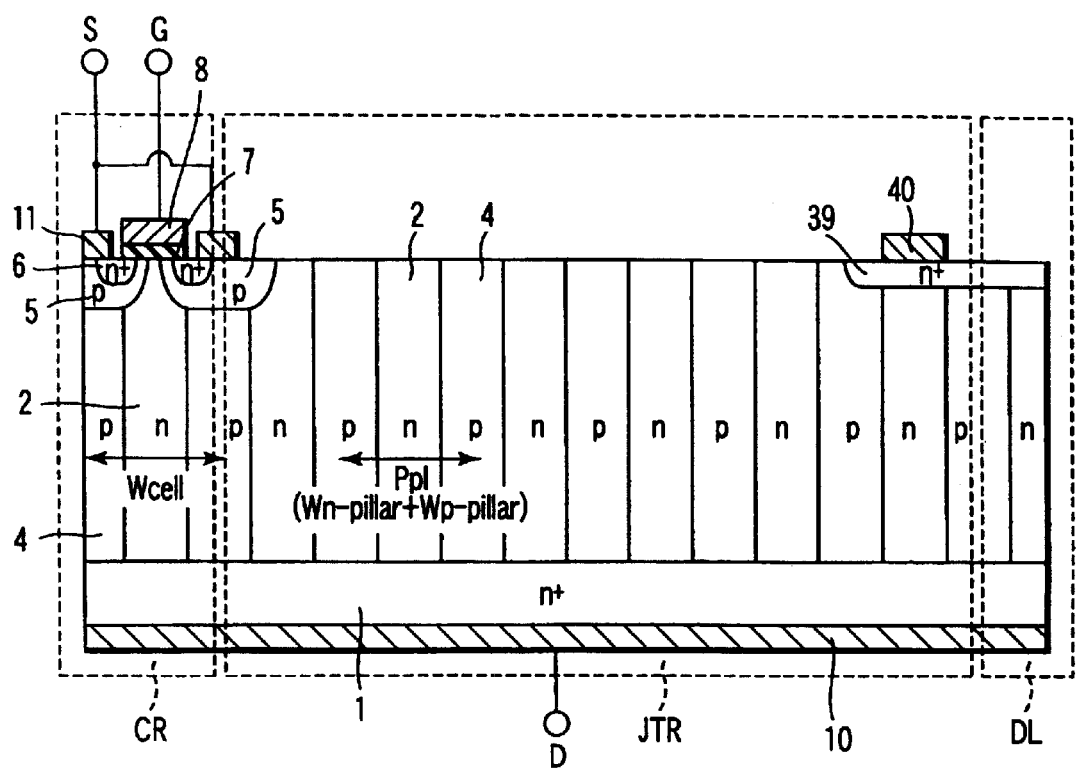
FIG. 42 is a cross-sectional view showing a semiconductor device including a vertical power MOSFET according to a 27th embodiment of the present invention.

FIG. 42 is a cross-sectional view showing a semiconductor device including a vertical power MOSFET according to a 27th embodiment of the present invention. In FIG. 42, a dicing line region DL is shown in addition to a cell region CR and a junction termination region JTR. 3

In the cell region CR, pillar-shaped n-type and p-type drift layers 2 and 4 are alternately repeatedly formed, and thus, the n-channel power MOSFET is formed. In FIG. 42, there are shown a cell size Wcell and a repeated pitch (pillar pitch Pp1) of shaped n-type and p-type drift layers 2 and 4.

Here, the power MOSFET shown in FIG. 64 is formed without forming the barrier insulating film 3 in the cell region CR. In this case, n-type drift layer 2, barrier insulating film 3 and p-type drift layer 4 are alternately repeatedly formed in the cell region CR, and thereby, the power MOSFET described in the first embodiment may be formed.

The n-type and p-type drift layers 2 and 4 are alternately repeatedly formed in the junction termination region JTR and the dicing line region DL.

Figure 65:
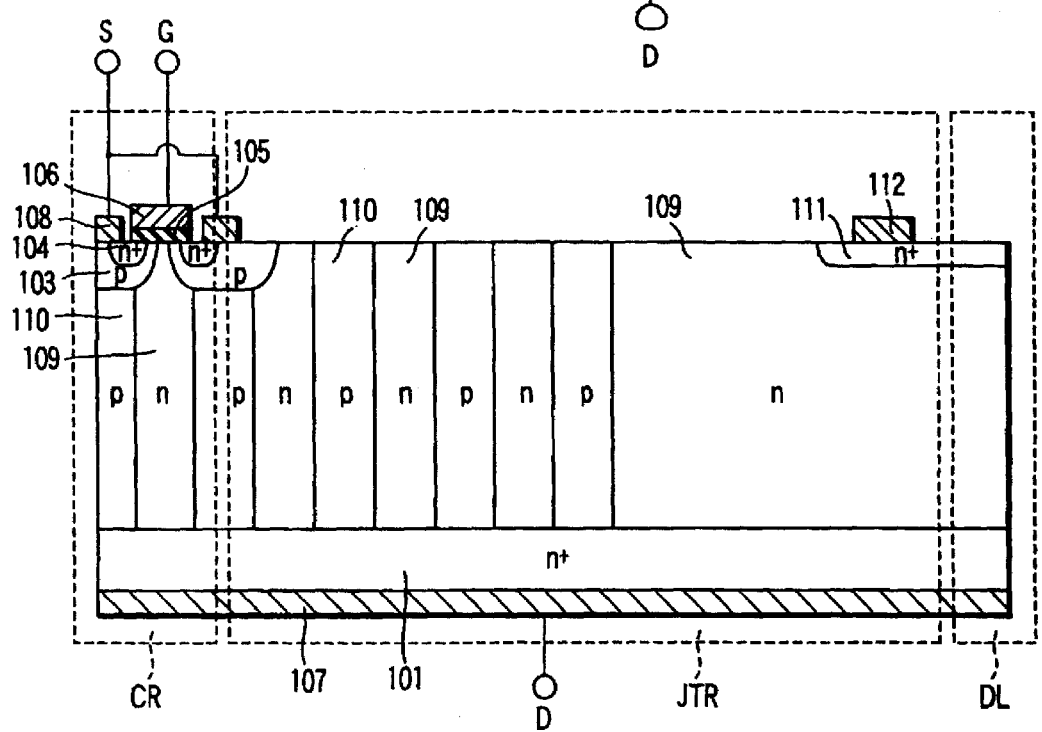
FIG. 65 is a cross-sectional view showing a junction termination region of the conventional power MOSFET shown in FIG. 64.
Figure 66:
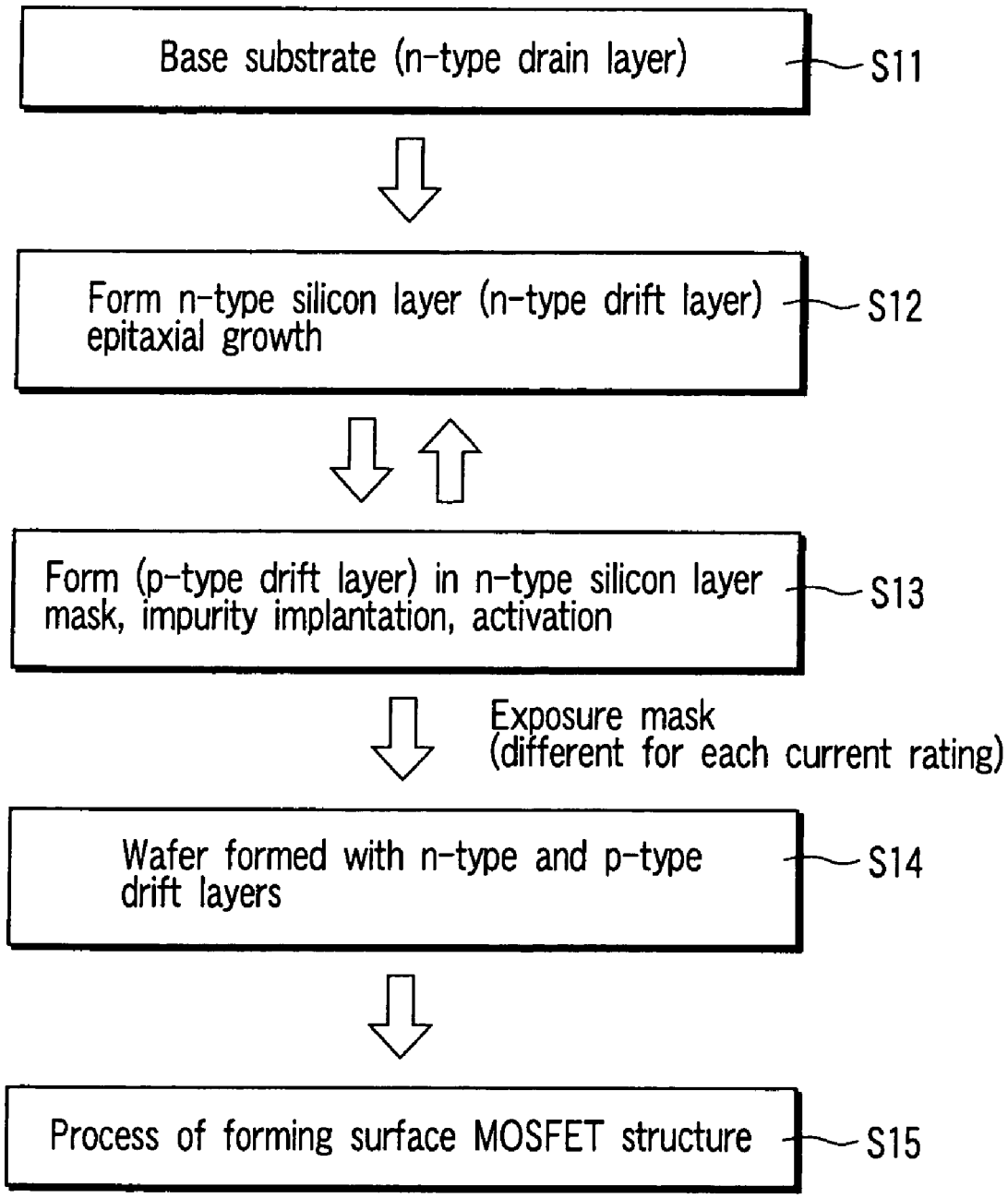
FIG. 66 is a chart showing a flow of the process of manufacturing the conventional power MOSFET shown in FIG. 64.

According to the junction termination region JTR and the dicing line region DL shown in FIG. 65, only n-type drift layer 109 is formed in the region from the position separated from the cell region CR with predetermined distance to the chip end. In the embodiment, n-type and p-type drift layers 2 and 4 are formed therein.

Namely, in the embodiment, n-type and p-type drift layers 2 and 4 are formed in the entire region of the element including the junction termination region JTR and the dicing line region DL in addition to the ell region CR.

The numerical values of the width and impurity concentration of n-type and p-type drift layers 2 and 4 are as described in the first embodiment. In this case, the impurity concentration becomes lower than the first embodiment because no barrier insulating film 3 exists; therefore, counter dope occurs by the diffusion of impurity.

The surface of n-type and p-type drift layers 2 and 4 of the junction termination region JTR is formed with the n-channel stopper layer 39, and the electrode 40 is provided on the stopper layer 40. In this case, the n-channel stopper layer 39 may be provided on only one of n-type and p-type drift layers 2 and 4.

Figure 43:
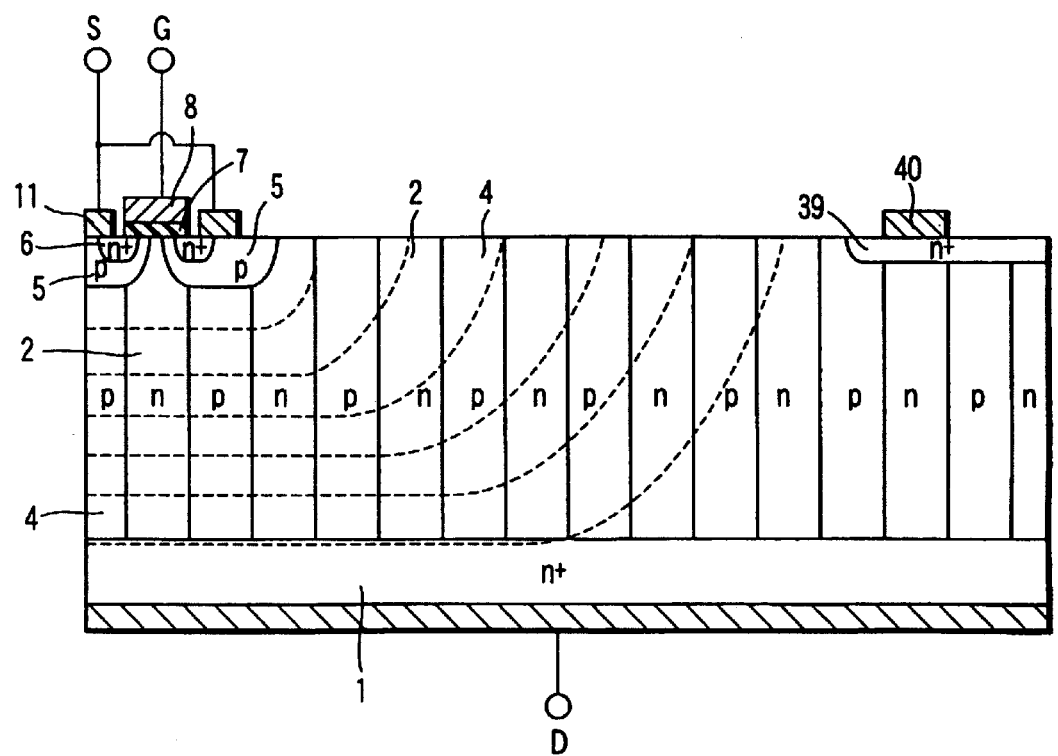
FIG. 43 is a view showing a potential distribution (equipotential line) in an off-state (blocking state) of the power MOSFET of the 27th embodiment.

FIG. 43 is a view showing a potential distribution (equipotential line) in an off-state of the power MOSFET of the 27th embodiment. A broken line shows the equipotential line. According to the element structure of the embodiment, n-type and p-type drift layers 2 and 4 are formed over the entire element region including the cell region CR, the junction termination region JTR and the dicing line region DL. In the element structure of the embodiment, unless the depletion layer spreads over the n-channel stopper layer 39, the same breakdown voltage as the power MOSFET shown in FIG. 65 can be obtained.

Figure 44:
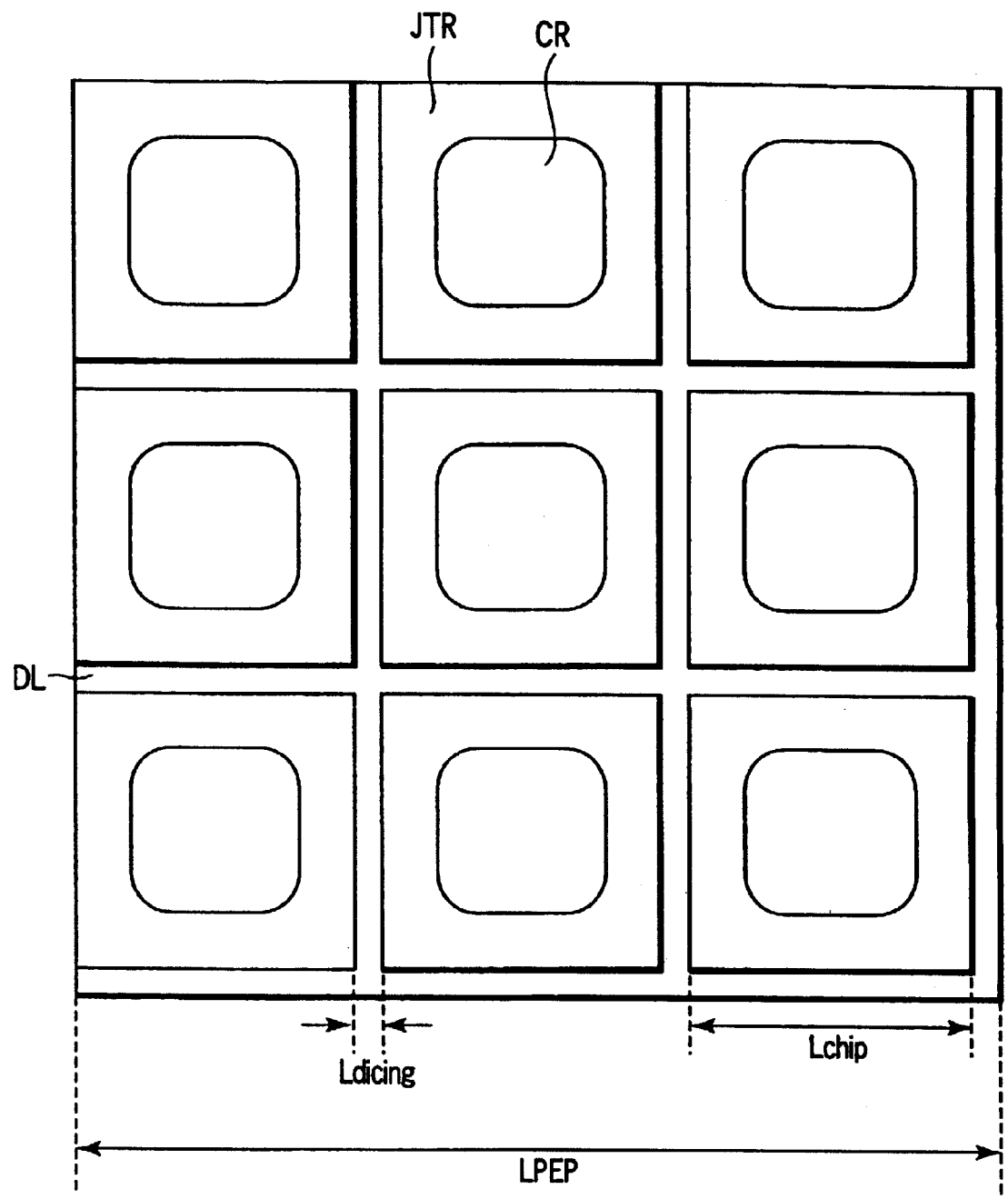
FIG. 44 is a view schematically showing the plane structure (element, termination and dicing regions) in a region transferred to a substrate (wafer) by one-time unit exposure corresponding to exposure mask.

The following is a description on the effect of the embodiment. FIG. 44 is a view schematically showing the plane structure transferred onto a substrate (wafer) by one-time unit exposure corresponding to exposure mask.

In the process of manufacturing semiconductor elements having the microstructure, an exposure system calling a stepper is used. There exists the maximum exposure range (exposure area and pitch) peculiar to this kind of exposure system. In FIG. 44, For example, exposure area and pitch LPEP is 15 mm, and a chip side Lchip is 5 mm. The exposure area region having an area 15×15 mm² (second power of exposure area and pitch LPEP) is divided into nine to obtain nine chips having an area 5×5 mm² (second power of chip size Lchip).

Strictly, there is the need of considering a dicing line width Ldicing; however, no consideration is taken for simplify the explanation herein. That is, the exposure area and pitch LPEP is 15 mm; on the other hand, the dicing line width Ldicing is 60 μm, for example. Thus, the dicing line width Ldicing is smaller than the exposure area and pitch LPEP; therefore, there is no hindrance in practical use even if the dicing line width Ldicing is not considered.

As described before, in the chip of the power semiconductor element, when current rating is different even if the breakdown voltage is the same, the chip size is different in general. Usually, the larger current rating is, the more the number of integrated power semiconductor elements becomes; therefore, the chip size also become large.

For this reason, in the power MOSFET of FIG. 65, the number of p-type drift layers 110 (i.e., area of element region) is different for each chip size. As a result, ion implantation mask of p-type impurity is different for each chip size. Therefore, different exposure mask must be formed correspondingly to different ion implantation mask. Time and cost are taken to form the different exposure mask; for this reason, forming different exposure mask for each different chip size is a factor of increasing the manufacturing cost.

On the contrary, in the embodiment, n-type and p-type drift layers 2 and 4 are formed over the entire region of the substrate (wafer) at equal intervals. Therefore, even if a power MOSFET having different current rating (chip size) is formed, necessary exposure mask is only one kind.

In other words, one common substrate (wafer) is usable to form the power MOSFET having different current rating (chip size). The substrate is used, and thereby, there is no need of preparing the substrate in which the number (area of element region) of n-type and p-type drift layers 2 and 4 is different for each different current rating (chip size). Therefore, the chip of the power MOSFET is realized by a simple manufacturing method at low manufacturing cost.

In particular, the chip size is set to become integer multiples of the sum of the unit widths of n-type and p-type drift layers 2 and 4, that is, the repeated pitches (pillar pitch Pp1) of both drift layers 2 and 4. By doing so, the manufacturing cost can be further reduced. The matter described above will be described below.

If the chip size is set to become integer multiples of the repeated pitches of the drift layers 2 and 4, the structure of drift layers 2 and 4 formed with the MOSFET structure becomes the same in all MOSFET structures. That is, the relatively positional relationship between the MOSFET structure viewed from the top and the front end, that is, drift layers 2 and 4 is the same. In this case, exposure mask CAD data of all MOSFET structures is one common data obtained from CAD data of drift layers 2 and 4.

On the other hand, if the chip size is not integer multiples, the relatively positional relationship between the MOSFET structure and the front end, that is, drift layers 2 and 4 does not become the same in all MOSFET structures. Basically, this is no problem. However, when any problems occur, the cause is easy to be investigated if the relatively positional relationship between the MOSFET structure and the front end, that is, drift layers 2 and 4 is the same in all MOSFET structures.

If the chip size is not integer multiples, exposure mask CAD data must be corrected every different relative positional relationship to obtain the relative positional relationship, which is the same in all MOSFET structures. However, correction on the exposure mask CAD data is a factor of increasing the manufacturing cost.

(28th Embodiment)

Figure 45:
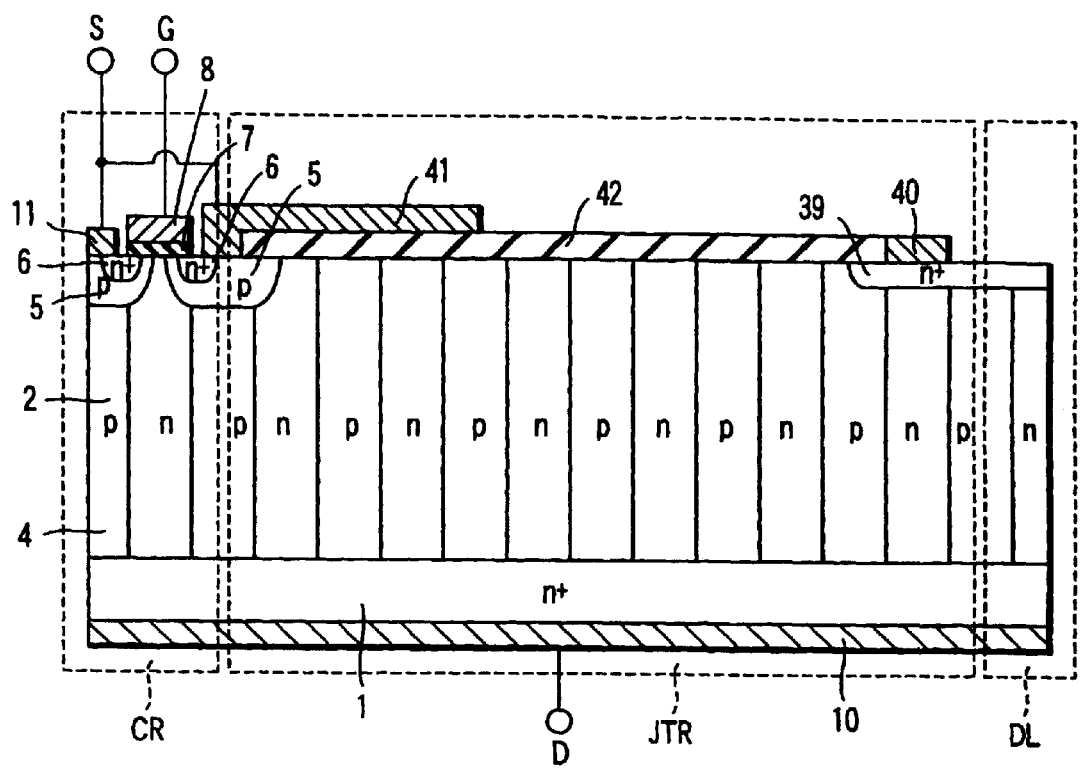
FIG. 45 is a cross-sectional view showing a semiconductor device including a vertical power MOSFET according to a 28th embodiment of the present invention.

FIG. 45 is a cross-sectional view showing a semiconductor device including a vertical power MOSFET according to a 28th embodiment of the present invention.

The 28th embodiment differs from the 27th embodiment in that a field plate electrode 41 is provided.

The field plate electrode 41 contacts with the n-type source layer 6 and the first p-type base layer 5 of the interface region between the cell region CR and the junction termination region JTR. Further, the field plate electrode 41 is provided on n-type and p-type drift layers 2 and 4 of the junction termination region JTR via an insulating film 42. The field plate electrode 41 described above is employed, and thereby, high breakdown voltage can be stably obtained.

(29th Embodiment)

Figure 46:
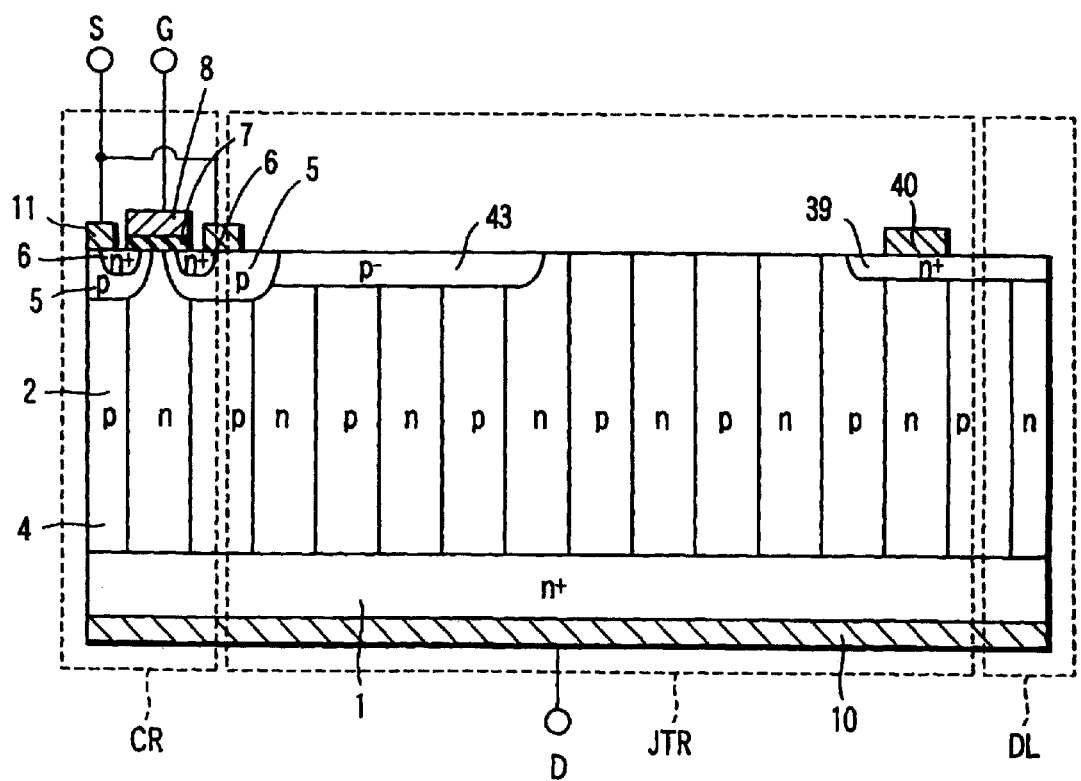
FIG. 46 is a cross-sectional view showing a semiconductor device including a vertical power MOSFET according to a 29th embodiment of the present invention.

FIG. 46 is a cross-sectional view showing a semiconductor device including a vertical power MOSFET according to a 29th embodiment of the present invention.

The 29th embodiment differs from the 27th embodiment in that a RESURF layer (low impurity concentration p-type layer) 43 is provided.

The RESURF layer 43 contacts with the first p-type base layer 5 of the interface region between the cell region CR and the junction termination region JTR. Further, the RESURF layer 43 is shallower than the first p-type base layer 5, and selectively formed on the surfaces of n-type and p-type drift layers 2 and 4 of the junction termination region JTR. The RESURF layer 43 described above is employed, and thereby, high breakdown voltage can be stably obtained.

(30th Embodiment)

Figure 47:
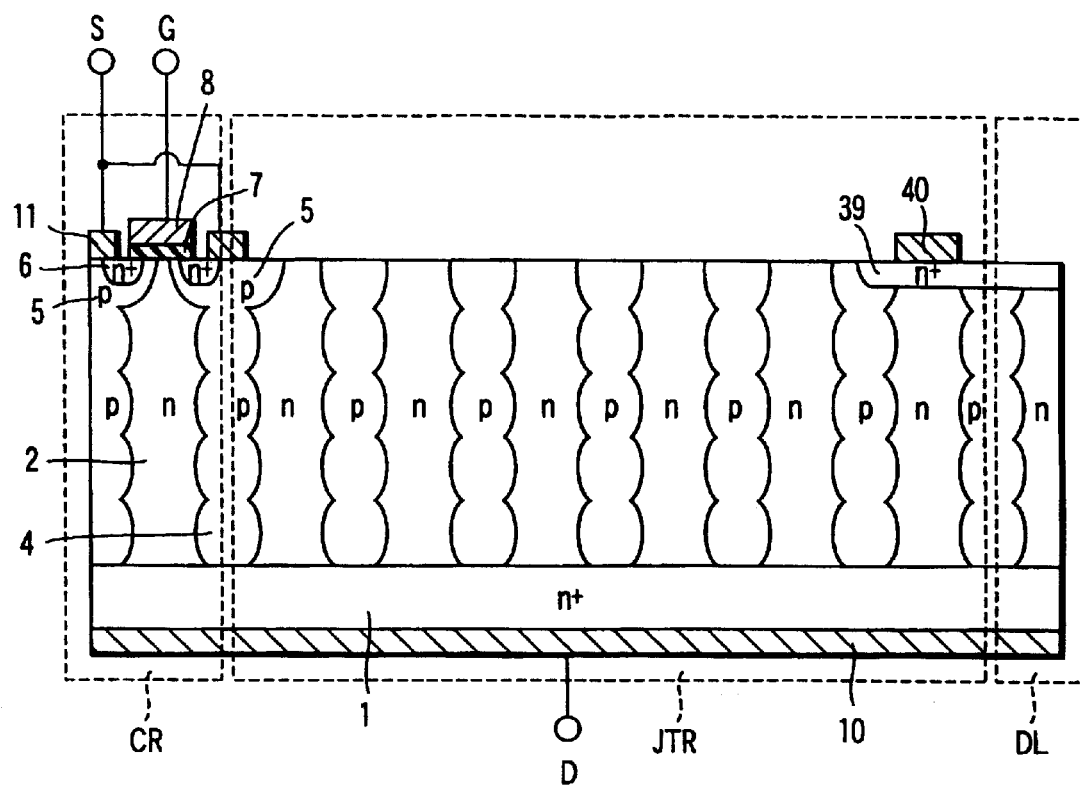
FIG. 47 is a cross-sectional view showing a semiconductor device including a vertical power MOSFET according to a 30th embodiment of the present invention.

FIG. 47 is a cross-sectional view showing a semiconductor device including a vertical power MOSFET according to a 30th embodiment of the present invention.

The 30th embodiment differs from the 27th embodiment in the shape of n-type and p-type drift layers 2 and 4. In particular, the p-type drift layer 4 has a shape of comb. The n-type and p-type drift layers 2 and 4 having the shape described above are formed by the following manufacturing method.

An n-type semiconductor substrate having high impurity concentration is prepared as the n-type drain layer 1. An n-type semiconductor layer epitaxially grows on the n-type semiconductor substrate. Thereafter, p-type impurity such as boron is selectively implanted to the surface of the n-type semiconductor substrate used as the p-type drift layer 4. Then, anneal is carried out to activate the p-type impurity.

The epitaxial growth process of the n-type semiconductor layer and the ion implantation process of p-type impurity are repeated several times (five times are repeated to obtain the shape of FIG. 44). Then, heat treatment is carried out to diffuse the p-type impurity, thereby obtaining n-type and p-type drift layers 2 and 4 having the shape shown in FIG. 47.

By doing so, n-type and p-type thick drift layers 2 and 4 can be formed by the simple process.

(31st Embodiment)

Figure 48:
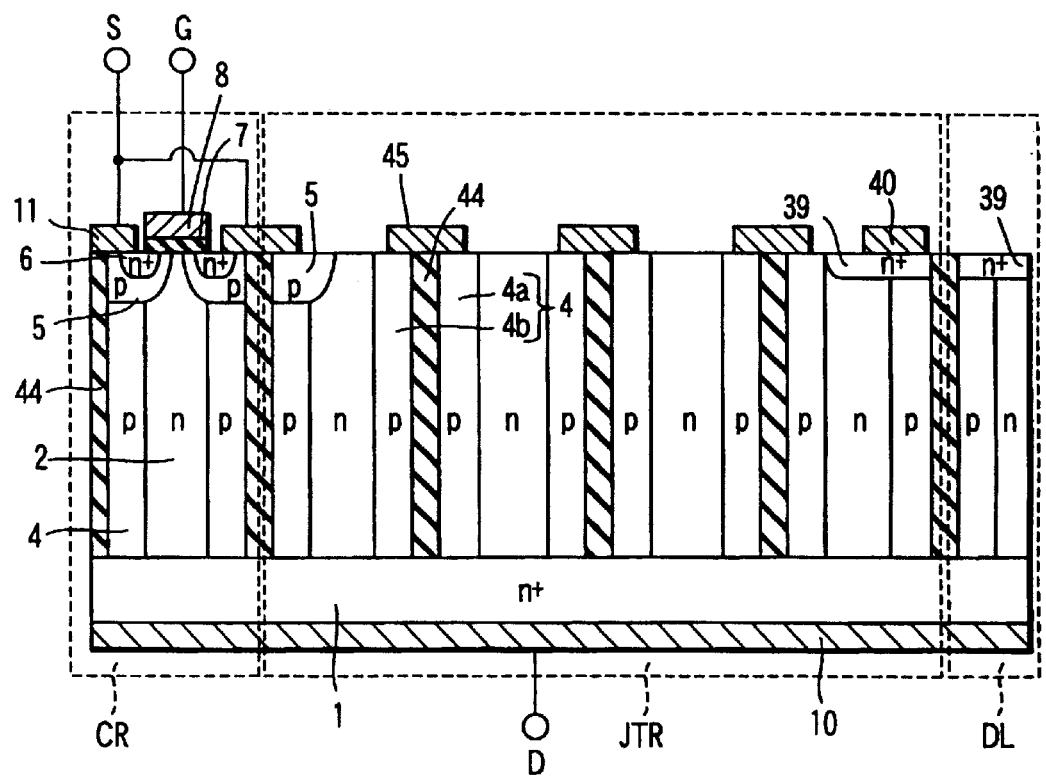
FIG. 48 is a cross-sectional view showing a semiconductor device including a vertical power MOSFET according to a 31st embodiment of the present invention.

FIG. 48 is a cross-sectional view showing a semiconductor device including a vertical power MOSFET according to a 31st embodiment of the present invention.

The 31st embodiment differs from the 27th embodiment in the following points. That is, the p-type drift layer 4 is formed with an insulating film 44 having a surface parallel to the interface between n-type and p-type drift layers 2 and 4. In addition, two p-type drift layers 4a and 4b divided by the insulating film 44 are connected by an electrode 45.

According to the embodiment, two p-type drift layers 4a and 4b divided by the insulating film 44 become equipotential. Therefore, even if the insulating film exists, the depletion layer spreads outside there, so that high breakdown voltage can be secured. As described above, even if the insulating film 44 is formed in the drift layer having the structure in which n-type and p-type drift layers 2 and 4 are alternately arrayed, high breakdown voltage can be secured.

The n-type and p-type drift layers 2 and 4 having the structure described above are formed by the following manufacturing method.

An n-type semiconductor substrate having high impurity concentration is prepared as the n-type drain layer 1. An n-type semiconductor layer epitaxially grows on the n-type semiconductor substrate.

Thereafter, a trench in which the insulating film 44 is buried is formed in the n-type semiconductor layer. P-type impurity such as boron is implanted to the sidewall of the trench, and then, anneal is carried out to activate the p-type impurity, thereafter, heat treatment is carried out to diffuse the p-type impurity. As a result, the n-type semiconductor layer of the region where the p-type impurity is diffused functions as the p-type drift layer 4. On the other hand, the n-type semiconductor layer of the remaining region functions as the n-type drift layer 2.

The sidewall of the trench is thermally oxidized so that the insulating film 44 can be formed. The insulating film 44 formed outside the trench is removed by CMP or etching. The insulating film 44 may be formed by CVD in addition to thermal oxidation. Thereafter, the electrode 45 is formed, and thereby, n-type and p-type drift layers 2 and 4 having the structure shown in FIG. 48 can be obtained.

In this case, the insulating film 44 does not necessarily have the surface parallel to the interface between n-type and p-type drift layers 2 and 4.

(32nd Embodiment)

The 32nd embodiment relates to the plane structure of the power MOSFETs described in the 27th to 31st embodiments.

Figure 49:
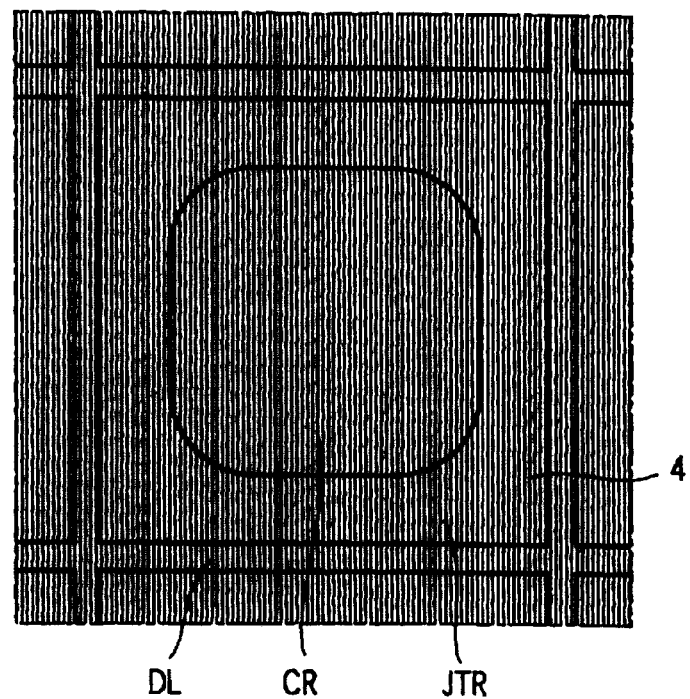
FIG. 49 is a plan view showing the plane structure of the power MOSFET of the 31st embodiment.

FIG. 49 shows the plane structure in which stripe-shaped p-type drift layers 4 are arrayed along one direction over the entire region including the cell region CR, junction termination region JTR and dicing line region DL. In this case, the chip size in the (lateral) direction vertical to the longitudinal direction of the stripe-shaped p-type drift layers 4 is set to integer multiples of the repeated pitch of the p-type drift layer 4.

Figure 50:
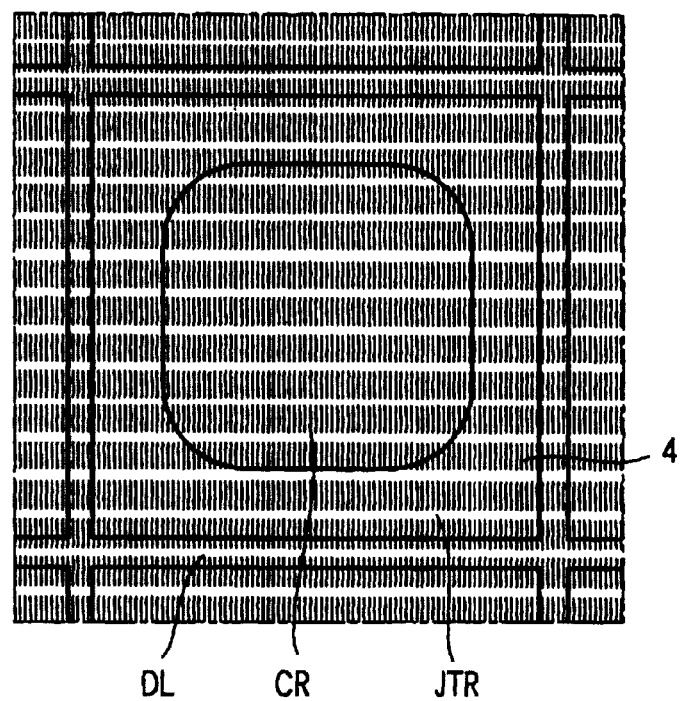
FIG. 50 is a plan view showing another plane structure of the power MOSFET of the 31st embodiment.

FIG. 50 shows the plane structure in which the stripe-shaped p-type drift layers 4 are divided and formed having a predetermined length in the longitudinal direction of the stripe-shaped p-type drift layers 4 in the plane structure of FIG. 49.

In other words, there is shown the plane structure in which the stripe-shaped p-type drift layers 4 are arrayed and formed in two directions mutually orthogonal. In this case, the chip size in the (vertical) direction parallel to the longitudinal direction of the stripe-shaped p-type drift layers 4 is set to integer multiples of the repeated pitch of the p-type drift layer 4 in the same direction.

FIG. 51 shows the plane structure in which rectangular p-type drift layers 4 are arrayed and formed like a mesh. In this case, the vertical and lateral chip sizes are respectively set to integer multiples of vertical and lateral repeated pitches of the p-type drift layer 4.

In FIG. 49 to FIG. 51, preferably, the chip size is set to integer multiples of each repeated pitch of n-type and p-type drift layers 2 and 4.

(33rd Embodiment)

FIG. 52 is a chart showing the process flow of a chip including a semiconductor device including a vertical power MOSFET according to a 33rd embodiment of the present invention.

The power MOSFET of the 33rd embodiment has the structure in which n-type and p-type drift layers 2 and 4 are formed over the entire region including the cell region, junction termination region and dicing line region. More specifically, the power MOSFET of the 33rd embodiment is the same as shown in FIG. 42, FIG. 43, and FIG. 45 to FIG.

47. The power MOSFET of the 33rd embodiment will be described with common reference numerals (1, 2, 4) used in these drawings.

A substrate (wafer) comprising an n-type semiconductor layer having high impurity concentration is prepared as the n-type drain layer 1 (step S1). The semiconductor layer functioning as n-type and p-type drift layers 2 and 4 epitaxially grows on the base substrate (step S2).

A plurality of p-type drift layers 4 is selectively formed in the n-type semiconductor layer, and a drift layer alternately repeating n-type and p-type drift layers 2 and 4 is formed (step S3). The remaining n-type semiconductor layer formed with no p-type drift layer 4 functions as the n-type drift layer 2. Thus, the substrate (wafer) including the drift layer is obtained. Incidentally, the drift layer is not all used as the drift layer through which main current flows, but part thereof is used as junction termination and dicing line.

The width and pitch of n-type and p-type drift layers 2 and 4 are determined by breakdown voltage. Therefore, if the element has the same breakdown voltage, the substrate including the drift layer obtained in step S3 is usable as common substrate regardless of current rating (chip size). The number of chips cut from one substrate is reduced if the current rating is large.

In step S3, various methods may be used as the method of forming the p-type semiconductor layer in the n-type semiconductor layer. Typical two methods are given below.

One of two methods is a method using p-type impurity ion implantation. Processes such as exposure, ion implantation and activation anneal are carried out. Thereafter, activated p-type impurity is selectively introduced to the surface of the n-type semiconductor layer of the region used as the p-type drift layer 4.

The n-type semiconductor layer again epitaxially grows on the n-type semiconductor layer to which the p-type impurity is introduced, and likewise, p-type impurity is introduced. The serial process is repeated, thereby forming the n-type semiconductor layer, which has necessary thickness as n-type and p-type drift layers 2 and 4, and to which the p-type impurity is introduced.

Processes such as exposure, ion implantation and activation anneal are repeated; however, necessary exposure mask is only one regardless of current rating if the breakdown voltage is the same.

Thereafter, the p-type impurity introduced to the n-type semiconductor layer is diffused by heat treatment, and thus, n-type and p-type drift layers 2 and 4 are obtained.

Another of two methods is a method using epitaxial growth of n-type semiconductor layer. The trench reaching the substrate is selectively formed in the n-type semiconductor layer of the region functioning as p-type drift layer.

In the process of forming the trench, exposure mask is required. However, if breakdown voltage is the same, the process of forming the trench is one time regardless of current rating; therefore, required exposure mask is one.

Thereafter, the p-type semiconductor layer used as p-type drift layer epitaxially grows in the trench, and thus, n-type and p-type drift layers 2 and 4 are obtained.

After step S3, the MOSFET structure is formed on the surface of n-type and p-type drift layers 2 and 4 of the cell region. Then, well-known processes of completing the element structure of the cell region and the junction termination structure of the junction termination region are carried out. Thus, a substrate including the power MOSFET having predetermined current rating is obtained (step S4).

Finally, the substrate thus obtained is cut along the dicing line to obtain chips of the power MOSFET (step S5).

As described above, according to the embodiment, when manufacturing the chip of the power MOSFET having different current rating (chip size), there is no need of forming different substrate for each current rating. Therefore, the process is simplified, so that the reduction of the manufacturing cost can be achieved.

(34th Embodiment)

Figure 53:
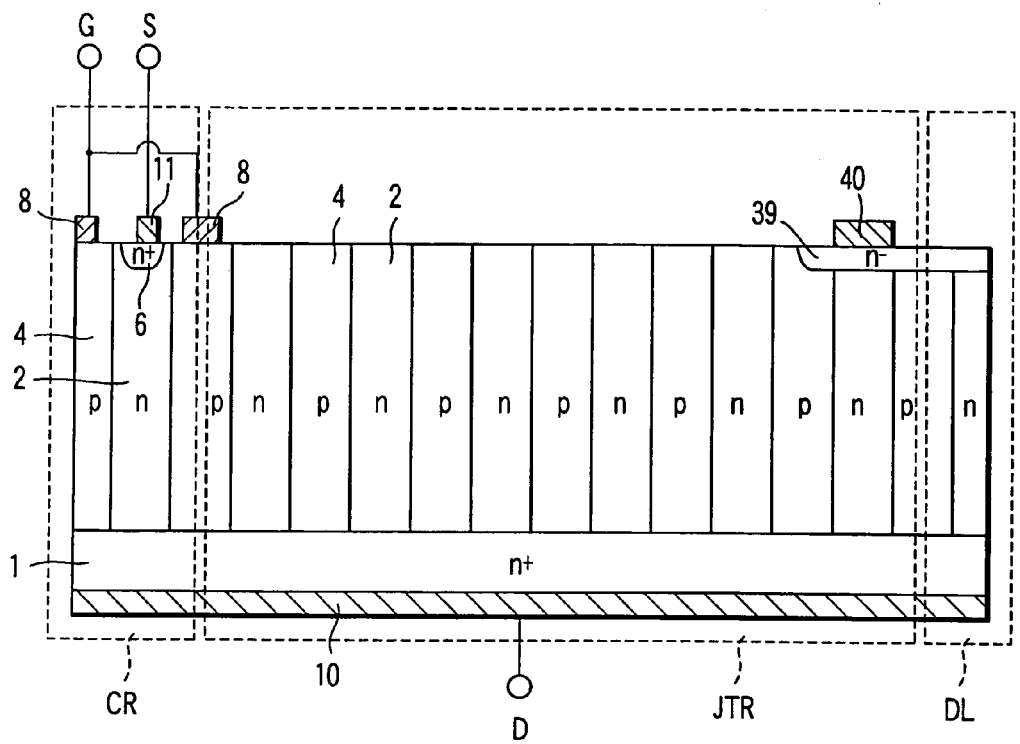
FIG. 53 is a cross-sectional view showing a semiconductor device including a vertical power MOSFET according to a 34th embodiment of the present invention.

FIG. 53 is a cross-sectional view showing a semiconductor device including a vertical power MOSFET according to a 34th embodiment of the present invention.

The 34th embodiment differs from the 27th embodiment in that a static induction transistor (SIT) is formed in the cell region CR. The SIT uses n-type source layer 6, n-type drift layer 2 and n-type drain layer 1 as the current passage. The current passage is controlled by the depletion layer generated from the interface between the pn-junction comprising p-type and n-type drift layers 4 and 2.

In the embodiment, if the breakdown voltage is the same, the reduction of the manufacturing cost can be achieved like the 27th embodiment because the used substrate is the same even if current rating (element size) is different.

Figure 54:
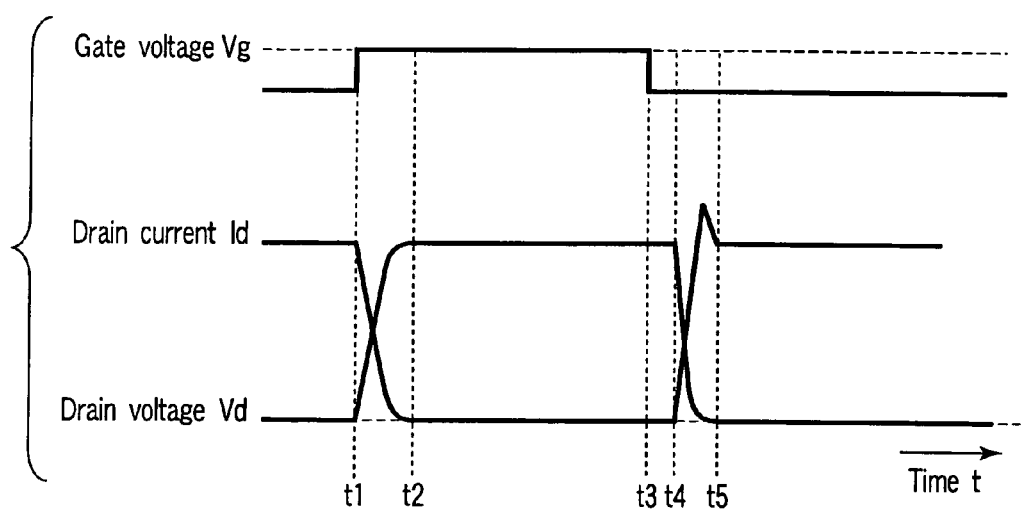
FIG. 54 is a time chart to explain an SIT operation.

The operation of the SIT will be described below with reference to the time chart of FIG. 54. In FIG. 54, lines represent gate voltage Vg of a gate terminal G, drain current Id flowing through a drain terminal D, and voltage Vd of the drain terminal D in order from top.

Figure 55:
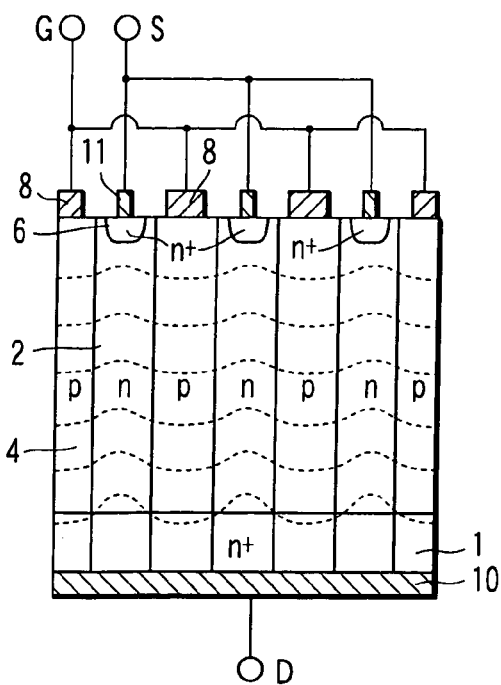
FIG. 55 is a view showing a potential distribution (equipotential line) in an off-state) of the power MOSFET of the 34th embodiment.

In the off-state (time t<t1), negative voltage with respect to a source terminal S is applied to the gate terminal G. By doing so, the current passage is blocked by the depletion region of the pn-junction comprising p-type and n-type drift layers 4 and 2. The equipotential line is distributed as shown in FIG. 55, and the element blocks high voltage. In FIG. 55, the equipotential line is shown by a dotted line.

Figure 56:
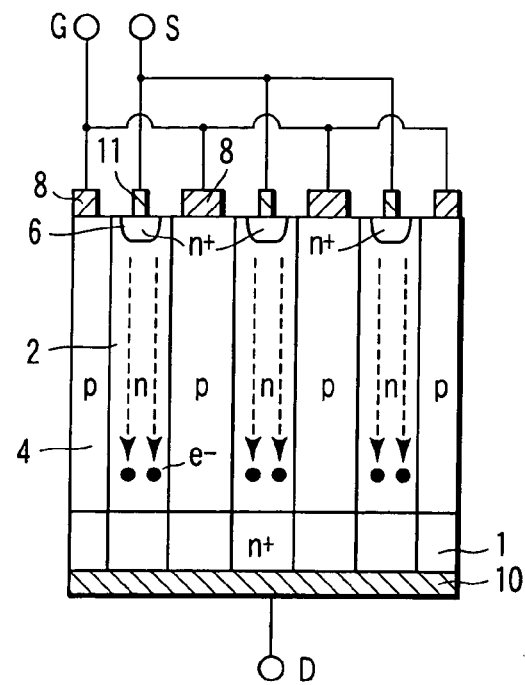
FIG. 56 is a view showing the flow of carriers (electrons) in an on state (conducting state) of the power MOSFET of the 34th embodiment.

In the turn-on time (time t1), zero voltage with respect to the source terminal S or positive voltage of built-in voltage or less of the pn-junction is applied to the gate terminal G. By doing so, the depletion region of the pn-junction spreading in the off-state is extinct. As illustrated in FIG. 56, electrons e⁻ flow from the n-type source layer 6 to the n-type drain layer 1 via the n-type drift layer 2; therefore, the element becomes an on state.

Figure 57:
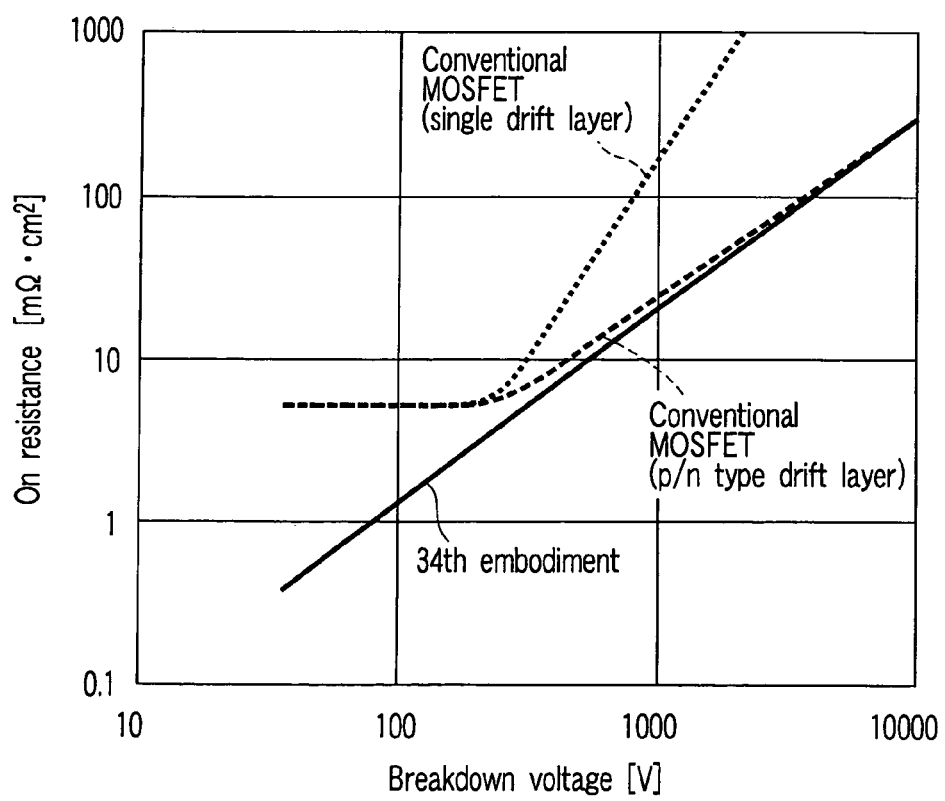
FIG. 57 is a characteristic diagram showing the relationship between breakdown voltage and on-resistance in the power MOSFET of the 34th embodiment and a conventional MOSFET.

FIG. 57 is a characteristic diagram showing the relationship between breakdown voltage and on-resistance in the power MOSFET of the embodiment (34th embodiment) and a conventional MOSFET (p/n type drift layer). In FIG. 57, there is also shown the characteristic between breakdown voltage and on-resistance in the conventional MOSFET (single drift layer) of FIG. 62.

As seen from FIG. 57, in the conventional MOSFET of FIG. 64, on-resistance is reduced more than the conventional MOSFET of FIG. 62 having single n-type base layer 102 as the drift layer. This is because the conventional MOSFET of FIG. 64 has the drift layer using the strip structure in which n-type and p-type drift layers 109 and 110 are alternately formed.

However, in the conventional MOSFET of FIG. 64, when the breakdown voltage of the element is low, the rate of channel resistance component occupying the element on-resistance increases. For this reason, it is difficult to sufficiently reduce on-resistance.

The problem described above remarkably appears in the breakdown voltage of 250V or less if the material composing MOSFET is Si. In particular, the problem remarkably appears in the SiC MOSFET having high maximum electric field and thin drift layer. Further, the problem appears in other elements having channel resistance.

On the contrary, in the power semiconductor element of the embodiment, the depletion region of the pn-junction makes the on-off control of the element. Thus, no MOS-channel exists in the current passage, and low on-resistance characteristic is sufficiently realized over the range of low breakdown voltage.

The present embodiment has described the power semiconductor element using Si as the material. If SiC having the maximum maximum electric field larger than Si is used as the material, the thickness of the drift layer is made thin as compared with the case using Si. Therefore, the effect shown in FIG. 57 further remarkably appears.

(35th Embodiment)

Figure 58:
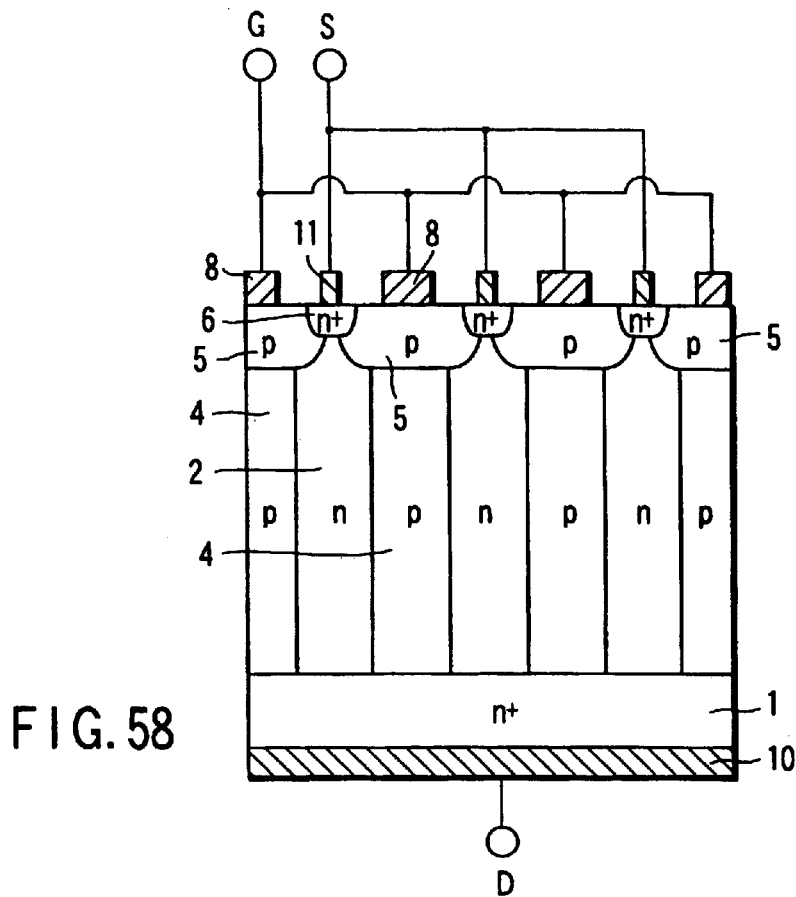
FIG. 58 is a cross-sectional view showing a semiconductor device including a vertical power MOSFET according to a 35th embodiment of the present invention.

FIG. 58 is a cross-sectional view showing a semiconductor device including a vertical power MOSFET according to a 35th embodiment of the present invention.

The 35th embodiment differs from the 34th embodiment in that a first p-type base layer 5 is provided.

The first p-type base layer 5 contacts with n-type drift layer 2, p-type drift layer 4 and n-type source layer 6. Further, the first p-type base layer 5 is formed deeper than the n-type source layer 6, and formed to hold the n-type source layer 6 from the side.

According to the structure described above, in the turn-off time, current passage blocking occurs by the pinch-off. That is, current passage blocking occurs by the pinch-off of adjacent first p-type base layers 5 via the n-type drift layer 2 by the depletion layer generated from the pn-junction between first p-type base layer 5 and n-type drift layer 2. Current passage blocking occurs by the pinch-off of adjacent first p-type base layers 5 via the n-type drift layer 2 by the depletion layer generated from the pn-junction between n-type and p-type drift layers 2 and 4. The former current passage blocking occurs earlier than the latter one. Thus, the depletion region is quickly and securely formed under the n-type source layer 6, so that turn-off speed can be made higher and high breakdown voltage can be stably obtained.

(36th Embodiment)

Figure 59:
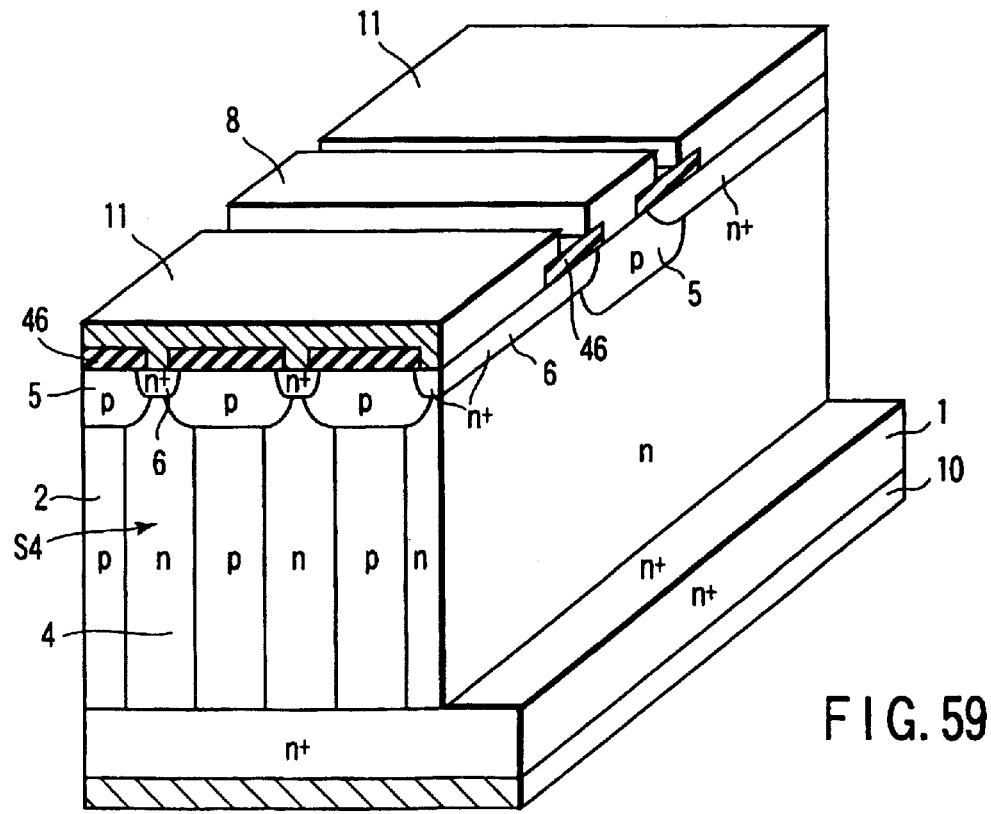
FIG. 59 is a cross-sectional view showing a semiconductor device including a vertical power MOSFET according to a 36th embodiment of the present invention.

FIG. 59 is a cross-sectional view showing a semiconductor device including a vertical power MOSFET according to a 36th embodiment of the present invention.

The 36th embodiment differs from the 35th embodiment (FIG. 58) in that gate and source electrodes 8 and 11 are arrayed in the direction vertical to the array direction of n-type and p-type drift layers 2 and 4. In FIG. 59, a reference numeral denotes an insulating film.

As a result, each repeated pitch of n-type and p-type drift layers 2, 4 and the gate electrode 8 can be independently set. By doing so, in a section S4 parallel to the array direction, n-type and p-type drift layers 2 and 4 are micronized, so that the impurity concentration of the n-type drift layer 2 can be made high. Therefore, the reduction of on-resistance can be achieved.

(37th Embodiment)

Figure 60:
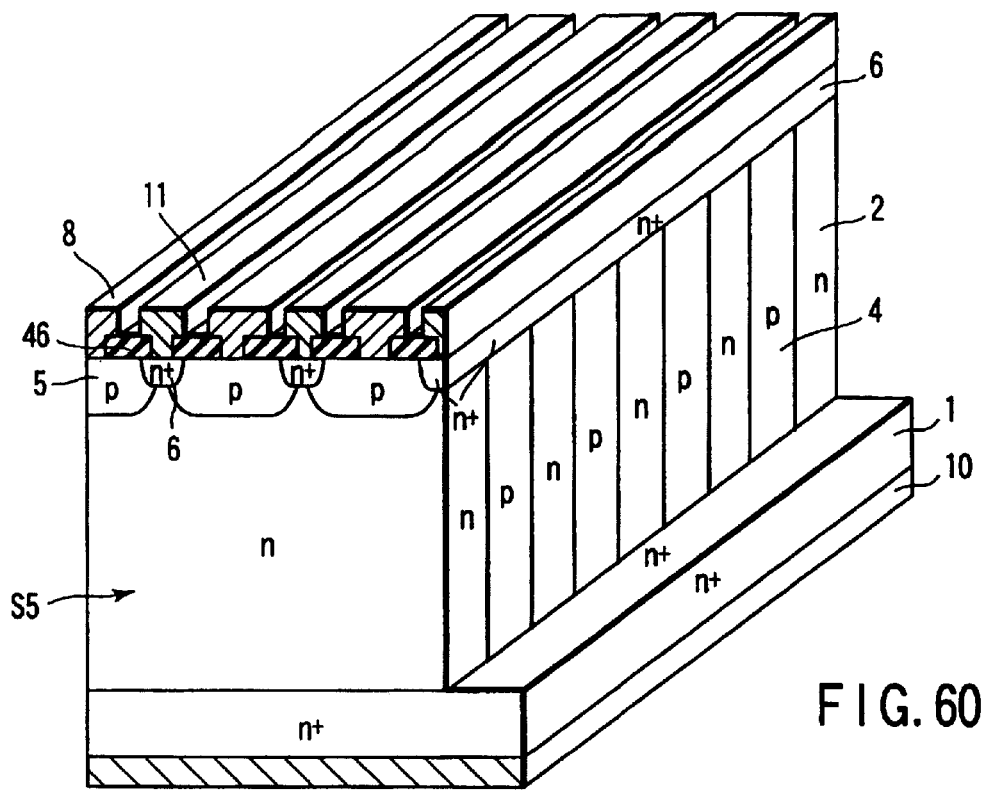
FIG. 60 is a cross-sectional view showing a semiconductor device including a vertical power MOSFET according to a 37th embodiment of the present invention.

FIG. 60 is a cross-sectional view showing a semiconductor device including a vertical power MOSFET according to a 37th embodiment of the present invention.

The 37th embodiment differs from the 35th embodiment (FIG. 58) in the following point. That is, the n-type source layer 6 and the first p-type base layer 5 are selectively formed in a section S5 vertical to the array direction of n-type and p-type drift layers 2 and 4.

As a result, each repeated pitch of n-type source and p-type base layers 6, 5 and each repeated pitch of n-type and p-type drift layers 2, 4 can be independently set.

The repeated pitch of n-type and p-type drift layers 2 and 4 can be set independently from that of n-type source and p-type base layers 6 and 5.

By doing so, in the section S5 vertical to the array direction, the repeated pitch of n-type and p-type drift layers 2 and 4 can be made smaller than that of n-type source and p-type base layers 6 and 5. Therefore, the width of the n-type drift layer is made narrower.

As a result, the n-type drift layer 2 is micronized, so that the impurity concentration of the n-type drift layer 2 can be made high. Therefore, the reduction of on-resistance can be achieved.

(38th Embodiment)

Figure 61:
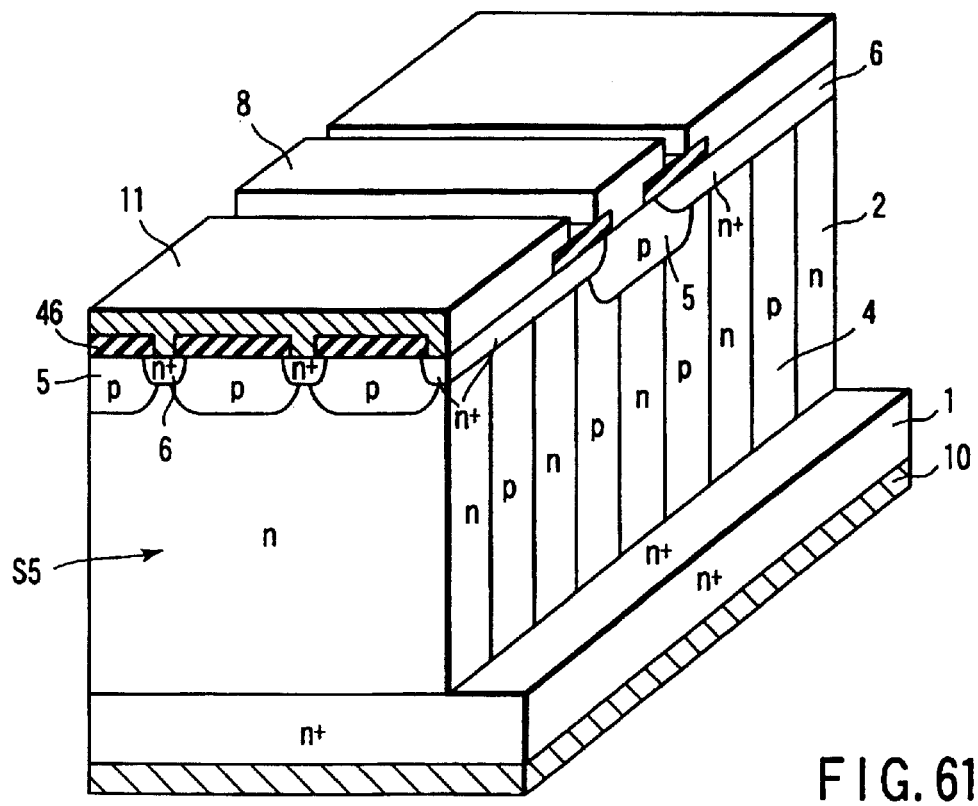
FIG. 61 is a cross-sectional view showing a semiconductor device including a vertical power MOSFET according to a 38th embodiment of the present invention.

FIG. 61 is a cross-sectional view showing a semiconductor device including a vertical power MOSFET according to a 38th embodiment of the present invention.

The 38th embodiment differs from the 37th embodiment in that gate and source electrodes 8 and 11 are arrayed in the direction vertical to the array direction of n-type and p-type drift layers 2 and 4. In other words, the 38th embodiment has the combination of the 37th and 36th embodiments.

According to the embodiment, each repeated pitch of n-type and p-type drift layers 2, 4 and the gate electrode 8 can be independently set, like the 36th embodiment. By doing so, the n-type drift layer 2 is micronized, so that the reduction of on-resistance can be achieved.

In the embodiments, n-type is used as the first conductivity type while p-type is used as the second conductivity type. Conversely, p-type may be used as the first conductivity type while n-type is used as the second conductivity type.

In the embodiments, power MOSFET and SIT are given as the power semiconductor element. The power semiconductor element is not specially limited so long as it uses n-type and p-type drift layers 2 and 4.

In the embodiments, the example of the semiconductor device is not given. The semiconductor device is not specially limited so long as it includes the power MOSFET. The semiconductor device is applicable to wide ranges, for example, electronic apparatuses (e.g., television), transport related apparatuses (e.g., automobile), equipments in factory (e.g., computer-controlled machine tool (CNC), etc.

In the embodiments, n-type is used as the first conductivity type while p-type is used as the second conductivity type. Conversely, p-type may be used as the first conductivity type while n-type is used as the second conductivity type.

Embodiments combining the embodiments described above may be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including a power semiconductor element, the power semiconductor element comprising:
a drain layer of a first conductivity type;
drift layers of first and second conductivity types provided on the drain layer of the first conductivity type;
an insulating film provided between the drift layers of the first and second conductivity types and contacting the drift layers;

a first base layer of the second conductivity type provided on a surface of the drift layer of the first conductivity type;

a source layer of the first conductivity type selectively provided on a surface of the first base layer of the second conductivity type;

a gate insulating film provided on the first base layer of the second conductivity type between the source layer of the first conductivity type and the drift layer of the first conductivity type;

a gate electrode provided on the gate insulating film;

a second base layer of the second conductivity type provided on a surface of the drift layer of the second conductivity type;

a first main electrode provided on the drain layer of the first conductivity type; and a second main electrode provided on the source layer of the first conductivity type, the first base layer of the second conductivity type and the second base layer of the second conductivity type.

2. The semiconductor device according to claim 1, satisfying the following equation, $$N\text{drift} > 2 \times \epsilon \times (E\text{max} \times L\text{drift} - V\text{b})/(q \times L\text{drift}^2)$$

where,

Ndrift: concentration of impurity of the first conductivity type of the drift layer of the first conductivity type [cm$^{-3}$]

ε: permittivity of semiconductor material of the power semiconductor element [F/cm]

Emax: breakdown electric field (maximum electric field) of the semiconductor material [V/cm]

Ldrift: thickness of the drift layer of the first conductivity type [cm]

Vb: breakdown voltage of the power semiconductor element [V]

q: elementary charge (1.60219×10$^{19}$ [C]).

3. The semiconductor device according to claim 1, wherein the insulating film contacts the drain layer of the first conductivity type, and contacts the entire side surface of the drift layers of the first and second conductivity types on each of their sides.

4. The semiconductor device according to claim 1, wherein the insulating film contacts a part of side surface of the drift layers of the first and second conductivity types on each of their sides.

5. The semiconductor device according to claim 1, wherein a width of the drift layer of the second conductivity type is narrower than that of the drift layer of the first conductivity type.

6. The semiconductor device according to claim 1, wherein an interface state density between the drift layer of the first conductivity type and the insulating film and between the drift layer of the second conductivity type and the insulating film is 1×10$^{11}$ cm$^{-2}$ or more respectively.

7. The semiconductor device according to claim 1, wherein a surface recombination rate in a surface contacting the insulating film of the drift layer of the first conductivity type and a surface contacting the insulating film of the drift layer of the second conductivity type are 1×10$^3$ cm·s$^{-1}$ or more respectively.

8. The semiconductor device according to claim 1, wherein the drift layer of the first conductivity type, the first base layer of the second conductivity type, the source layer of the first conductivity type, the gate insulating film and the gate electrode define a MOSFET structure which includes a channel region, and a depletion layer generated from an interface between the insulating film and the drift layer of the first conductivity type does not spread in the channel region when the power semiconductor element is in an on-state.

9. The semiconductor device according to claim 1, wherein an impurity concentration distribution of the drift layer of the first conductivity type includes a distribution that impurity of the first conductivity type concentration decreases from an interface between the drift layer of the first conductivity type and the first and second base layers of the second conductivity type toward an inside of the drift layer of the first conductivity type.

10. The semiconductor device according to claim 1, wherein the drift layer of the first conductivity type, the first base layer of the second conductivity type, the source layer of the first conductivity type, the gate insulating film and gate electrode define a MOSFET structure, and the MOSFET structure's channel direction is set to a direction different from an array direction of the drift layer of the first conductivity type, the insulating film and the drift layer of the second conductivity type.

11. The semiconductor device according to claim 1, wherein the insulating film does not contact the drain layer of the first conductivity type, and the drift layers of the first and second conductivity type contact each other without contacting the insulating film on a side of the drain layer of the first conductivity type.

12. The semiconductor device according to claim 1, further comprising: a junction termination region which does not include an insulating film in its inside.

13. The semiconductor device according to claim 1, wherein the second main electrode contacts upper and side surfaces of the source layer of the first conductivity type.

14. The semiconductor device according to claim 12, wherein the junction termination region includes a semiconductor layer of the first conductivity type having an impurity concentration lower than that of the drift layer of the first conductivity type.

15. The semiconductor device according to claim 1, wherein the drift layer of the second conductivity type includes a built-in semiconductor element.

16. The semiconductor device according to claim 15, wherein the semiconductor element is an element including a MOSFET structure whose conductivity type is opposite of the power semiconductor element or a reverse conducting diode.

17. A method of manufacturing a semiconductor device comprising:

preparing a substrate including a drain layer of a first conductivity type and a base layer provided on the drain layer of the first conductivity type;

making a plurality of trenches in the base layer to form a plurality of semiconductor layers apart from each other via the plurality of trenches, the plurality of semiconductor layers comprising the base layer;

forming an insulating film in the plurality of trenches;

implanting impurity of the first conductivity type in a surface of alternate semiconductor layers by ion implantation and implanting impurity of a second conductivity type in a surface of the other semiconductor layers by ion implantation;

diffusing the impurities of the first and second conductivity types in the semiconductor layers by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on the surface of the drift layer of the first conductivity type, a source layer of the first conductivity type on a surface of the first base layer of the second conductivity type, a gate insulating film on the first base layer of the second conductivity type between the source layer of the first conductivity type and the drift layer of the first conductivity type, a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types respectively.

18. A method of manufacturing a semiconductor device comprising:

preparing a substrate including a drain layer of a first conductivity type and a base layer provided on the drain layer of the first conductivity type;

implanting impurity of the first conductivity type in a plurality of first regions spaced apart from each other on a surface of the base layer by ion implantation, and implanting impurity of a second conductivity type in a plurality of second regions sandwiched between the plurality of first regions on the surface of the base layer;

making a plurality of trenches in a plurality of third regions including regions between the plurality of first and second regions to form a plurality of semiconductor layers spaced apart from each other via the plurality of trenches, the plurality of semiconductor layers comprising the base layer in which the impurities of the first and second conductivity types are implanted;

forming an insulating film in the plurality of trenches;

diffusing the impurities of the first and second conductivity types in the semiconductor layer by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on a surface of the drift layer of the first conductivity type, a source layer of the first conductivity type on a surface of the first base layer of the second conductivity type, a gate insulating film on the first base layer of the second conductivity type between the source layer of the first conductivity type and the drift layer of the first conductivity type, a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types.

19. A method of manufacturing a semiconductor device comprising:

preparing a substrate including a drain layer of a first conductivity type and a first base layer provided on the drain layer of the first conductivity type;

implanting impurity of the first conductivity type in a plurality of first regions spaced apart from each other on a surface of the first base layer by ion implantation, and implanting impurity of a second conductivity type in a plurality of second regions sandwiched between the plurality of first regions on the surface of the first base layer;

forming a second base layer on the first base layer;

implanting impurity of the first conductivity type in a first region of a surface of the second base layer on the plurality of first regions by ion implantation, and implanting impurity of the second conductivity type in a second region of the surface of the second base layer on the plurality of second regions;

making a plurality of trenches in a plurality of regions including regions between the plurality of first and second regions of the first base layer and between the plurality of first and second regions of the second base layer to form a plurality of semiconductor layers spaced apart from each other via the plurality of trenches, the plurality of semiconductor layers comprising the base layer in which the impurities of the first and second conductivity type are implanted by ion implantation;

forming an insulating film in the plurality of trenches;

diffusing the impurities of the first and second conductivity types in the semiconductor layer by heat treatment to form a drift layer of the first conductivity type comprising the semiconductor layer in which the impurity of the first conductivity type is diffused and to form a drift layer of the second conductivity type comprising the semiconductor layer in which the impurity of the second conductivity type is diffused; and forming a first base layer of the second conductivity type on a surface of the drift layer of the first conductivity type, a source layer of the first conductivity type on a surface of the base layer of the first conductivity type, a gate insulating film on the first base layer of the second conductivity type between the source layer of the first conductivity type and the drift layer of the first conductivity type, a gate electrode on the gate insulating film, a second base layer of the second conductivity type on a surface of the drift layer of the second conductivity type, a first main electrode on the drain layer, and a second main electrode on the source layer of the first conductivity type and the first and second base layers of the second conductivity types.

20. A method of manufacturing a semiconductor device comprising:

forming a drift layer on a drain layer of a first conductivity type, the drift layer comprising drift layers of first and second conductivity types, the drift layers being alternately repeatedly arrayed;

forming a plurality of cell regions spaced apart from each other and including a power semiconductor element in the drift layer and a plurality of junction termination regions surrounding the plurality of cell regions and including a junction termination structure to form a plurality of cell and junction termination regions comprising a couple of the cell region and the junction termination region surrounding the cell region in the drift layer, the plurality of cell and junction termination regions being partitioned by a dicing line region; and isolating the plurality of cells and the plurality of junction termination regions from each other.

21. A semiconductor device comprising:

a drain layer of a first conductivity type;

a drift layer comprising a plurality of pillar drift layers of the first conductivity type provided on the drain layer of the first conductivity type, and a plurality of pillar drift layers of a second conductivity type provided on the drain layer of the first conductivity type;

a cell region provided in the drift layer, and including a power semiconductor element; and a junction termination region provided in the drift layer to surround the cell region, and including a junction termination structure, wherein the plurality of pillar drift layers of the first and second conductivity types are alternately regularly repeatedly arrayed in two directions over entire regions of the cell region and the junction termination region such that a repeated structure of the pillar drift layer of the first and second conductivity type is continuously and uniformly formed over the entire regions including edge regions of the cell region and the junction termination region, and the plurality of pillar drift layers of the second type do not extend continuously from one edge to the other edge of the entire regions of the cell region and the junction termination.

22. The semiconductor device according to claim 21, wherein the pillar drift layers of the first and second conductivity types are formed uniformly in parallel stripe patterns in a plane view, and the plurality of pillar drift layers of the second conductivity type formed in the parallel stripe pattern do not extend continuously from one edge to the other edge of the entire regions of the cell region and the junction termination.

23. The semiconductor device according to claim 21, wherein the pillar drift layers of the first and second conductivity types are formed uniformly in mesh patterns in a plane view over the entire regions of the cell region and the junction termination region.

* * * * *